United States Patent
Hasewaga

(10) Patent No.: US 6,656,604 B2
(45) Date of Patent: Dec. 2, 2003

(54) MAGNETORESISTIVE THIN-FILM MAGNETIC ELEMENT AND METHOD FOR MAKING THE SAME

(75) Inventor: Naoya Hasewaga, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 164 days.

(21) Appl. No.: 09/826,164

(22) Filed: Apr. 4, 2001

(65) Prior Publication Data

US 2001/0038927 A1 Nov. 8, 2001

(30) Foreign Application Priority Data

Apr. 6, 2000 (JP) .................................. 2000-104821

(51) Int. Cl.$^7$ ................................. G11B 5/66
(52) U.S. Cl. ................. 428/611; 428/622; 428/627; 428/629; 428/632; 428/639; 428/641; 428/668; 428/667; 428/670; 428/678; 428/692; 428/694 R; 428/900; 428/928; 360/113; 324/252; 338/32 R
(58) Field of Search .................. 428/611, 622, 428/627, 629, 632, 639, 641, 660, 667, 670, 678, 692, 928, 900, 694 R, 668, 671, 615, 652; 360/113; 324/252; 338/32 R

(56) References Cited

U.S. PATENT DOCUMENTS

| | | | |
|---|---|---|---|
| 5,608,593 A | | 3/1997 | Kim et al. |
| 5,688,605 A | * | 11/1997 | Iwasaki ...................... 428/611 |
| 5,698,335 A | * | 12/1997 | Iwasaki ...................... 428/611 |
| 5,725,963 A | * | 3/1998 | Iwasaki ...................... 428/611 |
| 5,738,946 A | * | 4/1998 | Iwasaki ...................... 428/611 |
| 5,780,176 A | * | 7/1998 | Iwasaki ...................... 428/692 |
| 5,959,810 A | | 9/1999 | Kakihara et al. |

* cited by examiner

Primary Examiner—Leszek Kiliman
(74) Attorney, Agent, or Firm—Brinks Hofer Gilson & Lione

(57) ABSTRACT

A magnetoresistive thin-film magnetic element including a composite comprising an antiferromagnetic layer, a pinned magnetic layer, a nonmagnetic conductive layer, a free magnetic layer; hard bias layers for orienting the magnetic vectors of the free magnetic layer in a direction substantially orthogonal to the magnetization vector of the pinned magnetic layer; and a conductive layer for supplying a sense current is provided. The hard bias layers are provided at the two sides of the free magnetic layer. The hard bias layers and the free magnetic layers are in contact with each other at least partly. Bias underlayers are provided at the bottom of the hard bias layers.

18 Claims, 24 Drawing Sheets

FIG. 13
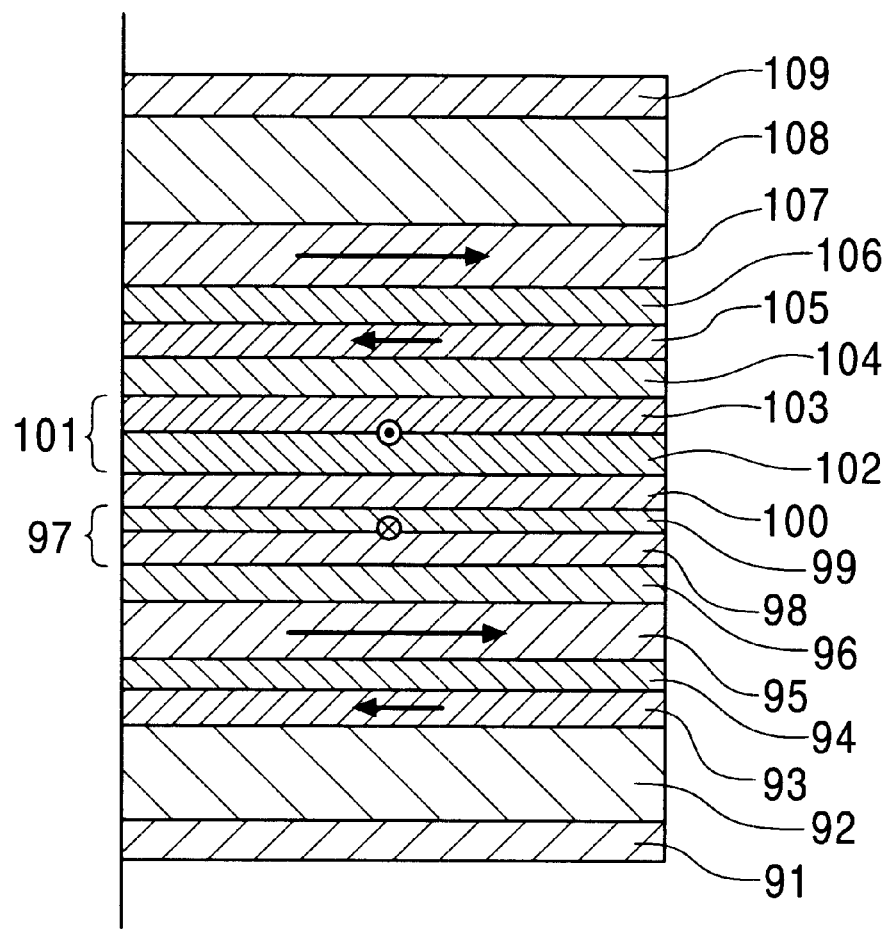
AIR BEARING SURFACE
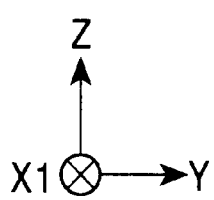

FIG. 14
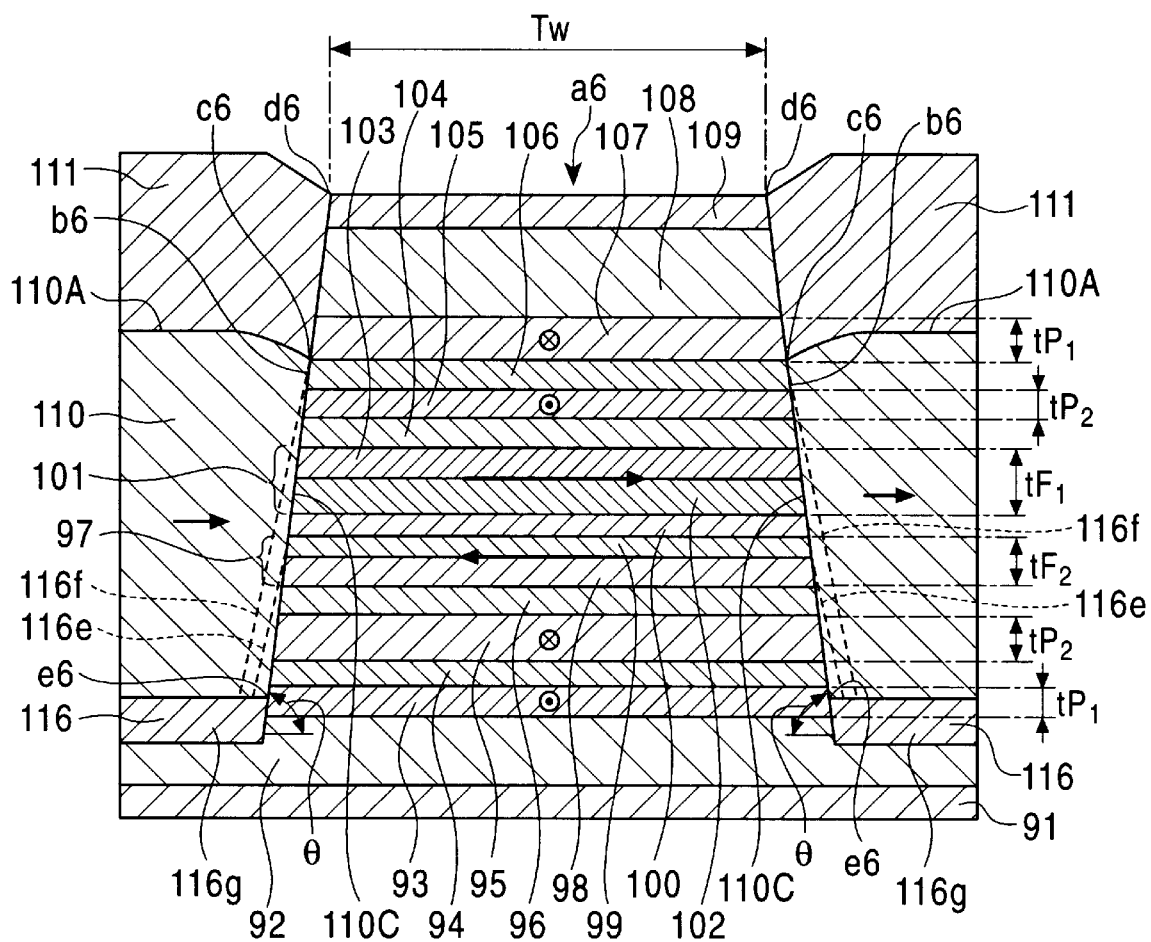
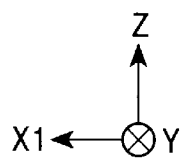

MAGNETORESISTIVE THIN-FILM MAGNETIC ELEMENT AND METHOD FOR MAKING THE SAME

BACKGROUND OF THE INVENTION

1. Field of the Invention

The present invention relates to a magnetoresistive thin-film magnetic element that undergoes a change in electrical resistance in relation to the magnetization vector of a pinned magnetic layer and the magnetization vector of a free magnetic layer affected by an external magnetic field, and to a method for making the same. The present invention also relates to a thin-film magnetic head equipped with the magnetoresistive thin-film magnetic element.

2. Description of the Related Art

FIG. 24 is a perspective view of an exemplary conventional thin-film magnetic head.

This thin-film magnetic head is a floating thin-film magnetic head used with a magnetic recording medium such as a hard disk device. A slider 251 of the thin-film magnetic head has a reading side 235 and a trailing side 236. Longitudinal air bearing surfaces (ABS) 251a and 251b and air grooves 251c are formed on the surface of the slider 251 facing the disk.

A magnetic core unit 250 is provided on an end face 251d of the slider 251.

The magnetic core unit 250 of this thin-film magnetic head is a composite-type thin-film magnetic head having the structure shown in FIGS. 25 and 26, and is formed by successively depositing an MR (read head) h1 and an inductive head (write head) h2 on the trailing end face 251d of the slider 251.

The magnetoresistive head h1 comprises a lower shield layer 253 which is formed on the trailing side portion of the slider 251 and is composed of a magnetic alloy, a lower gap layer 254 formed on the lower shield layer 253, a magnetoresistive thin-film magnetic element layer 245 formed on the lower gap layer 254, an upper gap layer 256 formed on the magnetoresistive thin-film magnetic element layer 245, and an upper shield layer 257 formed on the upper gap layer 256. The upper shield layer 257 also serves as a lower core layer of the inductive head h2 formed thereon.

The MR head reads the information stored in the recording medium by detecting a change in resistance at the magnetoresistive thin-film magnetic element layer 245 occurred in response to a weak leakage magnetic field from the magnetic recording medium such as a disk in a hard disk device.

The inductive head h2 includes a lower core layer 257, a gap layer 264 formed on the lower core layer 257, and a coil layer 266 patterned in a spiral. The coil layer 266 is surrounded by a first insulation layer 267A and a second insulation layer 267B. An upper core layer 268 is formed on the second insulation layer 267B. At the air bearing surface 251b, a magnetic pole end portion 268a of the upper core layer 268 is arranged to face the lower core layer 257 with a magnetic gap G therebetween. As shown in FIGS. 25 and 26, a base end portion 268b of the upper core layer 268 is magnetically connected to the lower core layer 257.

A protective layer 269 composed of alumina or the like is provided on the upper core layer 268.

In this inductive head h2, a recording current flows to the coil layer 266 and from the coil layer 266 to the core layers. The inductive head h2 writes magnetic signals onto a magnetic recording medium such as a hard disk by using a leakage magnetic field provided from the end portions of the lower core layer 257 and upper core layer 268 at the magnetic gap G.

A giant magnetoresistive element (GMR element) or the like is provided in the magnetoresistive thin-film magnetic element layer 245. The GMR element has a multi-layer structure using a combination of several different materials. Among structures which generate giant magnetoresistive effects, a spin-valve type which is relatively simple in structure while achieving a high rate of change in resistance, is known in the art. There are a single spin-valve type and dual spin-valve type in the spin-valve type.

FIG. 27 is a cross-sectional view of a principal portion of an exemplary thin-film magnetic head MR2 equipped with a conventional spin-valve thin-film magnetic element, viewed from the side facing a recording medium.

The spin-valve thin-film magnetic element MR2 is a bottom-type single spin-valve thin-film magnetic element comprising an antiferromagnetic layer 122, a pinned magnetic layer 153, a nonmagnetic conductive layer 124, and a free magnetic layer 165, deposited in that order from the bottom.

In FIG. 27, a composite all has a substantially trapezoidal shape and includes an underlayer 121 comprising Ta or the like, the antiferromagnetic layer 122 composed of a PtMn alloy formed on the underlayer 121, the pinned magnetic layer 153 formed on the antiferromagnetic layer 122, the nonmagnetic conductive layer 124 formed on the pinned magnetic layer 153, the free magnetic layer 165 formed on the nonmagnetic conductive layer 124, and a protective layer 127 formed on the free magnetic layer 165. The antiferromagnetic layer 122 extends to the region corresponding to the two lateral portions of the pinned magnetic layer 153, the nonmagnetic conductive layer 124, and the free magnetic layer 165.

The pinned magnetic layer 153 is composed of a nonmagnetic interlayer 154, a first pinned magnetic sublayer 155, and a second pinned magnetic sublayer 156, the latter two sandwiching the nonmagnetic interlayer 154. The first pinned magnetic sublayer 155 is provided at the position closer to the antiferromagnetic layer 122 than is the nonmagnetic interlayer 154, and the second pinned magnetic sublayer 156 is provided at the position closer to the nonmagnetic conductive layer 124 than is the nonmagnetic interlayer 154.

The first pinned magnetic sublayer 155 and the second pinned magnetic sublayer 156 comprise elemental Co, a CoFe alloy, a NiFe alloy, or the like. The nonmagnetic interlayer 154 comprise a nonmagnetic material such as Ru.

Preferably, the thickness of the first pinned magnetic sublayer 155 and the thickness of the second pinned magnetic sublayer 156 are different from each other. In FIG. 27, the thickness of the second pinned magnetic sublayer 156 is greater than the thickness of the first pinned magnetic sublayer 155.

An exchange coupling magnetic field (exchange anisotropic magnetic field) is generated at the interface between the first pinned magnetic sublayer 155 and the antiferromagnetic layer 122. The magnetization vector of the first pinned magnetic sublayer 155 is pinned in the direction opposite to the Y direction in the drawing by the exchange coupling magnetic field with the antiferromagnetic layer 122. The second pinned magnetic sublayer 156 antiferromagnetically couples with the first pinned magnetic sublayer 155 so as to pin the magnetization vector of the second pinned magnetic sublayer 156 in the Y direction.

Since the magnetization vectors of the first pinned magnetic sublayer 155 and the second pinned magnetic sublayer 156 are antiparallel to each other, magnetic moments of the first pinned magnetic sublayer 155 and the second pinned magnetic sublayer 156 cancel out. However, because the thickness of the second pinned magnetic sublayer 156 is greater than the thickness of the first pinned magnetic sublayer 155, the spontaneous magnetization of the second pinned magnetic sublayer 156 slightly remains thereby putting the pinned magnetic layer 153 in a ferri-magnetic state. Moreover, the slight spontaneous magnetization further intensifies the exchange coupling magnetic field with the antiferromagnetic layer 122, pinning the magnetization vector of the pinned magnetic layer 153 in the Y direction in the drawing.

The free magnetic layer 165 includes an antiferromagnetic layer 166 comprising a ferromagnetic material such as a NiFe alloy and an anti-diffusion layer 167 composed of a ferromagnetic material such as Co. The anti-diffusion layer 167 is provided on the nonmagnetic conductive layer 124.

Hard bias layers 126 comprising a Co—Pt-type alloy, i.e., permanent magnetic layers, are provided at two sides of the free magnetic layer 165 and on the extended portions of the antiferromagnetic layer 122. Bias underlayers 175 comprising Cr are provided to separate the hard bias layers 126 and the antiferromagnetic layer 122. Each of the bias underlayers 175 is provided under each of the hard bias layers 126 and between the composite MR2 and the hard bias layers 126 at the two sides thereof.

Conductive layers 128 comprising Cr, Ta, Au, or the like are deposited on the hard bias layers 126 so as to supply a detection current to the free magnetic layer 165, the nonmagnetic conductive layer 124, and the pinned magnetic layer 153.

The hard bias layers 126 prevent Barkhausen noise generated when a plurality of magnetic domains are formed in the free magnetic layer 165 and put the free magnetic layer 165 in a single-magnetic-domain state. When the hard bias layers 126 are magnetized in the X1 direction in the drawing, a leakage magnetic field from each of the hard bias layers 126 orients the magnetization vector of the free magnetic layer 165 in the X1 direction in the drawing. Accordingly, the variable magnetization vector of the free magnetic layer 165 and the pinned magnetization vector of the pinned magnetic layer 153 are set to be substantially orthogonal to each other.

By forming the bias underlayers 175, the axis of magnetic induction of the Co—Pt-type alloy constituting the hard bias layers 126 is oriented in the planar direction, thereby improving the characteristics such as coercive force, remanence ratio, and the like, of the hard bias layers 126 as the permanent magnetic layers. Thus, significantly large bias magnetic field can be generated, thereby putting the free magnetic layer into a single-magnetic-domain state and inhibiting generation of Barkhausen noise.

In this spin-valve thin-film magnetic element MR2, a detection current (sense current) is supplied from the conductive layers 128 to the free magnetic layer 165, the nonmagnetic conductive layer 124, and the pinned magnetic layer 153. The recording medium such as a hard disk moves in the Z direction in the drawing. When there is a leakage magnetic field from the magnetic recording medium, the magnetization vector of the free magnetic layer 165 changes from the Y direction to the X1 direction in the drawing. At this time, spin-dependent scattering of conduction electrons occurs at the interface between the nonmagnetic conductive layer 124 and the free magnetic layer 165 and at the interface between the nonmagnetic conductive layer 124 and the second pinned magnetic sublayer 156, causing a change in electrical resistance. Accordingly, the leakage magnetic field from the recording medium is detected as the change in electrical resistance.

Moreover, although the magnetic moments of the antiferromagnetically coupled first and second pinned magnetic layers 155 and 156 do cancel out each other, the spontaneous magnetization of the second pinned magnetic sublayer 156 remains slightly because the thickness of the second pinned magnetic sublayer 156 is greater than the thickness of the first pinned magnetic sublayer 155, putting the pinned magnetic layer 153 in a ferri-magnetic state. The spontaneous magnetization further intensify the exchange coupling magnetic field with the antiferromagnetic layer 122, pinning the magnetization vector of the pinned magnetic layer 153 in the Y direction in the drawing. As a consequence, the spin-valve thin-film magnetic element MR2 enjoys a stable performance.

In the conventional spin-valve thin-film magnetic element MR2, because the bias underlayers 175 are provided between the free magnetic layer 165 and the hard bias layers 126 arranged at the two sides of the free magnetic layer 165, the free magnetic layer 165 and the hard bias layers 126 are not magnetically and directly connected. Thus, the only magnetic field applied to the free magnetic layer 165 is that of the magnetostatic interaction, i.e., the effective magnetic field applied from the hard bias layers 126 (static magnetic field). This magnetic field alone controls the magnetic domain of the free magnetic layer 165 and puts the free magnetic layer 165 into a single-magnetic-domain state.

Demagnetizing fields B in the two end portion of in the track width Tw direction of the free magnetic layer 165 applies, to the two side portions of the free magnetic layer 165, a magnetic field opposite to a desired direction. This leads to a so-called "buckling phenomenon" in which the magnetization vectors at the two side portions of the free magnetic layer 165 become disordered and discontinuous developing domain walls therein. The demagnetizing field B is a magnetic field acting in the opposite direction of the magnetization vector of the free magnetic layer 165 due to the magnetic charges accumulated in the two side portions of the free magnetic layer 165.

In recent years, demand for higher recording density has led to a narrower track width in the magnetoresistive head h1. As the track width becomes narrower, the demagnetizing field in the two side portions of the free magnetic layer 165 intensifies, undesirably promoting the buckling phenomenon and degrading the magnetic domain controllability in the free magnetic layer 165. As a consequence, a output waveform become erroneous at the two side portions of the track width Tw and there is a problem of increased instability in the output waveform.

One way to minimize the buckling phenomenon is to increase the thickness of the hard bias layers so as to intensify the magnetic field (bias magnetic field) for saturating the free magnetic layer 165, thereby removing the influence of magnetic charges accumulated in the two side portions of the free magnetic layer 165. In this way, however, the read output at the center portion of the composite all tends to be high and the read output at the side portions of the composite tends to be low. In this respect, when the thickness of the hard bias layers are increased, the regions located at the side portions with low read output become larger, degrading the overall read output. This problem becomes more salient as the track becomes narrower.

SUMMARY OF THE INVENTION

Accordingly, it is an object of the present invention to provide a magnetoresistive thin-film magnetic element having high output waveform stability in the two ends of the track width. In the magnetoresistive thin-film magnetic element, a bias magnetic field from the hard bias layers is not undesirably high, thereby improving the read output. The bias magnetic field may be effectively applied to the free magnetic layer from the hard bias layers, and disorder of the magnetization vectors at the two side portions of the free magnetic layer due to a demagnetizing field occurred in the two side portions of the free magnetic layer may be prevented. The magnetic domains of the free magnetic layer may be satisfactorily controlled. Another object of the present invention is to provide a method for making the magnetoresistive thin-film magnetic element having the above-described advantages.

Yet another object of the invention is to provide thin-film magnetic head equipped with the magnetoresistive thin-film magnetic element having the above-described advantages.

To these ends, a magnetoresistive thin-film magnetic element according to a first aspect of the invention includes a composite having an antiferromagnetic layer, a pinned magnetic layer, the magnetization vector thereof being pinned by an exchange anisotropic magnetic field with the antiferromagnetic layer, a nonmagnetic conductive layer formed between the pinned magnetic layer and a free magnetic layer; hard bias layers, formed on two sides of the free magnetic layer so that at least part of each of the hard bias layers is in direct contact with the free magnetic layer, for orienting the magnetization vector of the free magnetic layer in a direction substantially orthogonal to the magnetization vector of the pinned magnetic layer; a conductive layer for supplying a sense current to the free magnetic layer, the nonmagnetic conductive layer, and the pinned magnetic layer; and bias underlayers each being provided under each of the hard bias layers, for controlling crystal orientation of the hard bias layers.

In this magnetoresistive thin-film magnetic element, the hard bias layers and the free magnetic layers are in contact with each other at least partly. Thus, the free magnetic layer and the hard bias layers at the two sides thereof may be magnetically coupled by an exchange coupling (exchange interaction), inhibiting the generation of a demagnetizing field at the two side portions of the free magnetic layer. As a consequence, a strong bias magnetic field may be applied to the free magnetic layer from the hard bias layers, and the disorder of the magnetic vectors at the two side portions due to the demagnetizing field may be prevented (prevention of a buckling phenomenon). The magnetic domains of the free magnetic layer may be satisfactorily controlled, improving the stability of the output waveform at the two ends of the track width.

An exchange interaction between the free magnetic layer and the hard bias layers at the two sides thereof acts between the spinning magnetic atoms and is a significantly strong interaction which orients the magnetization vectors in parallel to each other. This strong interaction effectively removes the magnetic charges accumulated in the two side portions of the free magnetic layer 21, thereby inhibiting the generation of the demagnetizing field at the two side portions of the free magnetic layer. Moreover, since the bias underlayers for controlling the crystal orientation of the hard bias layers are formed at the bottom of the hard bias layers, the crystal orientation of the hard bias layers is satisfactory, the coercive force and the remanence ratio being sufficiently large. Thus, the intensity of the bias magnetic field required for putting the free magnetic layer 21 in a single-domain state may be sufficiently increased and generation of Barkhausen noise may be prevented.

Furthermore, since no demagnetizing field occurs in the two side portions of the free magnetic layer, the buckling phenomenon may be inhibited even when the track width of the read head equipped with the spin-valve thin-film magnetic element may be made narrower. Thus, the output waveform at the two ends of the track width Tw may be prevented from becoming erroneous by the buckling phenomenon which would otherwise occur, and the instability of the overall read head may be reduced.

Also, even when the product of the remanence and the thickness of the hard bias layers is reduced to a certain extent, the above-described exchange interaction prevents the demagnetizing field from occurring in the two side portions of the free magnetic layer. The bias magnetic field from each hard bias layer may be effectively applied to the free magnetic layer, thereby securing the stability of the output waveform at the two ends of the track width Tw. In this respect, for example, the thickness of the hard bias layer may be decreased so as to decrease the exchange bias magnetic field. The region at the side portions of the composite, that is, the region with a lower read output, may be minimized so as to enlarge the region at the center portion having high read output, thereby improving the read output.

Preferably, the above-described magnetoresistive thin-film magnetic element according to the first aspect of the invention is of a dual type in which the nonmagnetic conductive layer, the pinned magnetic layer, and the antiferromagnetic layer are provided on each of two sides in the thickness direction of the free magnetic layer.

This magnetoresistive thin-film magnetic element has two sets of the free magnetic layer, the nonmagnetic conductive layer, and the pinned magnetic layer. Compared to the magnetoresistive thin-film magnetic element having only one set of these, a relatively high rate in change of resistance ΔR/R may be obtained, meeting the demand for high recording density.

Preferably, the composite further includes a nonmagnetic interlayer which separates at least one of the pinned magnetic layer and the free magnetic layer into two sublayers, wherein the two divided sublayers are in a ferri-magnetic state in which magnetization vectors of the two divided sublayers are antiparallel to each other.

When the pinned magnetic layer is divided into two sublayers by a nonmagnetic interlayer, one of the two sublayers pins the magnetic vector of the pinned magnetic layer in a predetermined direction and maintains the pinned magnetic layer in a stable state.

When the free magnetic layer is divided into two sublayers by a nonmagnetic interlayer, an exchange coupling magnetic field is generated between the divided sublayers to be in a ferri-magnetic state. As a result, the magnetic thickness may be decreased, and the free magnetic layer rotates in an external field with high sensitivity.

In the magnetoresistive thin-film magnetic element according to one aspect, the bias underlayers may extend to the interfaces between the free magnetic layer and the hard bias layers provided at the two sides of the free magnetic layer.

In this magnetoresistive thin-film magnetic element, the hard bias layers and the free magnetic layers are in contact with each other at least partly even when the bias underlayers extend to the interfaces between the free magnetic layer and the hard bias layers at the two sides thereof. The free magnetic layer and the hard bias layer are magnetically coupled due to an exchange interaction, effectively removing the cause of a demagnetizing field, i.e., the magnetic charges accumulated at the two side portions of the free magnetic layer. Although the efficiency of the bias magnetic field applied from the hard bias layers to the free magnetic layer is decreased compared to the spin-valve thin-film magnetic element having the bias underlayers without portions extending to the interfaces between the free magnetic layer and the hard bias layers, a strong bias magnetic field may still be suitably applied from the hard bias layers to the free magnetic layer. Thus, the magnetization vectors in the two side portions of the free magnetic layer may be prevented from being disordered due to the demagnetizing field which would otherwise be generated at the two side portions of the free magnetic layer. The magnetic domains of the free magnetic layer may be suitably controlled and the stability of the read waveform at the two sides of the track width Tw may be improved.

Preferably, in this spin-valve thin-film magnetic element, the thickness of the extensions of the bias underlayers is preferably about 1 nm or less, and more preferably, about 0.5 nm or less.

When the thickness of the extensions is about 1 nm or less, pinholes are readily formed in the bias under layer. The free magnetic layer and the hard bias layers are magnetically coupled through these pinholes in the extensions of the bias underlayers. Accordingly, not only part of the free magnetic layer and the hard bias layers directly in contact with each other but also part of the free magnetic layer and the portion hard bias layers separated by the extensions of the bias underlayers are magnetically coupled. Moreover, since the region having the exchange interaction is enlarged, the magnetic charges accumulated in the two side portions of the free magnetic layer are effectively removed by the above-described exchange interaction, thereby inhibiting the demagnetizing field in the two side portions of the free magnetic layer. Thus, a strong bias magnetic field may be applied from each of the hard bias layers to the free magnetic layer, inhibiting the magnetization vectors in the two side portions of the free magnetic layer from being disordered due to the demagnetizing field which would otherwise occur at the two side portions of the free magnetic layer. As a result, the magnetic domains of the free magnetic layer may be further satisfactorily controlled and the stability of the read waveform at the two ends of the track width Tw can be further improved.

Preferably, the bias underlayers include a nonmagnetic metal having a body-centered cubic structure, and the hard bias layers are made of Cr. When the hard bias layers are composed of a Co—Pt-type alloy or a Co—Pt—Cr-type alloy, the crystal structure of the hard bias layers includes both the face-centered cubic structure (fcc) and the close-packed hexagonal structure (hcp). In this case, when the bias underlayers are composed of Cr having a body-centered cubic structure (bcc) and a (100) crystal orientation, the Co—Pt alloy or the Co—Pt—Cr alloy barely forms an fcc structure but readily forms a hcp structure because the lattice constants of the Cr layer and lattice constants of the Co—Pt alloy or the Co—Pt—Cr alloy are very close. The c axis (magnetization easy axis) of the hcp structure at this time is preferentially oriented in the planar direction of the interface between the Cr layer and one of the Co—Pt alloy layer and the Co—Pt—Cr alloy layer. Since an increased magnetic anisotropy is generated in the c axis of the hcp structure compared to the fcc structure, a larger coercive force (Hc) is generated when a magnetic field is applied to the hard bias layers. Furthermore, because the c axis of the hcp structure is preferentially oriented in the planar direction of the interface between the Cr layer and one of the Co—Pt alloy layer and the Co—Pt—Cr alloy layer, a remanence (Br) is increased and a remanence ratio (remanence (Br)/saturation flux density (Bs)) is also increased. As a result, the characteristics of the hard bias layers as the permanent magnetic layers are improved, intensifying the bias magnetic field generated from each of the hard bias layers, thereby readily aligning the free magnetic layer 21 into a single-magnetic-domain state.

Preferably the nonmagnetic metal having the body-centered cubic structure includes at least one metal selected from the group consisting of Cr, Ti, Mo and $W_{50}Mo_{50}$.

Preferably, slope angles at the side portions of the composite sandwiched by the hard bias layers are about 30 degrees or more to reduce the Barkhausen jump (BHJ) to about 15% or less. More preferably, the slope angles are about 45 degrees or more to reduce the BHJ to about 10% or less. Most preferably, the slope angles are about 60 degrees or more to reduce the BHJ to about 5% or less.

When the slope angle θ is less than about 30 degrees, the end portion of the hard bias layer facing the composite becomes angular. As a consequence, the thickness of the end portion decreases while enlarging the end portions not provided with the bias underlayers at the bottom. In other words, the end portions having disordered crystal orientations are increased. The volume of the each portion having a reduced coercive force increases, thereby changing the magnetization state of the hard bias layer, and the bias magnetic field becomes disordered, thereby increasing Barkhausen jump (BHJ). It is then impossible to stably provide a sufficient bias magnetic field to the free magnetic layer, resulting in increased Barkhausen noise.

A magnetoresistive thin-film magnetic element according to another aspect includes a composite having an antiferromagnetic layer, a pinned magnetic layer the magnetization vector thereof being pinned by an exchange anisotropic magnetic field with the antiferromagnetic layer, a nonmagnetic conductive layer formed between the pinned magnetic layer and a free magnetic layer; hard bias layers formed at two sides of the composite, for orienting the magnetization vector of the free magnetic layer in a direction substantially orthogonal to the magnetization vector of the pinned magnetic layer; a conductive layer for supplying a sense current to the free magnetic layer, the nonmagnetic conductive layer, and the pinned magnetic layer; and bias underlayers each being provided under each of the hard bias layers and extends to the interface between the free magnetic layer and each of the hard bias layers, for controlling crystal orientation of the hard bias layers, in which the thickness of each of the hard bias underlayers is smaller at the interface between the free magnetic layer and each of the hard bias layers than under the hard bias layers.

Because the thickness of the hard bias layers is smaller at the interface between the free magnetic layer and each of the hard bias layers than under the hard bias layers, pin holes are formed in the portions of the bias underlayers sandwiched by the free magnetic layer and the hard bias layers. The free magnetic layer and the hard bias layer are magnetically coupled through these pinholes due to an exchange interaction, effectively removing the cause of a demagnetizing field, i.e., the magnetic charges accumulated at the two side portions of the free magnetic layer. A strong bias magnetic field can be suitably applied from the hard bias layers to the free magnetic layer, and the magnetization vectors in the two side portions of the free magnetic layer are prevented from being disordered due to the demagnetizing field which would otherwise be generated at the two side portions of the free magnetic layer. The magnetic domains of the free magnetic layer may be suitably controlled and the stability of the read waveform at the two sides of the track width Tw may be improved.

Preferably, the magnetoresistive thin-film magnetic element according to the second aspect of the invention is of a dual type in which the non magnetic conductive layer, the pinned magnetic layer, and the antiferromagnetic layer are provided on each of two sides in the thickness direction of the free magnetic layer.

This magnetoresistive thin-film magnetic element has two sets of the free magnetic layer, the nonmagnetic conductive layer, and the pinned magnetic layer. Compared to the magnetoresistive thin-film magnetic element having only one set of these, a relatively high rate in change of resistance $\Delta R/R$ may be obtained, meeting the demand for high recording density.

Preferably, the composite further includes a nonmagnetic interlayer which separates at least one of the pinned magnetic layer and the free magnetic layer into two sublayers, wherein the two divided sublayers are in a ferri-magnetic state in which magnetization vectors of the two divided sublayers are antiparallel to each other.

When the pinned magnetic layer is divided into two sublayers by a nonmagnetic interlayer, one of the two sublayers pins the magnetic vector of the pinned magnetic layer in a predetermined direction and maintains the pinned magnetic layer in a stable state.

When the free magnetic layer is divided into two sublayers by a nonmagnetic interlayer, an exchange coupling magnetic field is generated between the divided sublayers to be in a ferri-magnetic state. As a result, the magnetic thickness is decreased, and the free magnetic layer rotates in an external field with high sensitivity.

Preferably, in this spin-valve thin-film magnetic element, the thickness of the bias underlayers at the interfaces between the free magnetic layer and the hard bias layers is preferably about 1 nm or less, and more preferably, about 0.5 nm or less.

When the thickness is about 1 nm or less, pinholes are readily formed in the bias under layer. The free magnetic layer and the hard bias layers are magnetically coupled through these pinholes in the bias underlayers at the interfaces. Moreover the magnetic charges accumulated in the two side portions of the free magnetic layer are effectively removed by the above-described exchange interaction, thereby inhibiting the demagnetizing field in the two side portions of the free magnetic layer. Thus, a strong bias magnetic field can be applied from each of the hard bias layers to the free magnetic layer, inhibiting the magnetization vectors in the two side portions of the free magnetic layer from being disordered due to the demagnetizing field which would otherwise occur at the two side portions of the free magnetic layer. As a result, the magnetic domains of the free magnetic layer can be further satisfactorily controlled and the stability of the read waveform at the two ends of the track width Tw can be further improved.

Preferably, the bias underlayers include a nonmagnetic metal having a body-centered cubic structure, and the hard bias layers are made of Cr for the reasons described above.

Slope angles of the side portions of the composite sandwiched by the hard bias layers are preferably about 30 degrees or more to reduce Barkhausen jump (BHJ) to about 15% or less. More preferably, the slope angles are about 45 degrees or more to reduce the BHJ to about 10% or less, and more preferably the slope angles are about 60 degrees or more to reduce the BHJ to about 5% or less.

A thin-film magnetic head equipped with the above described magnetoresistive thin-film magnetic element also provided. In the thin-film magnetic head, the magnetic domains of the free magnetic layer are satisfactorily controlled, Barkhausen noise is prevented, and the stability of the output waveform at the two ends of the track width is improved.

A method for making a magnetoresistive thin-film magnetic element has the steps of: forming a composite layer on a substrate, the composite layer formed of an antiferromagnetic layer, a pinned magnetic layer in contact with the antiferromagnetic layer, a nonmagnetic conductive layer, and a free magnetic layer, wherein the magnetization vector of the pinned magnetic layer is pinned by an exchange coupling magnetic field with the antiferromagnetic layer; applying a lift-off resist on the composite layer; removing the area not covered by the lift-off resist by an ion milling so as to form a substantially trapezoidal composite; forming bias underlayers for controlling the crystal orientation of hard bias layers at the two sides of the composite by at least one process of an ion beam sputtering process, a long-throw sputtering process, and a collimation sputtering process while arranging a first target to oppose the substrate to be parallel to each other or arranging the first target to oppose the substrate so that the angle defined by the first target and the substrate is smaller than the angle defined by a second target and the substrate during the subsequent step of forming the hard bias layers; forming, on the bias underlayers, the hard bias layers for orienting the magnetization vector of the free magnetic layer in the direction substantially orthogonal to the pinned magnetic layer by at least one of an ion beam sputtering process, a long-throw sputtering process, and a collimation sputtering process while arranging the second target to oppose the substrate so that the angle defined by the second target and the substrate is larger than the angle defined by the first target and the substrate during the preceding step of forming the bias underlayers; and forming, on the hard bias layers, conductive layers by at least one of an ion beam sputtering process, a long-throw sputtering process, and a collimation sputtering process while arranging a third target to oppose the substrate so that the angle defined by the third target and the substrate is larger than the angle defined by the second target and the substrate during the preceding step of forming the hard bias layers.

This method may be suitable for making the magnetoresistive thin-film magnetic element, having the bias underlayers provided at the bottom of the hard bias layers, and the magnetoresistive thin-film magnetic element, having the bias underlayers provided at the bottom of the hard bias layers and extending to the interfaces between the free magnetic layer and the hard bias layers.

Preferably, the step of forming the hard bias layers may include optimizing the angle defined by the first target and the substrate so as to form bias underlayers on the substrate at the two sides of the composite and on parts of the side surfaces at the two sides of the free magnetic layer. The hard bias layers are formed so that end portions of the hard bias layers and side portions of the free magnetic layer of the composite contact each other at least partly.

Alternatively, the step of forming the hard bias layers may include optimizing the angle defined by the first target and the substrate so as to form bias underlayers on the substrate at the two sides of the composite and on the side surfaces of the free magnetic layer. The hard bias layers are formed at the interfaces between the two sides of the free magnetic layer of the composite and the end portions of the hard bias layers.

Preferably, during the step of forming the substantially trapezoidal composite, the slope angles at the two side portions of the composite are formed to be about 30 degrees or more for the reasons described above.

Other systems, methods, feature, and advantages of the invention will be or will become apparent to one skilled in the art upon examination of the following section figures and detailed description. All such additional systems, methods, features, and advantages are intended to be included within this description, within the scope of the invention, and protected by the accompanying claims.

BRIEF DESCRIPTION OF THE DRAWINGS

The invention may be better understood with reference to the following section figures and detailed description. The components in the figures are not necessarily to scale, emphasis placed upon illustrating the principles of the invention.

FIG. 13 represents a schematic cross-sectional view of a spin-valve thin-film magnetic element according to a fourth embodiment.

FIG. 14 represents a cross-sectional view illustrating the spin-valve thin-film magnetic element shown in FIG. 13 viewed from the face opposing a recording medium.

DESCRIPTION OF THE PREFERRED EMBODIMENTS

The preferred embodiments of the magnetoresistive thin-film magnetic element of the present invention as applied to a spin-valve thin-film magnetic element are described in detail with reference to the drawings. Methods for making the same are also described.

First Embodiment

Figure 1:
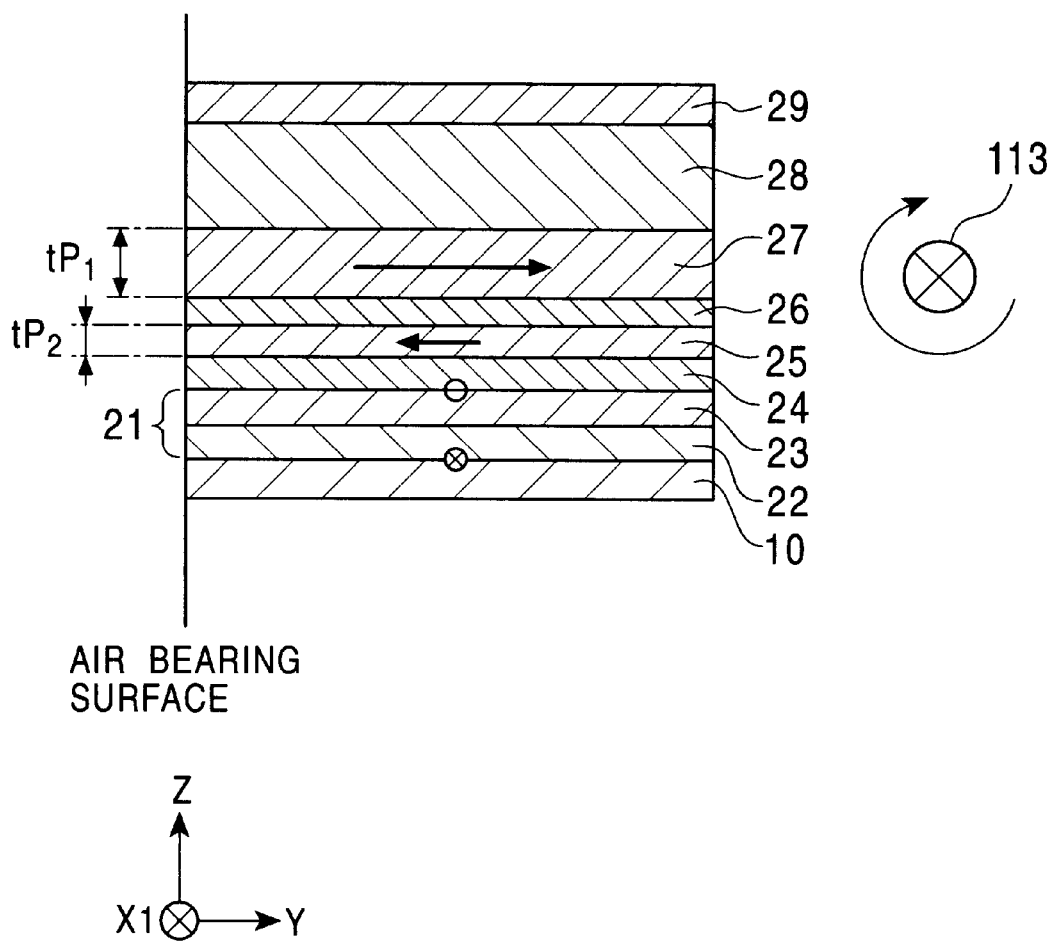
FIG. 1 represents a cross-sectional view schematically showing a first embodiment of spin-valve thin-film magnetic element.
Figure 2:
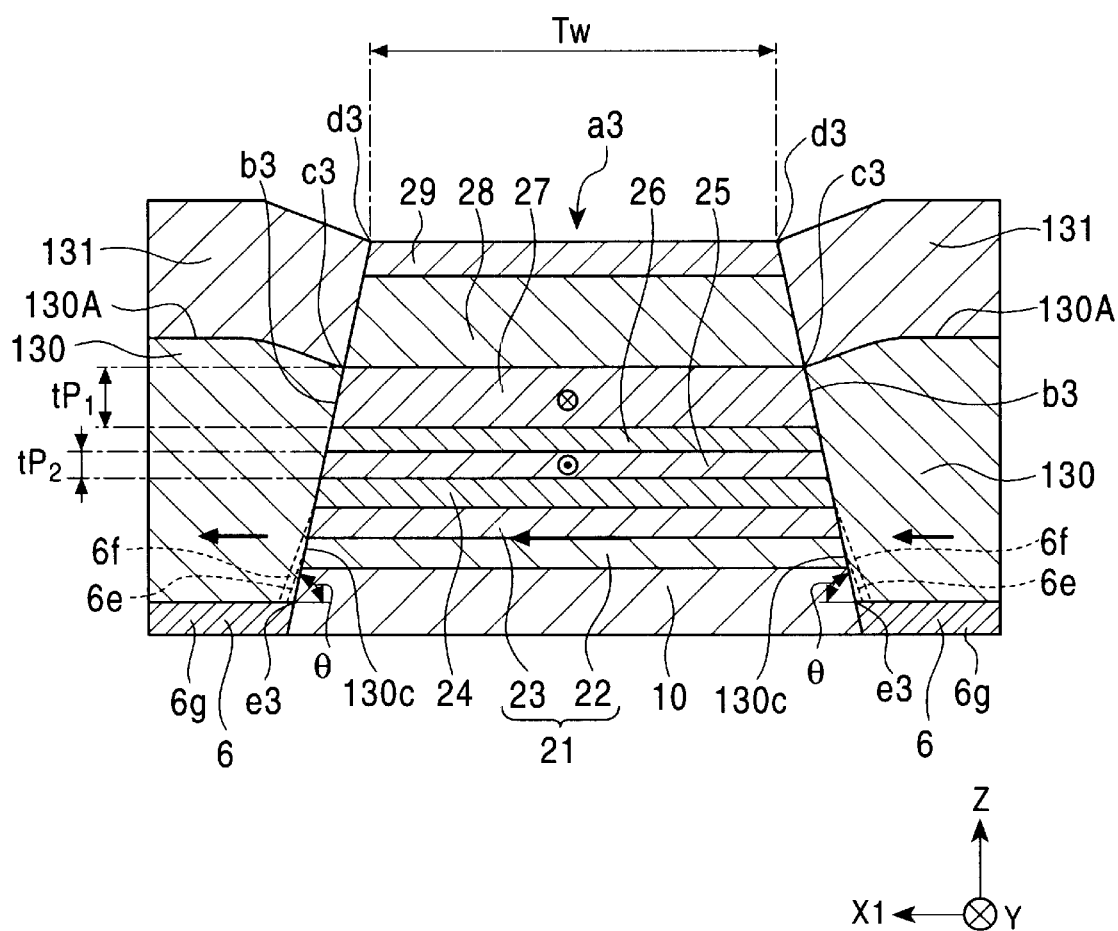
FIG. 2 represents a cross-sectional view of the spin-valve thin-film magnetic element shown in FIG. 1 viewed from the side opposing a recording medium.

FIG. 1 represents a cross-sectional view schematically showing a first embodiment of a spin-valve thin-film magnetic element. FIG. 2 is a cross-sectional view of the spin-valve thin-film magnetic element shown in FIG. 1 viewed from the side opposing a recording medium.

In the spin-valve thin-film magnetic element of the first embodiment, a magnetic recording medium such as a hard disk moves in the Z direction in the drawings, and the direction of a leakage magnetic field from the magnetic recording medium is the Y direction in the drawings.

The spin-valve thin-film magnetic element of the first embodiment is a top-type single spin-valve thin-film magnetic element comprising a free magnetic layer, a nonmagnetic conductive layer, a pinned magnetic layer, and an antiferromagnetic layer, deposited in that order. The pinned magnetic layer is divided into two sublayers by a nonmagnetic interlayer therebetween.

More particularly, the spin-valve thin-film magnetic element shown in FIGS. 1 and 2 is formed on a substrate (not shown) and comprises, from the bottom to the top, an underlayer 10 composed of a nonmagnetic material such as Ta, a NiFe sublayer 22, a Co sublayer 23 (the NiFe sublayer 22 and the Co sublayer 23 constitute a free magnetic layer 21), a nonmagnetic conductive layer 24, a second pinned magnetic sublayer 25, a nonmagnetic interlayer 26, a first pinned magnetic sublayer 27, an antiferromagnetic layer 28, and a protective layer 29 composed of Ta or the like, deposited in that order.

The first pinned magnetic sublayer 27 and the second pinned magnetic sublayer 25 are, for example, composed of elemental cobalt (Co), a NiFe alloy, a CoNiFe alloy, a CoFe alloy, or the like.

Preferably, the antiferromagnetic layer 28 of the first embodiment of the spin-valve thin-film magnetic element is composed of a PtMn alloy. The PtMn alloy exhibits superior wear resistance, has a high blocking temperature, and generates an increased exchange coupling magnetic field (exchange anisotropic magnetic field), compared to a NiMn alloy or an FeMn alloy conventionally used as a material for the antiferromagnetic layer.

The PtMn alloy may be replaced with an X—Mn alloy or an X'—Pt—Mn alloy, wherein X is one element selected from the group consisting of Pd, Ru, Ir, Rh, and Os and X' is at least one element selected from the group consisting of Pd, Ru, Ir, Rh, Os, Au, Ag, Ne, Ar, Xe, and Kr.

Each of the arrows at the first pinned magnetic sublayer 27 and the second pinned magnetic sublayer 25 in FIG. 1 indicates the magnitude and the direction of the magnetic moment of the corresponding layer. The magnitude of the magnetic moment is defined as a product of a saturation magnetization (Ms) and layer thickness (t).

The first pinned magnetic sublayer 27 and the second pinned magnetic sublayer 25 may be composed of the same material and the thickness $tP_1$ of the first pinned magnetic sublayer 27 is larger than the thickness $tP_2$ of the second pinned magnetic sublayer 25. As a consequence, the magnetic moment of the first pinned magnetic sublayer 27 is larger than the magnetic moment of the second pinned magnetic sublayer 25.

Alternatively, the thickness $tP_2$ of the second pinned magnetic sublayer 25 may be greater than the thickness $tP_1$ of the first pinned magnetic sublayer 27 because, in the present invention, it is preferred that the magnetic moment of the first pinned magnetic sublayer 27 be different from the magnetic moment of the second pinned magnetic sublayer 25.

As shown in FIGS. 1 and 2, the first pinned magnetic sublayer 27 is magnetized in the Y direction in the drawing, i.e., the direction away from the recording medium (height direction). The second pinned magnetic sublayer 25 opposing the first pinned magnetic sublayer 27 with the nonmagnetic interlayer 26 therebetween is magnetized in antiparallel to the magnetization vector of the first pinned magnetic sublayer 27 so as to be in a ferri-magnetic state.

The first pinned magnetic sublayer 27 is formed to be in contact with the antiferromagnetic layer 28 and is annealed (thermally treated) in a magnetic field so as to generate an exchange coupling magnetic field (exchange anisotropic magnetic field) at the interface between the first pinned magnetic sublayer 27 and the antiferromagnetic layer 28. As a consequence, for example, as shown in FIGS. 1 and 2, the magnetization vector of the first pinned magnetic sublayer 27 is pinned in the Y direction in the drawings and the magnetization vector of the second pinned magnetic sublayer 25 is pinned in a direction opposite to the magnetization vector of the first pinned magnetic sublayer 27.

In the first embodiment of the spin-valve thin-film magnetic element, the larger the exchange coupling magnetic field, more stable are the magnetization vectors of the first pinned magnetic sublayer 27 and second pinned magnetic sublayer 25 maintained in antiparallel to each other. Preferably, the antiferromagnetic layer 28 of the spin-valve thin-film magnetic element is composed of a PtMn alloy. The PtMn alloy exhibits superior wear resistance, has a high blocking temperature, and generates an increased exchange coupling magnetic field (exchange anisotropic magnetic field), compared to a NiFe alloy or an FeMn alloy conventionally used as a material for the antiferromagnetic layer.

The PtMn alloy may be replaced with an X—Mn alloy or an X'—Pt—Mn alloy, wherein X is one element selected from the group consisting of Pd, Ru, Ir, Rh, and OS and X' is at least one element selected from the group consisting of Pd, Ru, Ir, Rh, Os, Au, Ag, Ne, Ar, Xe, and Kr.

The Pt content in the PtMn alloy and the X content in the X—Mn alloy are in the range of preferably about 37 through about 63 atomic percent, and more preferably, in the range of about 47 through about 57 atomic percent.

The total content of X' and Pt in the X'—Pt—Mn alloy is in the range of preferably about 37 through about 63 atomic percent and more preferably in the range of about 47 through about 57 atomic percent. When X' contained in the X'—Pt—Mn alloy is at least one element selected from the group consisting of Au, Ag, Ne, Ar, Xe, and Kr, the X' content is preferably in the range of about 0.2 through about 10 atomic percent. When X' contained in the X'—Pt—Mn alloy is at least one element selected from the group consisting of Pd, Ru, Ir, Rh, and Os, the X' content is preferably in the range of about 0.2 through about 40 atomic percent.

When one of the above alloys is annealed, the resulting antiferromagnetic layer 28 may generate an increased exchange coupling magnetic field. Especially when the PtMn alloy is used, the resulting antiferromagnetic layer 28 exhibits a high exchange coupling magnetic field exceeding about 64 kA/m and a significantly high blocking temperature (the temperature at which the antiferromagnetic layer 28 loses the exchange coupling magnetic field) of about 653 K (about 380° C.)

As described above, in this spin-valve thin-film magnetic element, the exchange coupling magnetic field (Hex) may be increased by optimizing the ratio of the thickness of the first pinned magnetic sublayer 27 to the thickness of the second pinned magnetic sublayer 25. Moreover, it is possible to maintain the magnetization vectors of the first pinned magnetic sublayer 27 and the second pinned magnetic sublayer 25 in a thermally-stable antiparallel state (a ferri-magnetic state) and to obtain a satisfactory rate of change in resistance ΔR/R.

The nonmagnetic interlayer 26 placed between the first pinned magnetic sublayer 27 and the second pinned magnetic sublayer 25 is preferably composed of at least one element selected from the group consisting of Ru, Rh, Ir, Cr, Re, and Cu.

As shown in FIGS. 1 and 2, the nonmagnetic conductive layer 24 composed of Cu or the like is formed on the free magnetic layer 21 and the second pinned magnetic sublayer 25 is formed on the nonmagnetic conductive layer 24. The free magnetic layer 21 comprises two sublayers 23 and 24. The sublayer 23 in contact with the nonmagnetic conductive layer 24 is composed of Co. The sublayer 22 is composed of a NiFe alloy, a CoFe alloy, a CoNiFe alloy, or the like. The Co sublayer 23 in contact with the nonmagnetic conductive layer 24 prevents diffusion of metallic elements or the like at the interface with the nonmagnetic conductive layer 24 of Cu so as to increase the rate of change in resistance ΔR/R.

As shown in FIGS. 1 and 2, hard bias layers 130 composed of a Co—Pt alloy, a Co—Cr—Pt alloy, or the like are provided at the two sides of the composite a3 comprising the underlayer 10 to the protective layer 29. Conductive layers 131 composed of Cr, Ta, Au, or the like, are formed on the hard bias layers 130. Because the hard bias layers 130 are magnetized in the X1 direction in FIG. 1, the free magnetic layer 21 is also magnetized in the X1 direction in FIG. 1. Bias underlayers 6 for controlling the crystal orientation of the hard bias layers are provided at the lower surfaces of the hard bias layers 130.

The hard bias layers 130 are arranged so that at least part of each of the hard bias layers 130 is positioned at the same level as the free magnetic layer 21. The thickness of the hard bias layers 130 is larger than the thickness of the free magnetic layer 21. Upper surfaces 130A of the hard bias layers 130 are positioned at a level higher than the upper surface of the free magnetic layer 21. The lower surfaces of the hard bias layers 130 are positioned at a level lower than the lower surface of the free magnetic layer 21. End portions 130C of the hard bias layer 130 are in direct contact with side surfaces b3 of the composite a3 (end portions of the free magnetic layer 21).

Contact points c3, where the upper surfaces 130A of the hard bias layers 130 contact the side surfaces b3 of the composite a3, are preferably positioned at a level lower than top ends d3 of the side surfaces b3 and lower than the highest level of the hard bias layers 130.

Preferably, the conductive layers 131 formed on the hard bias layers 130 are in contact with the side surfaces b3 of the composite a3.

The bias underlayers 6 are preferably composed of a nonmagnetic metal having a body-centered cubic structure. Preferably, at least one metal selected from the group consisting of Cr, Ti, Mo and $W_{50}Mo_{50}$ is used as such a metal. More preferably, the bias underlayers 6 are composed of chromium (Cr).

When the hard bias layers 130 are composed of a Co—Pt-type alloy or a Co—Pt—Cr-type alloy, the crystal structure of the hard bias layers 130 includes both the face-centered cubic structure (fcc) and the close-packed hexagonal structure (hcp). In this case, when the bias underlayers 6 are composed of Cr having a body-centered cubic structure (bcc) and a (100) crystal orientation, the Co—Pt alloy or the Co—Pt—Cr alloy barely forms an fcc structure but readily forms a hcp structure because the lattice constants of the Cr layer and lattice constants of the Co—Pt alloy or the Co—Pt—Cr alloy are very close. The c axis (magnetization easy axis) of the hcp structure at this time is preferentially oriented in the planar direction of the interface between the Cr layer and one of the Co—Pt alloy layer and the Co—Pt—Cr alloy layer. Since an increased magnetic anisotropy is generated in the c axis of the hcp structure compared to the fcc structure, a larger coercive force (Hc) is generated when a magnetic field is applied to the hard bias layers 130. Furthermore, because the c axis of the hcp structure is preferentially oriented in the planar direction of the interface between the Cr layer and one of the Co—Pt alloy layer and the Co—Pt—Cr alloy layer, a remanence (Br) is increased and a remanence ratio (remanence (Br)/saturation flux density (Bs)) is also increased. As a result, the characteristics of the hard bias layers 130 as the permanent magnetic layers are improved, intensifying the bias magnetic field generated from each of the hard bias layers 130, thereby readily aligning the free magnetic layer 21 into a single-magnetic-domain state.

The slope angle θ of each side portion of the composite a3 sandwiched by the hard bias layers 130 is about 30 degrees or more. In this manner, as shown in FIG. 3B, the thickness of the end portion 130C of the hard bias layer 130 facing the composite a3 may be increased. As the thickness of the end portion 130C increases, the end portions 130C without the bias underlayers 6 decreases. In other words, the end portions 130C having disordered crystal orientations are decreased. As a consequence, the volume of the each end portion 130C having a reduced coercive force (the meshed portion in FIGS. 3A and 3B), is decreased as shown in FIG. 3B, reducing Barkhausen jump (BHJ) to about 15% or less. Preferably, the slope angle θ is about 45 degrees or more to reduce the BHJ to about 10% or less and, more preferably, the slope angle θ is about 60 degrees or more to reduce the BHJ to about 5% or less.

Figure 3A:
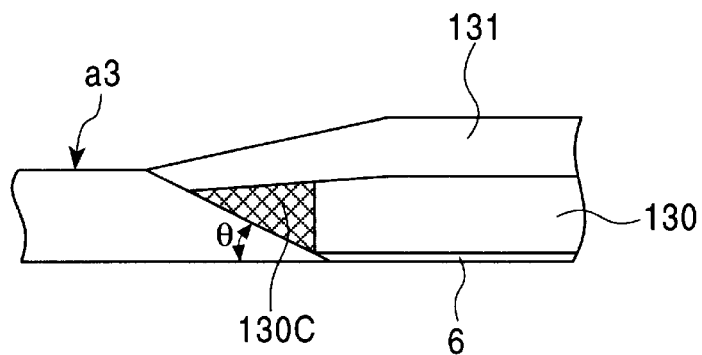
FIGS. 3A and 3B are cross-sectional views for explaining the relationship between a slope angle θ of a side portion of a composite sandwiched by hard bias layers of a spin-valve thin-film magnetic element.
Figure 3B:
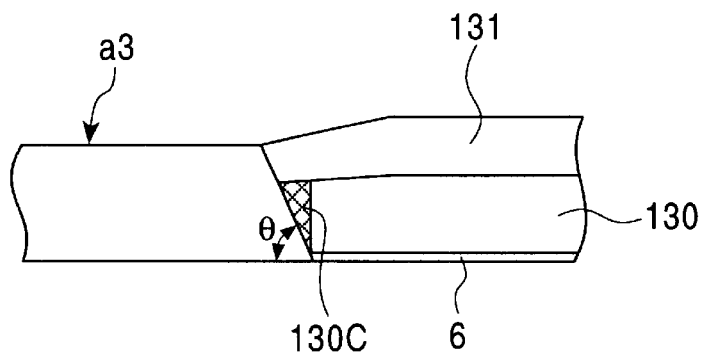

When the slope angle θ is less than about 30 degrees, the end portion 130C of the hard bias layer 130 facing the composite a3 becomes angular, as shown in FIG. 3A. As a consequence, the thickness of the end portion 130C decreases while enlarging the end portion 130C not provided with the bias underlayer 6 at the bottom. In other words, the end portions 130C having disordered crystal orientations are increased. The volume of the each portion 130C having a reduced coercive force (the meshed portion in FIGS. 3A and 3B) increases, thereby changing the magnetization state of the hard bias layer 130, and the bias magnetic field becomes disordered, thereby increasing Barkhausen jump (BHJ). It is then impossible to stably provide a sufficient bias magnetic field to the free magnetic layer, resulting in increased Barkhausen noise.

In the spin-valve thin-film magnetic element shown in FIGS. 1 and 2, a sense current flows from the conductive layers 131 to the free magnetic layer 21, the nonmagnetic conductive layer 24, and the second pinned magnetic sublayer 25. When a magnetic field in the Y direction in FIGS. 1 and 2 is applied from a recording medium, the magnetization vector of the free magnetic layer 21 changes from the X1 direction to the Y direction in the drawings. Meanwhile, scattering of the spin-dependent conduction electrons, which will cause a change in electrical resistance, occurs at the interface between the free magnetic layer 21 and the nonmagnetic conductive layer 24 and at the interface between the nonmagnetic conductive layer 24 and the second pinned magnetic sublayer 25. The leakage magnetic field from the recording medium is detected as this change.

In the spin-valve thin-film magnetic element of the first embodiment, because the end portions 130C of the hard bias layers 130 facing the composite a3 are in direct contact with the end portions of the free magnetic layer 21, the free magnetic layer 21 and the hard bias layers 130 arranged at the two sides of the free magnetic layer 21 are magnetically coupled due to the exchange coupling (exchange interaction). As a consequence, generation of a demagnetizing field at the end portions of the free magnetic layer 21 may be prevented, and a strong bias magnetic field may be effectively applied to the free magnetic layer 21 from the hard bias layers 130. It is also possible to prevent the magnetization vectors in the two side portions of the free magnetic layer from being disordered due to the demagnetizing field (prevention of the buckling phenomenon). Moreover, the magnetic domains in the free magnetic layer 21 can be suitably controlled, thereby improving the stability of the output waveform at the two sides of the track width Tw. The exchange interaction between the free magnetic layer 21 and the hard bias layers 130 acts between the spinning magnetic atoms and is a significantly strong interaction which orients the magnetization vectors in parallel to each other. This strong interaction effectively removes the magnetic charges accumulated in the two side portions of the free magnetic layer 21, thereby inhibiting the generation of the demagnetizing field at the two side portions of the free magnetic layer 21. Moreover, since the bias underlayers 6 for controlling the crystal orientation of the hard bias layers are formed at the bottom of the hard bias layers 130, the crystal orientation of the hard bias layers 130 is satisfactory, the coercive force and the remanence ratio being sufficiently large. Thus, the intensity of the bias magnetic field required for putting the free magnetic layer 21 in a single-domain state may be sufficiently increased and generation of Barkhausen noise may be prevented.

Furthermore, since no demagnetizing field occurs in the two side portions of the free magnetic layer 21, the buckling phenomenon is inhibited even when the track width of the read head equipped with the spin-valve thin-film magnetic element is made narrower. Thus, the output waveform at the two ends of the track width Tw is prevented from becoming erroneous by the buckling phenomenon which would otherwise occur, and the instability of the overall read head may be reduced.

Also, even when the product of the remanence and the thickness of the hard bias layers 130 is reduced to a certain extent, the above-described exchange interaction prevents the demagnetizing field from occurring in the two side portions of the free magnetic layer 21, and the bias magnetic field from each hard bias layer 130 can be effectively applied to the free magnetic layer 21, thereby securing the stability of the output waveform at the two-ends of the track width Tw. In this respect, for example, the thickness of the hard bias layer 130 may be decreased so as to decrease the exchange bias magnetic field, and the region at the side portions of the composite a3, that is, the region with a lower read output, may be reduced so as to enlarge the region at the center portion exhibiting high read output, thereby improving the read output.

In the spin-valve thin-film magnetic element of the first embodiment, the bias underlayer is not provided between the free magnetic layer 21 and the hard bias layers 130. In other words, the end portions 130C of the hard bias layers 130 facing the composite a3 are in direct contact with the two side portions of the free magnetic layer 21. However, the end portions 130C of the hard bias layers 130 and the end portions of the free magnetic layer 21 are required to contact each other only partially. Thus, each of the bias underlayers 6 may comprise an extension 6e extending to the interface between the hard bias layer 130 to the free magnetic layer 21, as shown by dashed lines in FIG. 2.

In this spin-valve thin-film magnetic element, because each of the hard bias layers 130 is partially in contact with the free magnetic layer 21, the free magnetic layer 21 and the hard bias layers 130 are magnetically coupled due to the exchange interaction even when each of the bias underlayers 6 extends to the interface between the free magnetic layer 21 and the hard bias layer 130. Consequently, the magnetic charges accumulated in the two side portions of the free magnetic layer 21, which will be a cause of the demagnetizing field, are effectively removed by the above-described exchange interaction and generation of the demagnetizing field at the two side portions of the free magnetic layer 21 can be effectively inhibited. Although the efficiency of the bias magnetic field applied from the hard bias layers 130 to the free magnetic layer 21 is decreased compared to the spin-valve thin-film magnetic element comprising the bias underlayers 6 without portions extending to the interfaces between the free magnetic layer 21 and the hard bias layers 130, a strong bias magnetic field may still be suitably applied from the hard bias layers 130 to the free magnetic layer 21. Thus, the magnetization vectors in the two side portions of the free magnetic layer may be prevented from being disordered due to the demagnetizing field which would otherwise be generated at the two side portions of the free magnetic layer. The magnetic domains of the free magnetic layer 21 may be suitably controlled and the stability of the read waveform at the two sides of the track width Tw can be improved.

In this spin-valve thin-film magnetic element, the thickness of the extensions 6e of the bias underlayers 6 is preferably about 1 nm or less, and more preferably, about 0.5 nm or less.

When the thickness of the extensions 6e is about 1 nm or less, pinholes are readily formed in the bias under layer 6. The free magnetic layer 21 and the hard bias layers 130 are magnetically coupled through these pinholes in the extensions 6e of the bias underlayers 6. Accordingly, not only part of the free magnetic layer 21 and the hard bias layers 130 directly in contact with each other but also part of the free magnetic layer 21 and the portion hard bias layers 130 separated by the extensions 6e of the bias underlayers 6 are magnetically coupled. Moreover, since the region in which the exchange interaction acts is enlarged, the magnetic charges accumulated in the two side portions of the free magnetic layer 21 are effectively removed by the above-described exchange interaction, thereby inhibiting the demagnetizing field in the two side portions of the free magnetic layer 21. Thus, a strong bias magnetic field may be applied from each of the hard bias layers 130 to the free magnetic layer 21, inhibiting the magnetization vectors in the two side portions of the free magnetic layer 21 from being disordered due to the demagnetizing field which would otherwise occur at the two side portions of the free magnetic layer. As a result, the magnetic domains of the free magnetic layer 21 may be further satisfactorily controlled and the stability of the read waveform at the two ends of the track width Tw can be further improved.

In the spin-valve thin-film magnetic element of the first embodiment, the bias underlayer is not provided between the free magnetic layer 21 and the hard bias layers 130 located at the two sides of the free magnetic layer 21. In other words, the end portions 130C of the hard bias layers 130 are in direct contact with the composite a3. However, each of the bias underlayers 6 may extend to the interfaces between the free magnetic layer 21 and the hard bias layers 130. In this case, the thickness (in the track width direction) of extensions 6f of the bias underlayers 6 provided between the free magnetic layer 21 and the hard bias layers 130, is smaller than the thickness (in the height direction of the composite a3) of bottom portions 6g at the bottom of the hard bias layers 130.

In this spin-valve thin-film magnetic element, the extensions 6f are thinner than the bottom portions 6g of the hard bias layers. In this manner, pinholes are formed in the extension 6f of the bias underlayers 6 between the free magnetic layer 21 and each of the hard bias layers 130, and the free magnetic layer 21 and the hard bias layers 130 arranged at the sides of the free magnetic layer 21 are magnetically coupled through these pinholes in the extensions 6f by the exchange interaction. The magnetic charges accumulated in the two side portions of the free magnetic layer are effectively removed by the exchange interaction, inhibiting the generation of the demagnetizing field. The strong bias magnetic field can be suitably applied from the hard bias layers 130 to the free magnetic layer 21, and the magnetization vectors at the two side portions of the free magnetic layers are inhibited from being disordered due to the demagnetizing field which would otherwise occur. The magnetic domains in the free magnetic layer 21 may be suitably controlled and the stability of the output waveform at the two sides of the track width Tw can be improved.

In this spin-valve thin-film magnetic element, the thickness of the extensions 6f of the bias underlayers 6 is preferably about 1 nm or less, and more preferably, about 0.5 nm or less.

When the thickness of the extensions 6f of the bias underlayers 6 is about 1 nm or less, pinholes are readily formed in the portion 6f. The portions of the free magnetic layer 21 in contact with the extensions 6f and the hard bias layers 130 are magnetically coupled by the exchange interaction acting through these pinholes. As a result, in this spin-valve thin-film magnetic element, the magnetic charges accumulated in the two side portions of the free magnetic layer, which would generate demagnetizing field, are effectively removed by the exchange interaction. Thus, generation of the demagnetizing field at the two side portions of the free magnetic layer 21 is prevented, and a strong bias magnetic field from each of the hard bias layers 130 can be effectively applied to the free magnetic layer 21. The demagnetization vectors at the two side portions of the free magnetic layers can be prevented from being disordered due to the magnetization field which would otherwise occur, the domains of the free magnetic layer 21 can be further suitably controlled, and the stability of the read waveform at the two ends of the track width Tw may be further improved.

Next, a method for making a magnetoresistive thin-film magnetic element, as applied to a method for making the spin-valve thin-film magnetic element shown in FIGS. 1 and 2, is described with reference to FIGS. 4 to 8.

Figure 4:
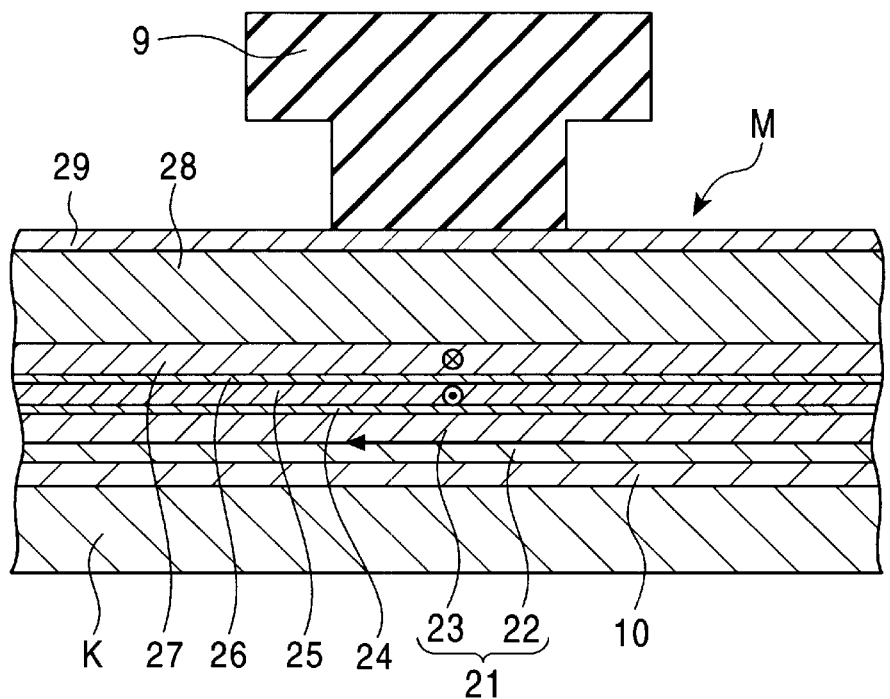
FIG. 4 is a cross-sectional view for explaining the forming of a lift-off resist layer on the composite formed on a substrate, according to a method for making the spin-valve thin-film magnetic element shown in FIG. 1.
Figure 5:
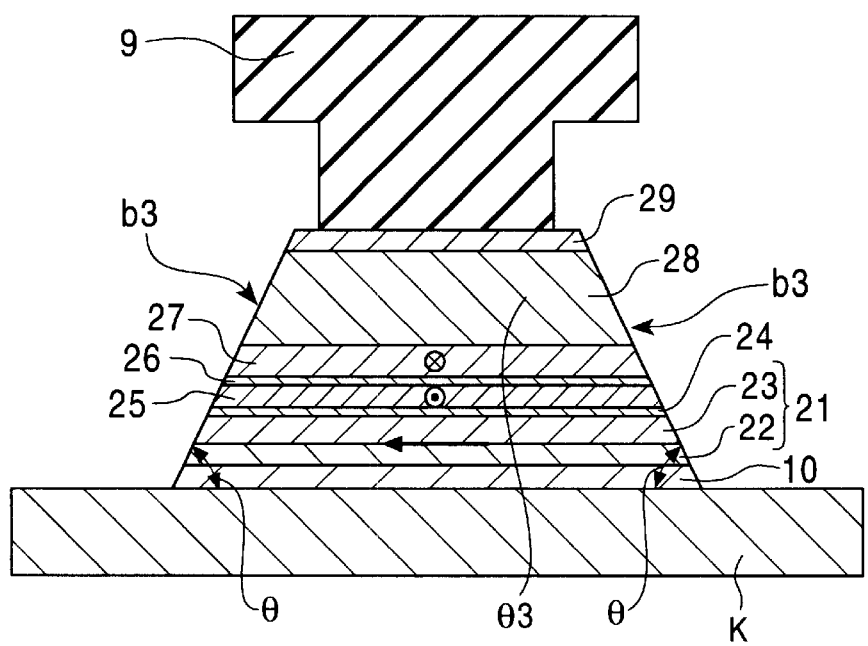
FIG. 5 is a cross-sectional view for explaining the forming of a trapezoidal composite in the method for making the spin valve thin-film magnetic element shown in FIG. 1.

First, as shown in FIG. 4, a composite layer M comprising the underlayer 10, the NiFe sublayer 22, the Co sublayer 23 (comprising the NiFe sublayer 22 and the Co sublayer 23), the nonmagnetic conductive layer 24, the second pinned magnetic sublayer 25, the nonmagnetic interlayer 26, the first pinned magnetic sublayer 27, the antiferromagnetic layer 28, and the protective layer 29 deposited in that order, is formed on a substrate K. The composite layer M will be used as the composite a3. After the composite layer M is formed, a lift-off resist layer 9 is formed on the composite layer M. An area not covered by the lift-off resist layer 9 is removed by means of ion milling so as to form sloped side surfaces b3 of the composite a3 having the shape of an isosceles trapezoid, as shown in FIG. 5.

When the composite a3 is formed, a slope angle θ at the each side surface b3 is preferably about 30 degrees or more. In this manner, when the hard bias layers 130 are formed at the two sides of the composite a3 in the subsequent step, the thickness of the end portions 130C of the hard bias layers 130 can be increased, and the end portions 130C not provided with the bias underlayer 6 underneath, are minimized. As a consequence, the volume of the end portions 130C having a low coercive force can be decreased, thereby reducing the Barkhausen jump (BHJ) to 15 percent or less. More preferably, the slope angle θ is about 45 degrees or more to reduce the BHJ to about 10 percent or less. Most preferably, the slope angle θ is about 60 degrees or more to reduce the BHJ to about 5 percent or less.

In this method, the lift-off resist layer 9 is preferably formed by a bilevel resist method, an image reverse method, or the like.

Figure 6:
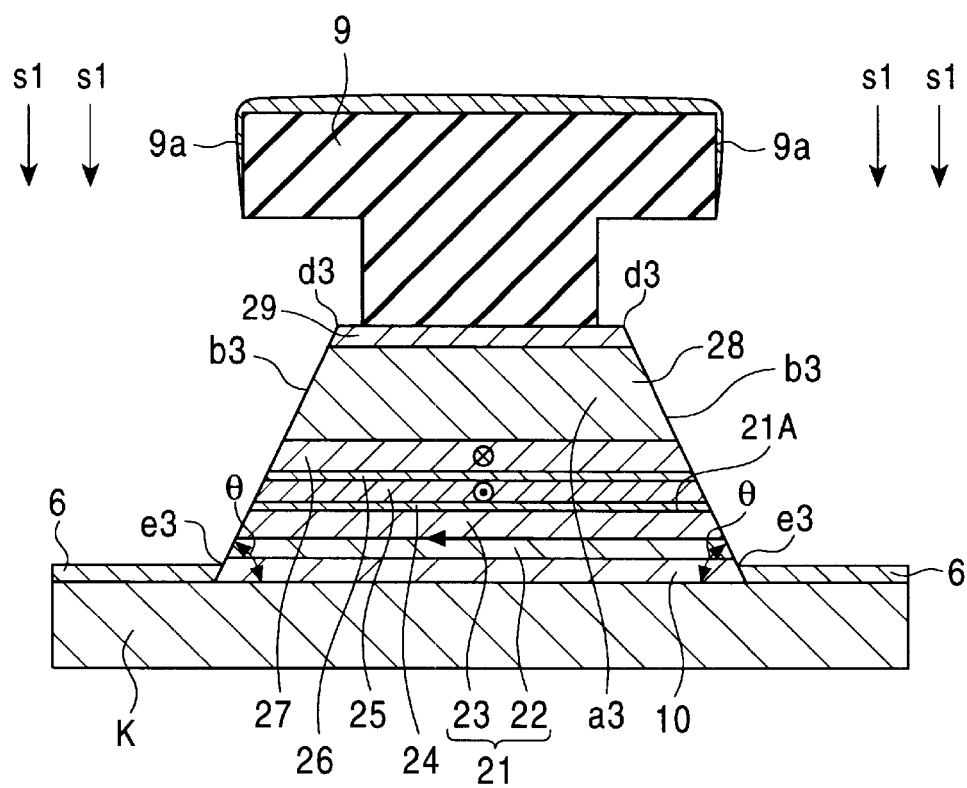
FIG. 6 is a cross-sectional view for explaining the forming of bias underlayers in the method for making the spin valve thin-film magnetic element shown in FIG. 1.

Next, as shown in FIG. 6, the bias underlayers 6 are formed on the substrate K at the position corresponding to the bottom of the hard bias layers 130 which will be formed later. Here, the upper surfaces of the bias underlayers 6 are positioned at the level lower (closer to the substrate K) than the lower surface of the free magnetic layer 21.

The bias underlayers 6 may be formed by a sputtering method or the like. In order to form the bias underlayers 6, a target (first target) is preferably arranged to oppose the substrate K in a substantially parallel manner. Preferably, the sputtered particles have a narrow incident angle distribution and high linearity.

As shown in FIG. 6, the bias underlayers 6 are formed by those sputtered particles not blocked by the lift-off resist layer 9. When the sputtered particles have a narrow incident angle distribution and high linearity, fewer sputtered particles s1 reach the areas right below edges 9a of the lift-off resist layer 9.

In this manner, the sputtered particles s1 can be deposited on the upper surface of the substrate K located at the two sides of the composite a3 without substantially accumulating the sputtered particles s1 on the side surfaces b3 of the composite a3.

The upper surfaces of the bias under layers 6 contact the side surfaces b3 of the composite a3 at contact points e3. The position of the contact points e3 is defined by the position of the edges 9a of the lift-off resist layer 9 and by the incident angle distribution and the linearity of the sputtered particles.

Preferably, the bias underlayers 6 are formed by one of, or combination of, an ion beam sputtering method, a long-throw sputtering method, and a collimation sputtering method.

Figure 7:
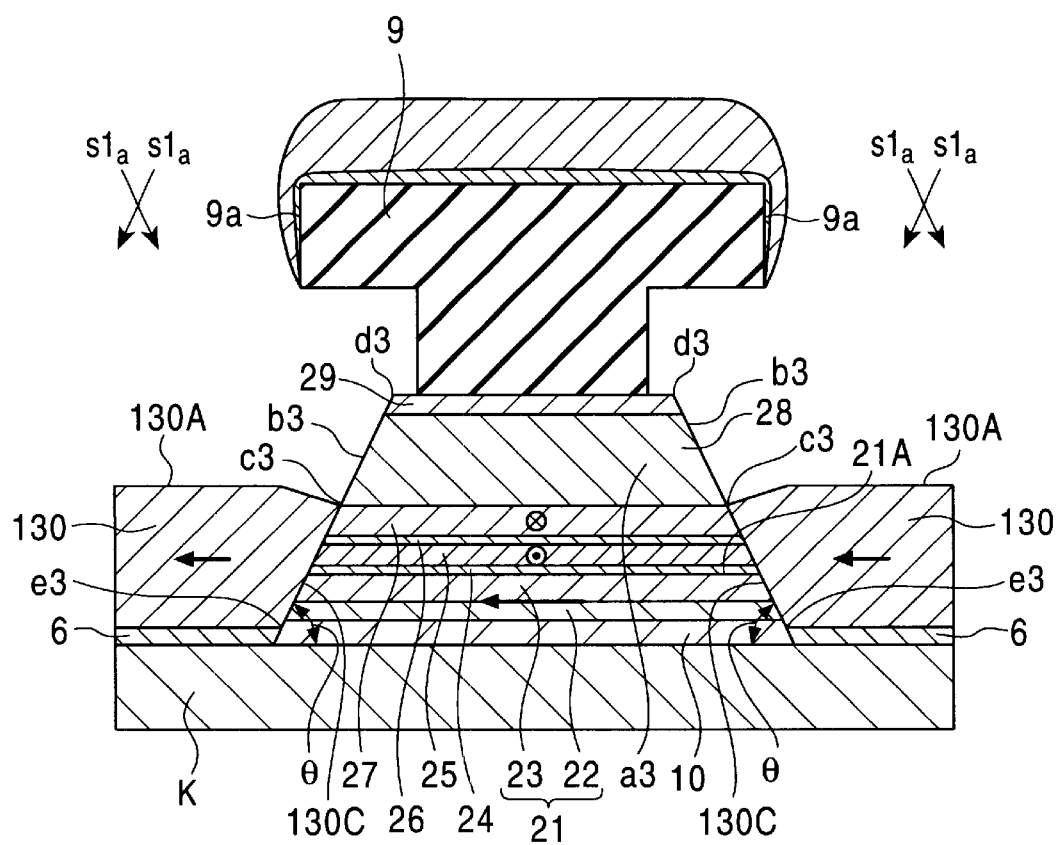
FIG. 7 is a cross-sectional view for explaining the forming of hard bias layers in the method for making the spin valve thin-film magnetic element shown in FIG. 1.

The hard bias layers 130 are then formed on the bias underlayers 6 at the two sides of the composite a3. As shown in FIG. 7, the hard bias layers 130 are arranged so that at least part of each of the hard bias layers 130 is positioned at the same level as the level of the free magnetic layer 21. The upper surfaces 130A of the hard bias layers 130 are positioned at a level lower than the top ends d3 of the side surfaces b3 of the composite a3 and are in contact with the side surfaces b3 of the composite a3.

The thickness of the hard bias layer 130 is preferably larger than the thickness of the free magnetic layer 21 in the layer thickness direction. The upper surfaces 130A of the hard bias layers 130 are preferably positioned at a level higher than an upper surface 21A of the free magnetic layer 21. The lower surface of the hard bias layer 130 is preferably positioned at the level lower than the lower surface of the free magnetic layer 21. The end portions 130C of the hard bias layers 130 are in direct contact with the side surfaces b3 of the composite a3 (the two side portions of the free magnetic layer 21).

The contact points c3 are positioned at a level lower than the top ends d3 of the side surfaces b3 of the composite a3 and at a level lower than the highest level of the hard bias layers 130.

In order to form, on the bias underlayers 6, the hard bias layers 130 which are parallel to the free magnetic layer 21 and are in contact with the two sides of the free magnetic layer 21 through end portions 130C by a sputtering method, a target (second target) is arranged to oppose the substrate K so that an angle defined by the second target and the substrate K is larger than the angle defined by the first target and the substrate K during the step of forming the bias underlayers. Preferably, the sputtered particles s1a have a wider incident angle distribution compared to that during the step of forming the bias underlayers, and high linearity.

The hard bias layers 130, as shown in FIG. 7, are formed by those sputtered particles s1a not blocked by the lift-off resist layer 9. When the sputtered particles s1a have a wider incident angle distribution and high linearity, an adequate number of the sputtered particles s1a reaches the area right beneath the edges 9a of the lift-off resist layer 9.

The contact points c3 are positioned at a level lower than the highest level of the hard bias layers 130. The contact points c3 are also positioned at a level lower than the top ends d3 of the side surfaces b3 of the composite a3. The end portions 130C of the hard bias layers 130 are in direct contact with the side surfaces b3 (especially the two sides of the free magnetic layer 21) of the composite a3.

The position of the contact points c3 is defined by the positions of the edges 9a of the lift-off resist layer 9 and by the incident angle distribution and linearity of the sputtered particles.

Because the bias underlayers 6 are composed of a nonmagnetic metal having a body-centered cubic structure which yields a satisfactory crystal orientation in the hard bias layers 130, the hard bias layers 130 formed on such bias underlayers 6 exhibit a superior crystal orientation and a significantly increased coercive force and remanence ratio.

Preferably, the hard bias layers 130 may be formed by one of, or combination of, an ion beam sputtering method, a long-throw sputtering method, and a collimation sputtering method.

Figure 8:
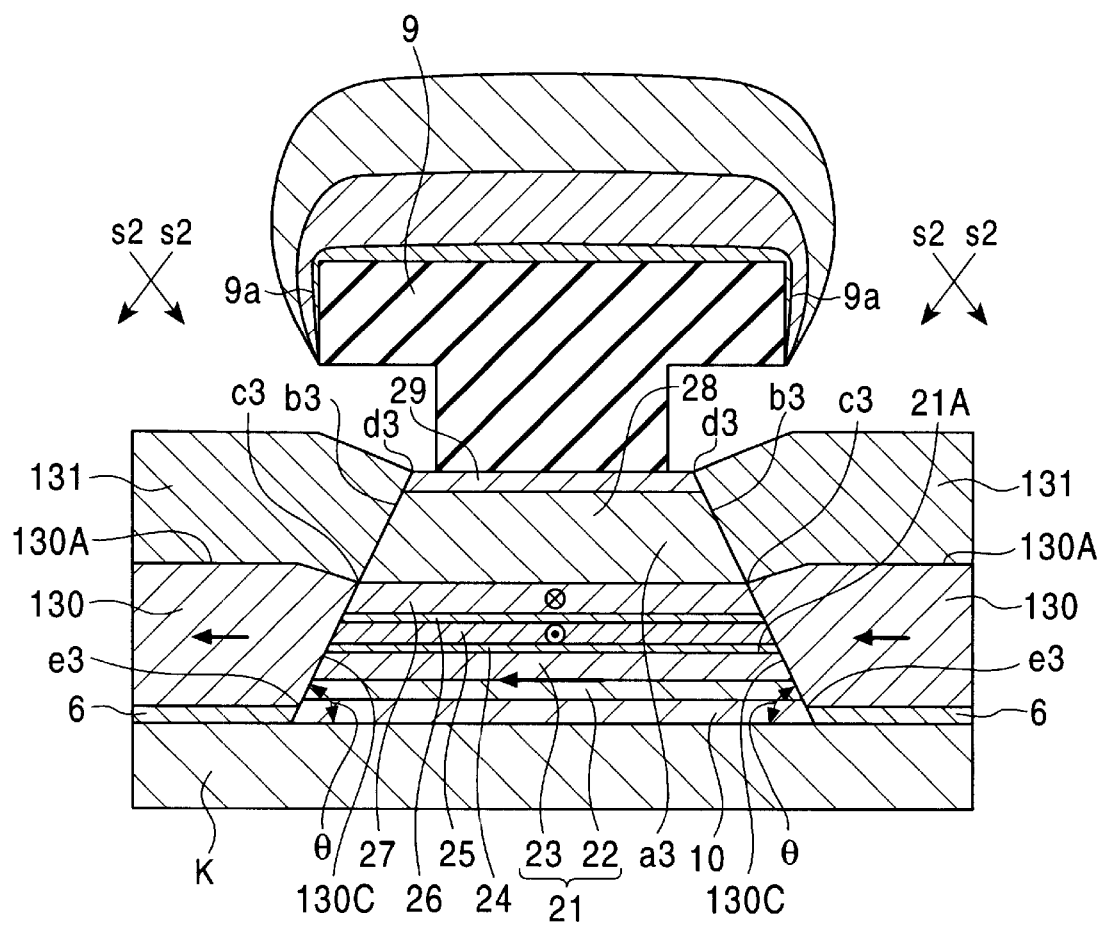
FIG. 8 is a cross-sectional view for explaining the forming of conductive layers in the method for making the spin valve thin-film magnetic element shown in FIG. 1.

The conductive layers 131 are then formed on the hard bias layers 130 so as to be connected with the side surfaces b3 of the composite a3, as shown in FIG. 8.

In order to form the conductive layers 131 in contact with the side surfaces b3 of the composite a3 by a sputtering method, a target (third target) is arranged to oppose the substrate K so that an angle defined by the third target and the substrate K is larger than the angle defined by the second target and the substrate K during the step of forming the hard bias layers. As the sputtering method, an ion beam sputtering method, a long-throw sputtering method, and a collimation sputtering method, alone or in combination may be employed. A conventional sputtering method having a relatively wide incident angle distribution can also be employed.

The conductive layers 131, as shown in FIG. 8, are formed by those sputtered particles s2 not blocked by the lift-off resist layer 9. When the sputtering is performed while setting the angle defined by the third target and the substrate K larger than the angle defined by the second target and the substrate K during the preceding step of forming the hard bias layers, in other words, when the sputtered particles s2 have a wider incident angle distribution compared to the preceding step of forming the hard bias layers, an increased number of sputter particles s2 reaches the area right below the edges 9a of the lift-off resist layer 9, forming the conductive layers 131 in contact with the side surfaces b3 of the composite a3.

Finally, the lift-off resist layer 9 is removed to complete the spin-valve thin-film magnetic element shown in FIGS. 1 and 2.

It should be noted here that when a spin-valve thin-film magnetic element comprising the extensions 6e extending to the interfaces between the hard bias layers 130 and the free magnetic layer 21 is fabricated, the angle defined by the first target and the substrate K is adjusted (typically, increased) during the step of forming the bias underlayers, so as to form the bias underlayers 6 on parts of the side surfaces b3 (the parts corresponding to the two side portions of the free magnetic layer 21) and on the substrate K at two sides of the composite a3. The rest of the process is the same.

Furthermore, in making the spin-valve thin-film magnetic element comprising the bias underlayers 6 comprising the bottom portions 6g at the bottom of the hard bias layers 130 and the extensions 6f extending to the interfaces between the free magnetic layer 21 and the hard bias layers 130, the thickness of the extensions 6f being smaller then the thickness of the bottom portions 6g, the angle defined by the first target and the substrate K is adjusted (typically further increased) during the step of forming the bias underlayers in order to form the bias underlayers 6 on the substrate K at the two sides of the composite a3 and on the two side surfaces of the composite a3 (covering the two sides of the free magnetic layer 21). The rest of the process is the same.

Second Embodiment

Figure 9:
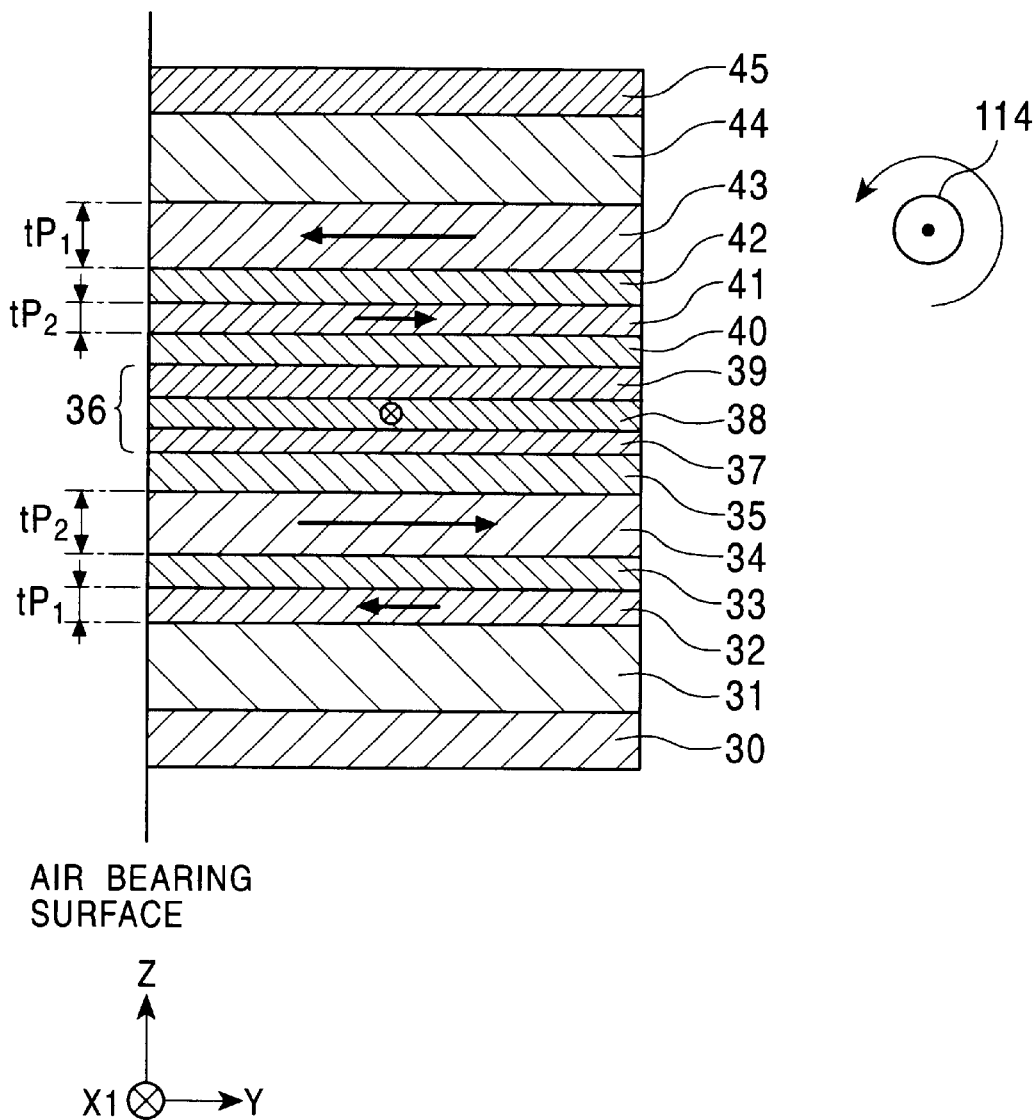
FIG. 9 represents a schematic cross-sectional view illustrating a spin-valve thin-film magnetic element of a second embodiment.
Figure 10:
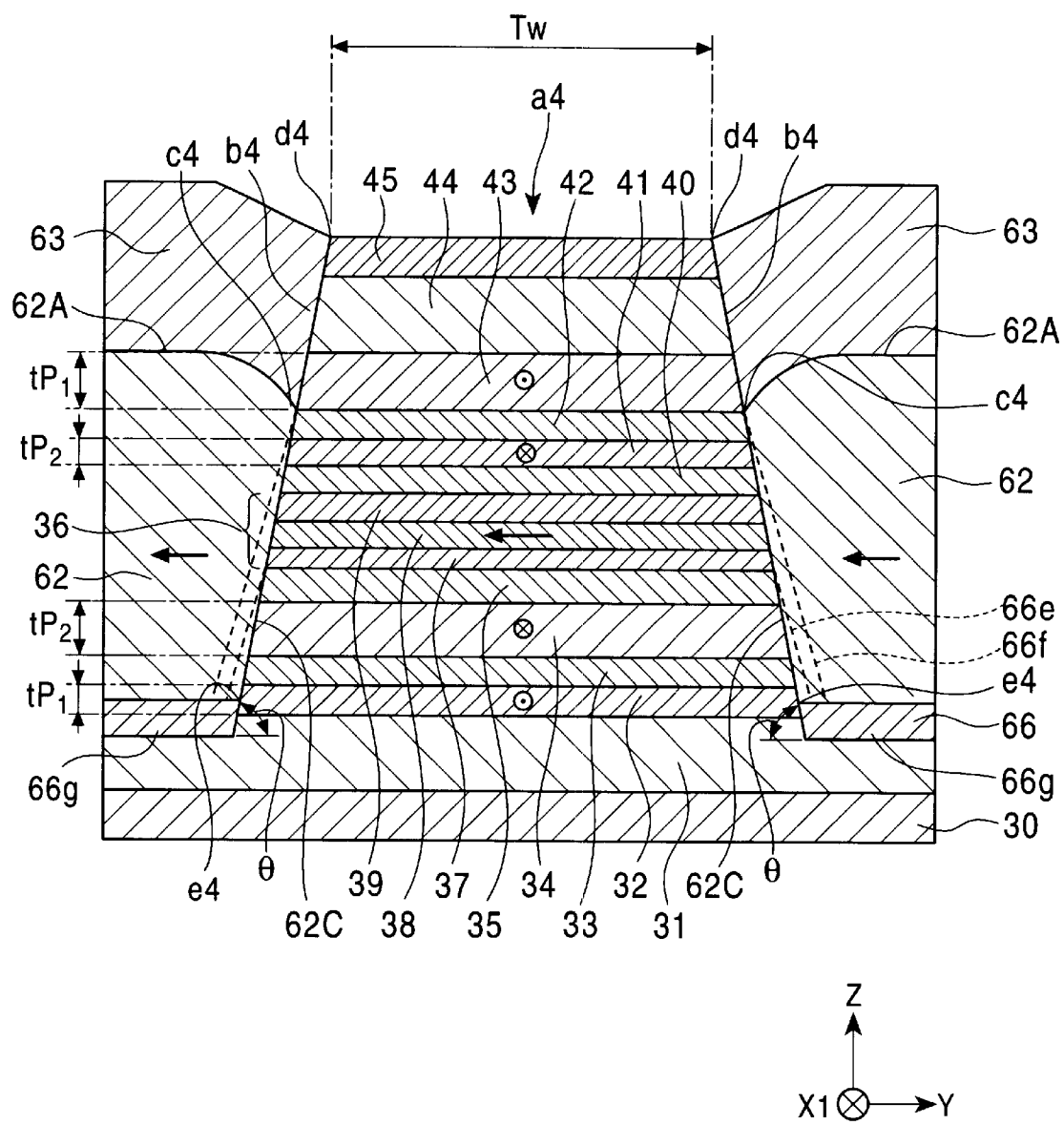
FIG. 10 represents a cross-sectional view illustrating the spin-valve thin-film magnetic element shown in FIG. 9 viewed from the face opposing a recording medium.

FIG. 9 represents a cross-sectional view schematically showing a spin-valve thin-film magnetic element according to a second embodiment. FIG. 10 represents a cross-sectional view of the spin-valve thin-film magnetic element shown in FIG. 9 when viewed from the side opposing a recording medium.

The spin-valve thin-film magnetic element of the second embodiment is in which a nonmagnetic conductive layer, a pinned magnetic layer, and an antiferromagnetic layer are deposited on each of the top and bottom surfaces of a free magnetic layer.

In this dual spin-valve thin-film magnetic element, a relatively large rate of change in resistance $\Delta R/R$ may be achieved compared to the single spin-valve thin-film magnetic element, meeting the demand for higher recording density.

The spin-valve thin-film magnetic element of the second embodiment shown in FIGS. 9 and 10 comprises, from the bottom, an underlayer 30, a lower antiferromagnetic layer 31, a lower first pinned magnetic sublayer 32, a lower nonmagnetic interlayer 33, a lower second pinned magnetic sublayer 34, a nonmagnetic conductive layer 35, a free magnetic layer 36 (comprising Co sublayers 37 and 39, and a NiFe alloy sublayer 38), a nonmagnetic conductive layer 40, an upper second pinned magnetic sublayer 41, an upper nonmagnetic interlayer 42, an upper first pinned magnetic sublayer 43, an upper antiferromagnetic layer 44, and a protective layer 45, deposited in that order.

As shown in FIG. 10, two sides of a composite a4 comprising layers from the underlayer 30 to the protective layer 45 are removed to form side surfaces b4. The lower portion of the lower antiferromagnetic layer 31 of the composite a4 and the underlayer 30 provided under the lower antiferromagnetic layer 31 extend beyond the lower antiferromagnetic layer 31, the lower first pinned magnetic sublayer 32, and the lower nonmagnetic interlayer 33.

Hard bias layers 62 are formed on the lower antiferromagnetic layer 31 at the two sides of the composite a4, and a conductive layer 63 is formed on each of the hard bias layers 62. Bias underlayers 66 for controlling the crystal orientation of the hard bias layers 62 are provided at the bottom of the hard bias layers 62. The bias underlayers 66 are composed of the same nonmagnetic metallic material having a body-centered structure used for forming the bias underlayers 6 in the first embodiment. In the second embodiment, the hard bias layers 62 are composed of a Co—Pt alloy, a Co—Cr—Pt alloy, or the like. The hard bias layers 62 are magnetized in the X1 direction in the drawings and orient the magnetization vector of the free magnetic layer 36 in the X1 direction in the drawings.

The conductive layers 63 are formed of, for example, Cr, Ta, Au, or the like.

In the spin-valve thin-film magnetic element of the second embodiment, the lower antiferromagnetic layer 31 and the upper antiferromagnetic layer 44 are preferably made of a PtMn alloy. The PtMn alloy exhibits superior wear resistance, has a high blocking temperature, and generates an increased exchange coupling magnetic field (exchange anisotropic magnetic field), compared to a NiMn alloy or an FeMn alloy, which are conventionally used as the material for the antiferromagnetic layer.

The PtMn alloy may be replaced with an X—Mn alloy or an X'—Pt—Mn alloy, wherein X is one element selected from the group consisting of Pd, Ru, Ir, Rh, and Os and X' is at least one element selected from the group consisting of Pd, Ru, Ir, Rh, Os, Au, Ag, Ne, Ar, Xe, and Kr.

Preferably, the lower nonmagnetic interlayer 33 arranged between the lower first pinned magnetic sublayer 32 and the lower second pinned magnetic sublayer 34, and the upper nonmagnetic interlayer 42 arranged between the upper first pinned magnetic sublayer 43 and the upper second pinned magnetic sublayer 41 shown in FIGS. 9 and 10 comprise at least one element selected from the group consisting of Ru, Rh, Ir, Cr, Re, and Cu.

The hard bias layers 62 are positioned so that at least part of each hard bias layer 62 is positioned at the same level as the free magnetic layer 36. The thickness of each hard bias layer 62 is larger than the thickness of the free magnetic layer 36. Upper surfaces 62A of the hard bias layers 62 are positioned at a level higher than the upper surface of the free magnetic layer 36. The lower surfaces of the hard bias layers 62 are positioned at a level lower than the lower surface of the free magnetic layer 36. End portions 62C of the hard bias layers 62 are in direct contact with the side surfaces b4 of the composite a4 (the two side portions of the free magnetic layer 36).

Contact points c4, where the upper surfaces 62A of the hard bias layers 62 and the side surfaces b4 of the composite a4 meet, are preferably positioned at a level lower than top ends d4 of the side surfaces b4 of the composite a4 and lower than the highest level of the hard bias layer 62.

Preferably, the conductive layers 63 are formed on the hard bias layers 62 so as to be in contact with the side surfaces b4 of the composite a4.

The slope angle θ of each side portion of the composite a4 sandwiched by the hard bias layers 62 is about 30 degrees or more. In this manner, the thickness of the end portions 62C of the hard bias layers 62 facing the composite a4 can be increased. As the thickness of the end portions 62C increases, the end portions 62C without the bias underlayers 66 are minimized. In other words, the end portions 62C facing the composite a4 and having disordered crystal orientations are decreased. As a consequence, the volume of the portions with a reduced coercive force, i.e., the volume of the end portions 62C of the hard bias layer 62 facing the composite a4, is decreased, thus reducing Barkhausen jump (BHJ) to about 15% or less. Preferably, the slope angle θ is about 45 degrees or more to reduce the BHJ to about 10% or less and, more preferably, the slope angle θ is about 60 degrees or more to reduce the BHJ to about 5% or less.

As shown in FIGS. 9 and 10, the thickness $tP_1$ of the lower first pinned magnetic sublayer 32 is smaller than the thickness $tP_2$ of the lower second pinned magnetic sublayer 34 formed above the lower first pinned magnetic sublayer 32 and separated from the second pinned magnetic sublayer 34 by the lower nonmagnetic interlayer 33. The thickness $tP_1$ of the upper first pinned magnetic sublayer 43 is larger than the thickness $tP_2$ of the upper second pinned magnetic sublayer 41 separated from the upper first pinned magnetic sublayer 43 by the upper nonmagnetic interlayer 42. The lower first pinned magnetic sublayer 32 and the upper first pinned magnetic sublayer 43 are magnetized in the direction opposite to the Y direction in the drawings and the lower second pinned magnetic sublayer 34 and the upper second pinned magnetic sublayer 41 are magnetized in the Y direction in the drawings.

In the spin-valve thin-film magnetic element of the first embodiment shown in FIGS. 1 and 2, the thickness of the first pinned magnetic layer and the thickness of the second pinned magnetic layer are optimized so as to yield magnetic moments $Ms \cdot tP_1$ and $Ms \cdot tP_2$ different from each other. The magnetization vector of the first pinned magnetic layer can be either in the Y direction in the drawings or in the direction opposite to the Y direction in the drawings.

In the dual spin-valve thin-film magnetic element of the second embodiment shown in FIGS. 9 and 10, however, the magnetization vectors of the lower first pinned magnetic sublayer 32 and the upper first pinned magnetic sublayer 43 are required to be in the same direction. In this respect, the magnetic moment $Ms \cdot tP_1$ of the lower first pinned magnetic sublayer 32 and the upper first pinned magnetic sublayer 43 and the magnetic moment $Ms \cdot tP_2$ of the lower second pinned magnetic sublayer 34 and the upper second pinned magnetic sublayer 41 are adjusted, and the direction and the magnitude of the magnetic field applied during annealing are optimized so as to make the dual spin-valve thin-film magnetic element having satisfactory performance.

Here, the lower first pinned magnetic sublayer 32 and the upper first pinned magnetic sublayer 43 are magnetized in the same direction in order to orient the magnetization vectors of the lower second pinned magnetic sublayer 34 and the upper second pinned magnetic sublayer 41 in the same direction, i.e., opposite to the magnetization vectors of the lower first pinned magnetic sublayer 32 and the upper first pinned magnetic sublayer 43.

As described above, the rate of change in resistance (ΔR/R) is defined by the relationship between the pinned magnetization vector of the pinned magnetized layer and the variable magnetization vector of the free magnetic layer. In the second embodiment where a pinned magnetic layer is divided into the first and the second pinned magnetic sublayers, the second pinned magnetic layer primarily determines the rate of change in resistance (ΔR/R). The first pinned magnetic layer plays a secondary role, helping to pin the magnetization vector of the second pinned magnetic layer in a predetermined direction.

If the magnetization vectors of the lower second pinned magnetic sublayer 34 and the upper second pinned magnetic sublayer 41 shown in FIGS. 9 and 10 are pinned antiparallel to each other, the resistance may be increased in relation to the pinned magnetization vector of the upper second pinned magnetic sublayer 41 and the variable magnetization vector of the free magnetic layer 36 on one hand, but on other hand, the resistance may be significantly decreased in relation to the pinned magnetization vector of the lower second pinned magnetic sublayer 34 and the variable magnetization vector of the free magnetic layer 36. As a result, ΔR/R of the dual spin-valve thin-film magnetic element is decreased compared to that of the single spin-valve thin-film magnetic element shown in FIGS. 1 and 2.

The above problem is not peculiar to the dual spin-valve type thin-film magnetic element in which the pinned magnetic layer is divided into two sublayers by the nonmagnetic interlayer therebetween. The pinned magnetic layers formed above and below the free magnetic layer of any dual spin-valve thin-film magnetic element are required to be oriented in the same direction in order to increase the rate of change in resistance ΔR/R and achieve high output.

In the second embodiment, as shown in FIGS. 9 and 10, the magnetic moment $Ms \cdot tP_2$ of the lower second pinned magnetic sublayer 34 is larger than the magnetic moment $Ms \cdot tP_1$ of the lower first pinned magnetic sublayer 32. The magnetization vector of the lower second pinned magnetic sublayer 34 having the larger $Ms \cdot tP_2$ is pinned in the Y direction in the drawings. The direction of the combined magnetic moment, i.e., the total of $Ms \cdot tP_2$ of the lower second pinned magnetic sublayer 34 and $Ms \cdot tP_1$ of the lower first pinned magnetic sublayer 32, is defined by the direction of the magnetic moment of the lower second pinned magnetic sublayer 34 having the larger $Ms \cdot tP_2$ and is therefore pinned in the Y direction in the drawings.

In contrast, as for the pinned magnetic layer formed above the free magnetic layer 36, $Ms \cdot tP_1$ of the upper first pinned magnetic sublayer 43 is larger than $Ms \cdot tP_2$ of the upper second pinned magnetic sublayer 41. The magnetization vector of the upper first pinned magnetic sublayer 43 having the larger $Ms \cdot tP_1$ is pinned in the direction opposite to the Y direction in the drawings. The direction of the combined magnetic moment, i.e., the total of $Ms \cdot tP_1$ of the upper first pinned magnetic sublayer 43 and $Ms \cdot tP_2$ of the upper second pinned magnetic sublayer 41, is defined by the direction of the magnetic moment of the upper first pinned magnetic sublayer 43 having the larger $Ms \cdot tP_1$ and is therefore pinned in the direction opposite to the Y direction in the drawings.

As is apparent from the above, in the dual spin-valve thin-film magnetic element shown in FIGS. 9 and 10, the direction of the combined magnetic moment above the free magnetic layer 36 obtained by adding the $Ms \cdot tP_1$ of the first pinned magnetic layer and $Ms \cdot tP_2$ of the second pinned magnetic layer and the direction of the combined magnetic moment at the lower side of the free magnetic layer 36 are opposite to each other. Accordingly, the combined magnetic moment in the Y direction in the drawings generated below the free magnetic layer 36 and the combined magnetic moment in the direction opposite to the Y direction in the drawings generated above the free magnetic layer 36 form a magnetic field rotating counterclockwise in the drawings.

Consequently, because of the magnetic field generated by the above-described combined magnetic moments, magnetization vectors of the lower first pinned magnetic sublayer 32 and the lower second pinned magnetic sublayer 34 and the magnetization vectors of the upper first pinned magnetic sublayer 43 and upper second pinned magnetic sublayer 41 can be further stably maintained in a ferri-magnetic state.

A sense current 114 primarily flows into the nonmagnetic conductive layer 35 and the nonmagnetic conductive layer 40, both having a relatively low specific resistance. When the sense current 114 flows, a magnetic field is generated according to the right-handed screw rule. When the sense current 114 flows in the direction shown in FIG. 9, the direction of the magnetic field generated by the sense current 114 flowing in the lower first pinned magnetic sublayer 32, the lower nonmagnetic interlayer 33, and lower second pinned magnetic sublayer 34 becomes the same as the direction of the combined magnetic moment of the lower first pinned magnetic sublayer 32, the lower nonmagnetic interlayer 33, and the lower second pinned magnetic sublayer 34. Moreover, the direction of the magnetic field generated by the sense current flowing in the upper first pinned magnetic sublayer 43, the upper nonmagnetic interlayer 42, and the upper second pinned magnetic sublayer 41 becomes the same as the direction of the combined magnetic moment of the upper first pinned magnetic sublayer 43, the upper nonmagnetic interlayer 42, and the upper second pinned magnetic sublayer 41.

The major advantages of making the direction of the magnetic field generated by the sense current the same as the direction of the combined magnetic moments are as follows. First, thermal stability of the above-described pinned magnetic layers can be improved. Also, a significantly large sense current can flow, thereby improving the read output.

These advantages are achieved because the combined magnetic moments in the pinned magnetic layers formed in the lower and upper sides of the free magnetic layer 36 rotate counterclockwise.

Generally, the ambient temperature inside the device such as a hard disk device and Joule heating due to the sense current in the element elevate the temperature of the element. The temperature of the element locally reaches a maximum temperature of about 200° C. (about 473K) The temperature of the element is expected to be further elevated henceforth as the rotation rate of the recording medium increases and as the Joule heating increases due to an increased sense current. The increase in the temperature of the element will result in the degradation of the exchange coupling magnetic field. However, in the second embodiment, the magnetic field generated by the combined magnetic moment and the magnetic field generated by the sense current contribute to maintain the magnetization vectors of the lower first pinned magnetic sublayer 32 and the lower second pinned magnetic sublayer 34 and the magnetization vectors of the upper first pinned magnetic sublayer 43 and the upper second pinned magnetic sublayer 41 in a thermally stable ferri-magnetic state.

Alternatively, in the second embodiment, below free magnetic layer 36, the magnetic moment $Ms \cdot tP_1$ of the lower first pinned magnetic sublayer 32 may be adjusted to be larger than the magnetic moment $Ms \cdot tP_2$ of the lower second pinned magnetic sublayer 34. Above the free magnetic layer 36, the magnetic moment $Ms \cdot tP_1$ of the upper first pinned magnetic sublayer 43 may be adjusted to be smaller than the magnetic moment $Ms \cdot tP_2$ of the upper second pinned magnetic sublayer 41.

In this case also, by applying a magnetic field of about 400 kA/m (about 5 kOe) or more in a direction corresponding to a desired magnetic vector of the lower and upper first pinned magnetic sublayers 32 and 43, i.e., in the Y direction or the direction opposite to the Y direction, the lower and upper second pinned magnetic sublayers 34 and 41 are pinned in one direction. Moreover, a magnetic field is generated by the combined magnetic moments rotating clockwise or counterclockwise.

As is apparent from the above, in the spin-valve thin-film magnetic elements of the first and second embodiments, the magnetization vectors in the pinned magnetic layers are thermally stable because each of the pinned magnetic layers is divided into the first pinned magnetic sublayer and the second pinned magnetic sublayer by the nonmagnetic interlayer therebetween and the magnetization vectors of the first and second pinned magnetic sublayers are antiparallel to each other (in a ferri-magnetic state) due to the exchange coupling magnetic field generated between these layers (RKKY interaction).

Especially in these embodiments, thermal stability of the magnetization state of the first and second pinned magnetic field can be further improved by using one of a PtMn alloy, an X—Mn alloy, and an X'—Pt—Mn alloy as the material for the antiferromagnetic layers. These alloys exhibit a high blocking temperature and generate a strong exchange coupling magnetic field (exchange anisotropic magnetic field) at the interface with the first pinned magnetic layer.

In these embodiments, by adjusting the Ms·tP$_1$ of the first pinned magnetic layer and Ms·tP$_2$ of the second pinned magnetic layer to be different from each other and by optimizing the magnitude and the direction of the applied magnetic field during the thermal treatment, the first (and second) pinned magnetic sublayer(s) may be magnetized in a desired direction.

Especially in the spin-valve thin-film magnetic element of the second embodiment shown in FIGS. 9 and 10, Ms·tP$_1$ of the lower first pinned magnetic sublayer 32 and the upper first pinned magnetic sublayer 43 and Ms·tP$_2$ of the lower second pinned magnetic sublayer 34 and the upper second pinned magnetic sublayer 41 are optimized and the direction and the magnitude of the magnetic field applied during the thermal treatment are adequately controlled so as to pin the magnetization vectors of the lower second pinned magnetic sublayer 34 and the upper second pinned magnetic sublayer 41 in one direction. The lower second pinned magnetic sublayer 34 and the upper second pinned magnetic sublayer 41 affect the rate of change in resistance ($\Delta R/R$). Also, in this manner, the combined magnetic moment generated above the free magnetic layer 36 and that generated at the lower side of the free magnetic layer 36 are antiparallel to each other. Accordingly, thermal stability of the magnetization in the pinned magnetic layers may be further improved due to the presence of the magnetic field generated by the combined magnetic moment and the magnetic field generated by the sense current.

In the spin-valve thin-film magnetic element of the second embodiment, the end portions 62C of the hard bias layers 62 are in direct contact with the two side portions of the free magnetic layer 36. Thus, the free magnetic layer 36 and the hard bias layers 62 arranged at the sides of the free magnetic layer 36 are magnetically coupled due to the exchange coupling (exchange interaction). As a consequence, the demagnetizing field is inhibited from occurring at the two side portions of the free magnetic layer 36, and a strong bias magnetic field may be effectively applied from the hard bias layers 62 to the free magnetic layer 36. The magnetization vectors in the two side portions of the free magnetic layer 36 are prevented from being disordered due to the demagnetizing field which would otherwise be generated at the two side portions of the free magnetic layer (prevention of the buckling phenomenon), thereby satisfactorily controlling the magnetic vectors in the free magnetic layer 36. The stability of the output waveform at the two end portions of the track width Tw can also be improved.

Since no demagnetizing field is generated at the two side portions of the free magnetic layer 36 as described above, the buckling phenomenon may be prevented even when the track width of the read head equipped with this spin-valve thin-film magnetic element is made narrower. The errors in the read waveform at the two end portions of the track width Tw caused by the buckling phenomenon may be prevented, and the stability of the output waveform may be improved for the read head as a whole.

Moreover, even when the product of the remanence and the layer thickness of the hard bias layers 62 is decreased to a certain extent, no demagnetizing field is generated at the two side portions of the free magnetic layer 36 due to the exchange interaction described above. A bias magnetic field may be effectively applied to the free magnetic layer 36 from the hard bias layers 62, and the stability of the read waveforms at the two ends of the track width Tw can be improved.

Moreover, for example, the thickness of the hard bias layers 62 may be decreased so as to weaken the exchange bias magnetic field. In this manner, the regions with lower read output located at the side of the composite a4 are minimized and the region with high read output located at the center is enlarged, thereby improving the overall read output.

It should be noted that in the spin-valve thin-film magnetic element of the second embodiment, no bias underlayer is provided between the free magnetic layer 36 and the hard bias layers 62 arranged at the two sides of the composite a4. In other words, the end portions 62C of the hard bias layers 62 are in direct contact with the two side portions of the free magnetic layer 36. However, the end portions 62C of the hard bias layer 62 and the side portions of the free magnetic layer 36 are required to be in direct contact only partly. Accordingly, the bias underlayers 66 may comprise extensions 66e shown by dotted lines in FIG. 10 extending to the interfaces between the free magnetic layer 36 and the hard bias layers 62.

In this type of spin-valve thin-film magnetic element, the free magnetic layer 36 and each of the hard bias layers 62 are at least partly in direct contact with each other even when the bias underlayers 66 extend to the interfaces between the free magnetic layer 36 and the hard bias layers 62. Thus, the free magnetic layer 36 and the hard bias layers 62 are magnetically coupled due to an exchange interaction, effectively removing the magnetic charges, which are the cause of the demagnetizing field, accumulated at the two side portions of the free magnetic layer 36. As a consequence, no demagnetizing field is generated at the two side portions of the free magnetic layer 36. Furthermore, while the efficiency of applying the bias magnetic field from the hard bias layers 62 to the free magnetic layer 36 is reduced compared to the element without extensions of the bias underlayers 66, a strong bias magnetic field may be satisfactorily applied to the free magnetic layer 36 from the hard bias layers 62. Consequently, the magnetization vectors at the two side portions of the free magnetic layer may be prevented from becoming disordered due to the demagnetizing field which would otherwise be generated in the two side portions of the free magnetic layer. The magnetic domains in the free magnetic layer 36 may be satisfactorily controlled, and the stability of the output waveform at the two end portions of the track width Tw can be improved.

Also in this type of spin-valve thin-film magnetic element, the thickness of the extension 66e of each bias underlayer 66 is preferably about 1 nm or less, and more preferably, about 0.5 nm or less.

In the second embodiment, no bias underlayer is provided between the free magnetic layer 36 and the hard bias layers 62 arranged at the two sides of the free magnetic layer 36. In other words, the end portions 62C of the hard bias layers 62 facing the composite a4 are in direct contact with the two side portions of the free magnetic layer 36. Alternatively, the bias underlayers 66 may be formed at the interfaces of the free magnetic layer 36 and the hard bias layers 62. In such a case, the thickness (in the track width direction) of extensions 66f of the bias underlayers 66 at the interface between the free magnetic layer 36 and the hard bias layer 62 is smaller than the thickness (in the height direction of the composite a4) of bottom portions 66g provided at the bottom of the hard bias layers 62.

In this spin-valve thin-film magnetic element, the extensions 66f of the bias underlayers 66 at the interfaces between the free magnetic layer 36 and each of the hard bias layers 62 is thinner than the portions 66g of the hard bias layers at the bottom. In this manner, pinholes are formed in the extensions 66f of the bias underlayers 66 and the free magnetic layer 36 and the hard bias layers 62 are magnetically coupled through these pinholes. As a result, magnetic charges accumulated in the two side portions of the free magnetic layer, the cause of the demagnetizing field, may be effectively removed, and generation of the demagnetizing field at the two side portions of the free magnetic layer 36 may be prevented. A strong bias magnetic field may be properly applied to the free magnetic layer 36 from the hard bias layers 62. Thus, the magnetization vectors in the two side portions of the free magnetic layers are prevented from being disordered by the demagnetizing field which would otherwise occur in the two side portions of the free magnetic layer, and the magnetic domains of the free magnetic layer 36 can be properly controlled. The stability of the output waveform at the two end portions of the track width Tw can also be improved. Moreover, the portions provided with the bias underlayer desirably exhibit a high coercive force and a high remanence ratio.

In this spin-valve thin-film magnetic element, the thickness of the portion 66f of the bias underlayer 66 at the interface between the free magnetic layer 36 and the hard bias layer 62 is preferably about 1 nm or less, and more preferably, about 0.5 nm or less.

Next, a method for making the spin-valve thin-film magnetic element of the second embodiment will be explained.

First, a composite layer comprising the underlayer 30, the lower antiferromagnetic layer 31, the lower first pinned magnetic sublayer 32, the lower nonmagnetic interlayer 33, the lower second pinned magnetic sublayer 34, the nonmagnetic conductive layer 35, the free magnetic layer 36 (comprising a Co sublayers 37 and 39 and a NiFe sublayer 38), the nonmagnetic conductive layer 40, the upper second pinned magnetic sublayer 41, the upper nonmagnetic interlayer 42, the upper first pinned magnetic sublayer 43, the upper antiferromagnetic layer 44, and the protective layer 45, deposited in that order, are formed on a substrate. On the resulting composite layer, a lift-off resist layer is formed as in the method of the first embodiment. The part not covered by the lift-off resist is removed by means of ion milling so as to form the sloped side surfaces b4 of the composite a4 substantially having the shape of an isosceles trapezoid.

Next, the bias underlayers 66 extending outward from the two sides of the composite a4 are formed on the lower antiferromagnetic layer 31. Here, the upper surfaces of the bias underlayers 66 are positioned at a level lower than the lower surface of the free magnetic layer 36.

The hard bias layers 62 are then formed on the upper surfaces of the bias underlayers 66 at the two sides of the composite a4 so that at least part of each of the hard bias layers 62 is positioned at the same level as the free magnetic layer. At this time, the upper surfaces 62A of the hard bias layers 62 are positioned at a level lower than the top ends d4 of the side surfaces b4 of the composite a4 and are formed to be in contact with the side surfaces b4 of the composite a4.

Preferably, the thickness of the hard bias layers 62 is larger than the thickness of the free magnetic layer 36. Moreover, the upper surfaces 62A of the hard bias layers 62 are positioned at a level higher than the upper surface of the free magnetic layer 36, and the lower surface of the hard bias layer 62 is positioned at a level lower than the lower surface of the free magnetic layer 36. The end portions 62C of the hard bias layers 62 are in direct contact with the side surfaces b4 of the composite a4 (the two side portions of the free magnetic layer 36).

Preferably, the contact points c4, where the upper surfaces 62A of the hard bias layers 62 and the side surfaces b4 of the composite a4 meet, are positioned at a level lower than the top ends d4 of the side surfaces b4 of the composite a4 and lower than the highest level of the hard bias layers 62.

The conductive layers 63 are then formed on the hard bias layers 62 so as to contact the side surfaces b4 of the composite a4.

Finally, the lift-off resist layer is removed to complete the spin-valve thin-film magnetic element shown in FIGS. 9 and 10.

It should be noted here that when making a spin-valve thin-film magnetic element having the extensions 66e formed at the interfaces between the free magnetic layer 36 and the hard bias layers 62, the angle defined by substrate and a first target is adjusted (typically increased) during the step of forming the bias underlayers so as to form the bias underlayers 66 on the lower antiferromagnetic layer 31 at the two sides of the composite a4 as well as on part of the side surfaces b4 of the composite a4 (part of the two side portions of the free magnetic layer 36). The rest of the process is the same.

When making the spin-valve thin-film magnetic element having the bias underlayers 66 comprising the extensions 66f extending to the interfaces between the free magnetic layer 36 and the hard bias layers 62 and the bottom portions 66g at the bottom of the hard bias layers 62, the extensions 66f being thinner than the bottom portions 66g, the angle defined by the first target and the substrate is adjusted (typically further increased) during the step of forming the bias underlayers 66 on the lower antiferromagnetic layer 31 at the two sides of the composite a4 and at the two side surfaces of the composite a4 (the two side portions of the free magnetic layer). The rest of the process is the same.

Third Embodiment

Figure 11:
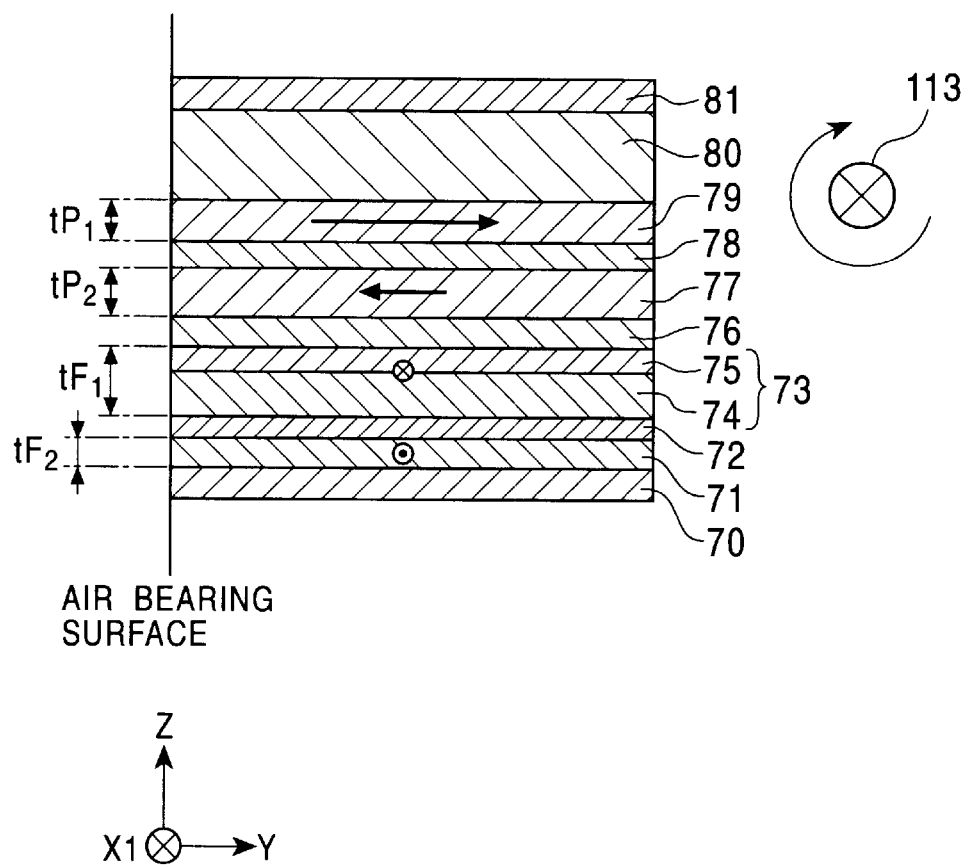
FIG. 11 represents a schematic cross-sectional view illustrating a spin-valve thin-film magnetic element according to a third embodiment.
Figure 12:
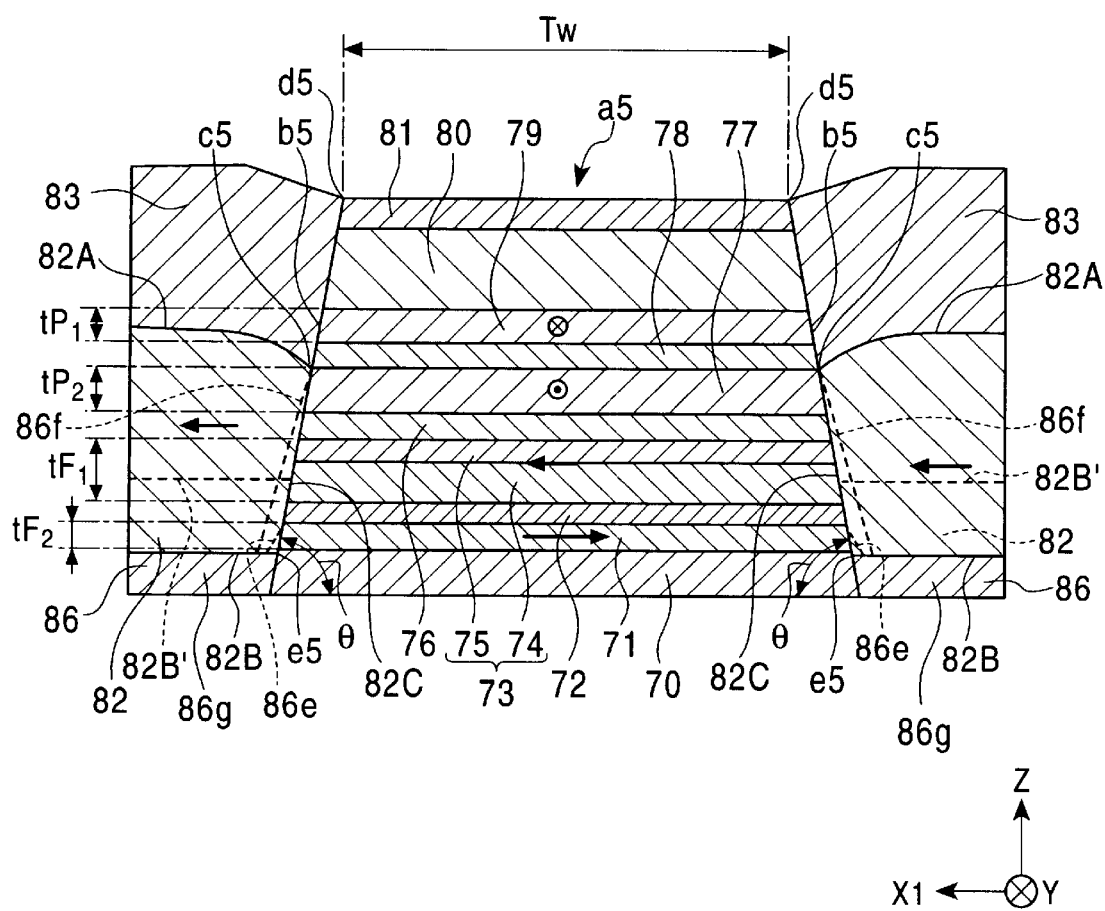
FIG. 12 represents a cross-sectional view illustrating the spin-valve thin-film magnetic element shown in FIG. 11 viewed from the face opposing a recording medium.

FIG. 11 represents a cross-sectional view schematically showing a third embodiment of a spin-valve thin-film magnetic element. FIG. 12 represents a cross-sectional view of the spin-valve thin-film magnetic element shown in FIG. 11 viewed from the face opposing a recording medium.

In the spin-valve thin-film magnetic element of the third embodiment, a magnetic recording medium such as a hard disk moves in the Z direction in the drawings, and the direction of a leakage magnetic field from the magnetic recording medium is the Y direction in the drawings.

In the spin-valve thin-film magnetic element of the third embodiment, not only a pinned magnetic layer but also a free magnetic layer is divided into two sublayers, i.e., a first free magnetic sublayer and a second free magnetic sublayer, by a nonmagnetic interlayer therebetween.

As shown in FIGS. 11 and 12, the spin-valve thin-film magnetic element of the third embodiment is formed on a substrate (not shown) and comprises, from the bottom, an underlayer 70, a second free magnetic sublayer 71, a nonmagnetic interlayer 72, a first free magnetic sublayer 73, a nonmagnetic conductive layer 76, a second pinned magnetic sublayer 77, a nonmagnetic interlayer 78, a first pinned magnetic sublayer 79, an antiferromagnetic layer 80, and a protective layer 81, deposited in that order.

In the spin-valve thin-film magnetic element of the third embodiment, the underlayer 70 and the protective layer 81 are composed of, for example, Ta or the like.

Preferably, the antiferromagnetic layer 80 is composed of a PtMn alloy, as in the spin-valve thin-film magnetic element of the first embodiment. The PtMn alloy may be replaced with an X—Mn alloy or an X'—Pt—Mn alloy, wherein X is one element selected from the group consisting of Pd, Ru, Ir, Rh, and Os, and X' is at least one element selected from the group consisting of Pd, Ru, Ir, Rh, Os, Au, Ag, Ne, Ar, Xe, and Kr.

The first pinned magnetic sublayer 79 and the second pinned magnetic sublayer 77 are composed of elemental cobalt (Co), a NiFe alloy, a CoFe alloy, a CoNiFe alloy, or the like.

The nonmagnetic interlayer 78 is preferably composed of at least one element selected from the group consisting of Ru, Rh, Ir, Cr, Re, and Cu.

The nonmagnetic conductive layer 76 is composed of Cu or the like.

The magnetization vectors of the first pinned magnetic sublayer 79 and the second pinned magnetic sublayer 77 are antiparallel to each other, i.e., in a ferri-magnetic state. The magnetization vector of the first pinned magnetic sublayer 79 is, for example, pinned in the Y direction in the drawings whereas the magnetization vector of the second pinned magnetic sublayer 77 is pinned in the direction opposite to the Y direction in the drawings. A significantly large exchange coupling magnetic field is required in order to stably maintain the ferri-magnetic state. The following arrangements are made in this embodiment in order to yield a significantly large exchange coupling magnetic field.

The nonmagnetic interlayer 72 is formed on the second free magnetic sublayer 71, as shown in FIGS. 11 and 12. The second free magnetic sublayer 71 is composed of, for example, a NiFe alloy, a CoFe alloy, a CoNiFe alloy, or the like.

The first free magnetic sublayer 73 is formed on the nonmagnetic interlayer 72. The nonmagnetic conductive layer 76 is formed on the first free magnetic sublayer 73.

As shown in FIGS. 11 and 12, the first free magnetic sublayer 73 comprises a NiFe sublayer 74 and a Co sublayer 75, the Co sublayer 75 being in contact with the nonmagnetic conductive layer 76. The nonmagnetic conductive layer 76 is adjacent to the nonmagnetic conductive layer 76 so as to increase the rate of change in resistance ΔR/R and to prevent diffusion to/from the nonmagnetic conductive layer 76.

A composite a5 comprising layers from the underlayer 70 to the protective layer 81 shown in FIGS. 11 and 12 has the shape of a trapezoid. Hard bias layers 82 are formed at the two sides of the composite a5. A conductive layer 83 is formed on each of the hard bias layers 82. A bias underlayer 86 for controlling the crystal orientation of the hard bias layer 82 is formed at the bottom of each of the hard bias layers 82. The hard bias layers 82 are composed of a Co—Pt alloy, Co—Cr—Pt alloy, or the like. Because the hard bias layers 82 are magnetized in the X1 direction in the drawings, the first free magnetic sublayer 73 is magnetized in the X1 direction in the drawings.

The conductive layers 83 are composed of Cr, Ta, Au, etc.

The bias underlayer 86 is composed of a nonmagnetic metal having a body-centered structure, the same material which constitutes the bias under layers 6 of the first embodiment.

The hard bias layers 82 are formed so that at least part of each of the hard bias layers 82 is positioned at the same level as the first free magnetic sublayer 73. The thickness of the hard bias layers 82 are larger than the thickness of the first free magnetic sublayer 73. Upper surfaces 82A of the hard bias layers 82 are positioned at the level higher than the upper surface of the first free magnetic sublayer 73. The lower surfaces of the hard bias layers 82 are positioned at the level lower than the lower surface of the first free magnetic sublayer 73. End portions 82C of the hard bias layer 82 facing are in direct contact with side surfaces b5 of the composite a5 (i.e., the respective two end portions of the first and second free magnetic layers 73 and 71 and the nonmagnetic interlayer 72).

Preferably, contact points c5 where the upper surfaces 82A of the hard bias layers 82 and the side surfaces b5 of the composite a5 meet are positioned at the level lower than top ends d5 of the side surfaces b5 of the composite a5 and lower than the highest level of the hard bias layers 82.

Preferably, the conductive layers 83 are formed on the hard bias layer 82 so as to be in contact with the side surfaces b5 of the composite a5.

The slope angle θ of each side portion of the composite a5 sandwiched by the hard bias layers 82 is more than about 30 degrees. In this manner, the end portion 82C of the hard bias layer 82 facing the composite a5, i.e., the portion without the bias underlayer 86, may be reduced. In other words, the end portion 82C having a disordered crystal orientation can be minimized. Consequently, the volume of the end portion 82C of the bias underlayer 86 facing the composite a5, i.e., the portion having a low coercive force, can be reduced, and Barkhausen jump (BHJ) can be desirably decreased to about 15% or less. Preferably, the slope angle θ is about 45 degrees or more to reduce the BHS to about 10% or less, and more preferably, the slope angle θ is about 60 degrees or more to reduce the BHS to about 5% or less.

As shown in FIGS. 11 and 12, the nonmagnetic interlayer 72 is provided between the first free magnetic sublayer 73 and the second free magnetic sublayer 71. An exchange coupling magnetic field (RKKY interaction) generated between the first free magnetic sublayer 73 and the second free magnetic sublayer 71 puts the magnetization vectors in the first free magnetic sublayer 73 and the second free magnetic sublayer 71 in an antiparallel state (a ferromagnetic state).

In the spin-valve thin-film magnetic element of the third embodiment shown in FIGS. 11 and 12, the thickness $tF_1$ of the first free magnetic sublayer 73 is larger than the thickness $tF_2$ of the second free magnetic sublayer 71.

Accordingly, the magnetic moment $Ms·tF_1$ of the first free magnetic sublayer 73 is larger than the magnetic moment $Ms·tF_2$ of the second free magnetic sublayer 71. When there is a bias magnetic field in the X1 direction in the drawings from the hard bias layers 82, the first free magnetic sublayer 73 having the larger $Ms·tF_1$ is magnetized in the X1 direction in the drawings due to this bias magnetic field. The exchange coupling magnetic field with the first free magnetic sublayer 73 (RKKY interaction) orients the magnetization vector of the second free magnetic sublayer 71 having the smaller $Ms·tF_2$ in the direction opposite to the X1 direction in the drawings. In the third embodiment, alternatively, the thickness $tF_1$ of the first free magnetic sublayer 73 may be set to be smaller than the thickness $tF_2$ of the second free magnetic sublayer 71, and $Ms·tF_1$ of the first free magnetic sublayer 73 may be set to be smaller than the $Ms·tF_2$ of the second free magnetic sublayer 71.

When there is an external magnetic field from the Y direction in the drawings, the magnetization vectors of the first free magnetic sublayer 73 and the second free magnetic sublayer 71 rotate while maintaining the ferri-magnetic state. Electrical resistance then changes in relation to the magnetization vector of the first free magnetic sublayer 73, which contributes to the rate of change in resistance ΔR/R, and the pinned magnetization vector of the second pinned magnetic sublayer 77, detecting the external magnetic field.

Preferably, in the third embodiment, the nonmagnetic interlayer 72 provided between the first free magnetic sublayer 73 and the second free magnetic sublayer 71 is composed of at least one element selected from the group consisting of Ru, Rh, Ir, Cr, Re, and Cu.

In the case where the magnetic moment $Ms \cdot tF_1$ of the first free magnetic sublayer 73 is set to be greater than the magnetic moment $Ms \cdot tF_2$ of the second free magnetic sublayer 71, either the thickness of the bias underlayer 86 is increased or a base layer is employed so that lower surfaces 82B of the hard bias layers 82 contact the side surfaces of the composite a5 at a position between the upper surface and the lower surface of the first free magnetic sublayer 73, as shown by a dotted line 82B'. In this manner, only the first free magnetic sublayer 73 directly contacts the hard bias layers 82 at the side surfaces of the composite a5, and the second free magnetic sublayer 71 does not directly contact the hard bias layers 82. Since the magnetization vector of the second free magnetic sublayer 71 is the opposite to the magnetization vector of the hard bias layer 82, the magnetization vectors at the two end portions of the second free magnetic sublayer 71 become disordered when the second free magnetic sublayer 71 is in direct contact with the hard bias layers 82, thereby disturbing the magnetization vectors at the two side portions of the first free magnetic sublayer 73.

The magnetization vectors of the first free magnetic sublayer 73 can be aligned by bringing the lower surfaces of the hard bias layer 82 up to the level indicated by the dotted line 82B'. The first free magnetic sublayer 73 can be readily put into a single-magnetic-domain state, and the magnetic domains in the first free magnetic sublayer 73 can be further satisfactorily controlled. Moreover, the read waveform at the two sides of the track width Tw may be prevented from being disordered, and the stability of the read waveform can be improved.

Preferably, the lower surfaces 82B of the hard bias layers 82 are connected to the side surfaces of the composite a5 at a position which is the half the thickness of the first free magnetic sublayer 73, as indicated by the dotted line 82B'.

In this manner, the magnetization vectors at the two end portions of the first free magnetic sublayer 73 are prevented from being disordered by a frustration between the magnetization vectors of the second free magnetic sublayer 71 and the hard bias layer 82. A strong bias magnetic field can be easily applied to the first free magnetic sublayer 73, and the first free magnetic sublayer 73 can be readily put into a single-magnetic-domain state. The stability of the read waveform can also be improved.

By setting the absolute value of the combined magnetic moment of the first free magnetic sublayer 73 and the second free magnetic sublayer 71 is larger than the absolute value of the combined magnetic moment of the second pinned magnetic sublayer 77 and the first pinned magnetic sublayer 79, the magnetization vectors of the first free magnetic sublayer 73 and the second free magnetic sublayer 71 are prevented from being affected by the combined magnetic moment of the second pinned magnetic sublayer 77 and the first pinned magnetic sublayer 79, and the symmetricalness of the waveforms is prevented from degrading. Thus, the magnetic vectors of the second free magnetic sublayer 71 and the first free magnetic sublayer 73 rotate in response to the external magnetic field with high sensitivity, thereby improving output.

In the spin-valve thin-film magnetic element of the third embodiment, the end portions 82C of the hard bias layers 82 are in direct contact with the two sides of the first free magnetic sublayer 73. In this manner, the first free magnetic sublayer 73 and the hard bias layers 82 adjacent to the first free magnetic sublayer 73 are magnetically coupled due to the exchange coupling (exchange interaction), thereby preventing the generation of the demagnetizing field at the two side portions of the first free magnetic sublayer 73. Consequently, a strong bias magnetic field from the hard bias layers 82 can be effectively applied to the first free magnetic sublayer 73, the magnetization vectors at the two side portions of the free magnetic layer is prevented from being disordered by the demagnetizing field which would otherwise occur at the two side portions of the free magnetic layer (prevention of the buckling phenomenon). The magnetic domains of the first free magnetic sublayer 73 and the second free magnetic sublayer 71 may be suitably controlled, and the stability of the read waveform at the two ends of the track width Tw may be improved.

Because no demagnetizing field is generated at the two end portions of the first free magnetic sublayer 73 and the second free magnetic sublayer 71, respectively, the buckling phenomenon may be prevented even when the track width of the read head equipped with this spin-valve thin-film magnetic element is made narrower. The read waveform are stable at the two ends of the track width Tw, improving the stability of the read head as a whole.

Even when the product of the remanence ratio and the layer thickness of the hard bias layers 82 is decreased to a certain extent, the exchange interaction prevents the demagnetization at the two side portions of the first free magnetic sublayer 73 and the second free magnetic sublayer 71. Thus, a bias magnetic field from each of the hard bias layers 82 can be effectively applied to the first free magnetic sublayer 73, and the stability of the read waveform at the two ends of the track width Tw can be improved. The region having low read output located in the vicinity of the side surfaces of the composite a5 may be reduced, and the region having high read output located at the center may be enlarged, thereby improving the read output.

In the spin-valve thin-film magnetic element of the third embodiment, the bias underlayer is not provided at the interfaces between the first and second free magnetic sublayers 73 and 71 and the hard bias layers 82 adjacent to these layers. In other words, the end portions 82C of the hard bias layers 82 are in direct contact with the two sides of the first free magnetic sublayer 73 and the second free magnetic sublayer 71. The end portion 82C and the sides of the first free magnetic sublayer 73, however, are required to be in direct contact only partly. The bias underlayers 86 may comprise extensions 86e shown by dotted lines in FIG. 12 extending to the interfaces between the second free magnetic sublayer 71 and the hard bias layers 82.

In this type of spin-valve thin-film magnetic element, the hard bias layers 82 and the first free magnetic sublayer 73 are partly in contact with each other even when the bias underlayers 86 extend to the interfaces between the hard bias layers 82 and the second free magnetic sublayer 71. As a result, the first free magnetic sublayer 73 and the hard bias layer 82 adjacent to the first free magnetic sublayer 73 are magnetically coupled due to the exchange interaction, thereby effectively removing the cause of the demagnetizing field, i.e., the magnetic charges accumulated at the two side portions of the first free magnetic sublayer 73. The demagnetizing field is prevented at the two side portions of the first free magnetic sublayer 73, and a strong bias magnetic field can be satisfactorily applied to the first free magnetic sublayer 73 from the hard bias layers 82. The magnetization vectors at the two side portions of the free magnetic layer are prevented from being disordered by the demagnetizing field which would otherwise occur in the two side portions of the free magnetic layer. The magnetic domains of the first free magnetic sublayer 73 may be suitably controlled, and the stability of the read waveforms at the two sides of the track width Tw can be improved.

In this spin-valve thin-film magnetic element, the thickness of the extensions 86e of the bias under layers 86 is preferably about 1 nm or less, and more preferably, about 0.5 nm or less.

In the spin-valve thin-film magnetic element of the third embodiment, the bias underlayer is not provided at the interfaces between the first and second free magnetic layers 73 and 71 and the hard bias layers 82 adjacent to these layers. In other words, the end portions 82C of the hard bias layers 82 are in direct contact with the two sides of the first free magnetic sublayer 73 and the second free magnetic sublayer 71. The bias underlayers 86, however, may be provided between the first free magnetic sublayer 73 and the second free magnetic sublayer 71 and the hard bias layers 82. The thickness in the track width direction of portions 86f between the first free magnetic sublayer 73 and the second free magnetic sublayer 71 and the bias underlayers 86 is smaller than the thickness in the height direction of the composite a5 of bottom portions 86g at the bottom of the hard bias layers 82.

In this type of spin-valve thin-film magnetic element, because the thickness of the portion 86f is smaller than the thickness of the bottom portion 86g of the bias under layer 86, pinholes are formed in the 86f. The first free magnetic sublayer 73 and the hard bias layers 86 at the two sides thereof are magnetically coupled through these pinholes by an exchange interaction. As a result, the cause of the demagnetizing field, i.e., the magnetic charges accumulated at the two side portions of the free magnetic layer can be effectively removed, inhibiting the generation of the demagnetizing field in the two sides portions of the first and second free magnetic sublayers. A strong bias magnetic field may be satisfactorily applied to the free magnetic sublayer 73 from the hard bias layers 82, the disorder, caused by demagnetizing field, of the magnetization vectors at the two side portions of the free magnetic layer may be prevented, and the magnetic domains of the first and second free magnetic sublayers 73 and 71 are satisfactorily controlled. The stability of the output waveform at the two ends of the track width Tw may be improved.

Preferably, the thickness of the extensions 86f between the bias underlayers 86 and the first and second free magnetic sublayers is about 1 nm or less, and more preferably, about 0.5 nm or less.

Next, a method for making the spin-valve thin-film magnetic element of the third embodiment is described.

First, a composite layer comprising the underlayer 70, the second free magnetic sublayer 71, the nonmagnetic interlayer 72, the first free magnetic sublayer 73 (comprising a NiFe sublayer 74 and a Co layer 75), the nonmagnetic conductive layer 76, the second pinned magnetic sublayer 77, the nonmagnetic interlayer 78, the first pinned magnetic sublayer 79, the antiferromagnetic layer 80, the protective layer deposited in that order, is formed on a substrate. A lift-off resist layer is formed as in the first embodiment, and the areas not covered by the lift-off resist layer are removed by ion milling so as to form a composite a5 having a sloped surfaces b5 and the shape of an isosceles trapezoid.

The bias underlayers 86 are then formed on the substrate at the two sides of the composite a5. The upper surfaces of the bias underlayers 86 are positioned at a level lower than the lower surface of the second free magnetic sublayer 71.

The hard bias layers 82 are then formed on the bias underlayers 86 at the two sides of the composite a5, so that at least part of each hard bias layer 82 is positioned at the same level as the first and second free magnetic sublayer 73 and 71. Upper surfaces 82A come in contact with the side surfaces b5 of the composite a5 at the position lower than top ends d5 of the side surfaces b5.

The thickness of the hard bias layers 82 is preferably larger than the total thickness of the first and second free magnetic sublayers 73 and 71. The upper surfaces 82A of the hard bias layers 82 are positioned at a level higher than the upper surfaces of the first and second free magnetic sublayers 73 and 71. The lower surfaces of the hard bias layers 82 are positioned at a level lower than the lower surfaces of the first and second free magnetic sublayers 73 and 71. The end portions 82C of the hard bias layers 82 are in direct contact with the side surfaces b5 of the composite a5 (the sides of the first and second free magnetic sublayers 73 and 71).

Moreover, contact points c5 where the upper surfaces 82A and the side surfaces b5 of the composite a5 meet are positioned at a level lower than the lower surfaces of the first and second free magnetic sublayers 73 and 71. The end portions 82C are in direct contact with the side surfaces b5 of the composite 95 (the two sides of the first and second free magnetic sublayers 73 and 71).

Next, the conductive layers 83 are formed on the hard bias layers 82 so as to come into contact with the side surfaces b5 of the composite a5.

Finally, the lift-off resist layer is removed to complete the spin-valve thin-film magnetic element shown in FIGS. 11 and 12.

It should be noted here that when making a spin-valve thin-film magnetic element having the extensions 86e formed at the interfaces between the first and second free magnetic sublayers 73 and 71 and the hard bias layers 82, the angle defined by the substrate and a first target is adjusted (typically increased) during the step of forming the bias underlayers so as to form the bias underlayers 86 on the substrate at the two sides of the composite a5 and on part of each of the side surfaces b5 (part of two end portions of the second free magnetic sublayer 71). The rest of the process is the same.

When making the spin-valve thin-film magnetic element having the bias underlayers 66 comprising the extensions 86f extending to the interfaces between the first and second free magnetic sublayers 73 and 71 and the hard bias layers 82 and the bottom portions 66g at the bottom of the hard bias layers 62, the extensions 66f being thinner than the bottom portions 66g, the angle defined by the substrate and the first target is adjusted (typically further increased) during the step of forming the bias underlayers 86. The rest of the process is the same.

Fourth Embodiment

FIG. 13 represents a cross-sectional view illustrating a structure of a spin-valve thin-film magnetic element in accordance with a fourth embodiment, and FIG. 14 represents a cross-sectional view of this spin-valve thin-film magnetic element when viewed from a face opposing a recording medium.

This spin-valve thin-film magnetic element is of a dual type. That is, a nonmagnetic conductive layer, a pinned magnetic layer, and an antiferromagnetic layer are deposited on each face of a free magnetic layer. Each of the free magnetic layer and each pinned magnetic layer is divided into two sublayers (first and second sublayers) with a nonmagnetic interlayer provided therebetween.

The bottommost layer in FIGS. 13 and 14 is an underlayer 91 formed on a substrate not shown in the drawings. A lower antiferromagnetic layer 92, a first lower pinned magnetic sublayer 93, a lower nonmagnetic interlayer 94, a second lower pinned magnetic sublayer 95, a nonmagnetic conductive layer 96, a second free magnetic sublayer 97, a nonmagnetic interlayer 100, a first free magnetic sublayer 101, a nonmagnetic conductive layer 104, a second upper pinned magnetic sublayer 105, an upper nonmagnetic interlayer 106, a first upper pinned magnetic sublayer 107, an upper antiferromagnetic layer 108, and a protective layer 109 are deposited on the underlayer 91.

Materials for these layers are now described.

The lower antiferromagnetic layer 92 and the upper antiferromagnetic layer 108 are preferably formed of a PtMn alloy, as in the above-described spin-valve thin-film magnetic element according to the second embodiment. The PtMn alloy may be replaced with an X—Mn or X'—Pt—Mn alloy wherein X is one element selected from the group consisting of Pd, Ru, Ir, Rh, and Os, and X' is at least one element selected from the group consisting of Pd, Ru, Ir, Rh, Os, Au, Ag, Ne, Ar, Xe, and Kr.

The first lower pinned magnetic sublayer 93, first upper pinned magnetic sublayer 107, second lower pinned magnetic sublayer 95, and the second upper pinned magnetic sublayer 105 are formed of elemental cobalt, a NiFe alloy, a CoFe alloy, or a CoNiFe alloy.

The lower nonmagnetic interlayer 94, the upper nonmagnetic interlayer 106, and the nonmagnetic interlayer 100 are preferably formed of at least one element selected from the group consisting of Ru, Rh, Ir, Cr, Re, and Cu.

The nonmagnetic conductive layer 96 and the nonmagnetic conductive layer 104 are formed of Cu or the like.

As shown in FIGS. 13 and 14, each of the first free magnetic sublayer 101 and the second free magnetic sublayer 97 is divided into two sublayers. A first upper free magnetic sublayer 103 of the first free magnetic sublayer 101 is in contact with the nonmagnetic conductive layer 104, and a second lower free magnetic sublayer 98 of the second free magnetic sublayer 97 is in contact with the nonmagnetic conductive layer 96. The first upper free magnetic sublayer 103 and the second lower free magnetic sublayer 98 are formed of elemental cobalt (Co). A first lower free magnetic sublayer 102 on the nonmagnetic interlayer 100 and a second upper free magnetic sublayer 99 under the nonmagnetic interlayer 100 are formed of a NiFe alloy, a CoFe alloy, a CoNiFe alloy, or the like. Since the second lower free magnetic sublayer 98 and the first upper free magnetic sublayer 103 in contact with the nonmagnetic conductive layers 96 and 104, respectively, are formed of elemental cobalt (Co), a large rate of change in resistance ($\Delta R/R$,) is obtainable and diffusion from/to the nonmagnetic conductive layers 96 and 104 is prevented.

The composite a6 including from the underlayer 91 to the underlayer 91 is a trapezoid having side faces b6. In the composite a6, the bottom portion of the lower antiferromagnetic layer 92 and the entire underlayer 91 extend from two sides of the composite a6 outward. Hard bias layers 110 composed of, for example, a CoPt alloy or a CoCrPt alloy are formed on two sides of the lower antiferromagnetic layer 92. Conductive layers 111 composed of Cr, Ta, Au, or the like are formed on the hard bias layers 110. Moreover, bias underlayers 116 are formed under the hard bias layers 110 to control crystal orientation of the hard bias layers 110. The bias underlayers 116 are composed of a nonmagnetic metal having a body centered cubic structure, which is used in the bias underlayer 6 in the first embodiment.

The hard bias layers 110 are magnetized in a direction opposite to the X1 direction in the drawings so that the first free magnetic sublayer 101 is also magnetized in the direction opposite to the X1 direction.

The hard bias layers 110 are positioned so that at least part of each of the hard bias layers 110 is positioned at the same level as the level of the first free magnetic sublayer 101. The upper surfaces 110A of the hard bias layers 110 are more distant from the substrate than the upper surface of the first free magnetic sublayer 101, and the lower surfaces of the hard bias layers 110 are nearer to the substrate than the lower surface of the first free magnetic sublayer 101. Ends 110c of the hard bias layers 110 at the composite a6 side are in direct contact with the side faces b6 of the composite a6 including the first free magnetic sublayer 101, the second free magnetic sublayer 97, and the nonmagnetic interlayer 100. Preferably, the upper or lower surfaces of the hard bias layers 110 are at a level which lies between the thickness of one having a larger magnetic moment (Ms×thickness t) of the first free magnetic sublayer 101 and the second free magnetic sublayer 97 and is connected to the side faces of the composite a6. More preferably, the hard bias layers 110 are connected to the side faces of the composite a6 at a position which is the half the thickness of a free magnetic layer having a larger magnetic moment.

Preferably, contact points c6 of upper surfaces 110A of the hard bias layers 110 and the side faces b6 of the composite a6 are below top ends d6 of the side faces b6 of the composite a6 and below the highest position of the hard bias layers 110.

Preferably, the conductive layers 111 are formed on the hard bias layers 110 so as to come into contact with the side faces b6 of the composite a6.

Preferably, slope angles $\theta$ of the two side faces b6 of the composite 6a, which are sandwiched by the hard bias layers 110, are about 30 degrees or more so as to decrease portions, which are not in direct contact with the bias underlayers 116, of the ends 110C of the hard bias layers 110 (to decrease portions having disordered crystal orientations at the ends 110C in the hard bias layer 110s). As a consequence, the volume of the portions with reduced coercive force at the ends 110C of the hard bias layer 130 facing the composite a6 is decreased, reducing Barkhausen jump (BHJ) to about 15% or less. The slope angle $\theta$ is more preferably about 45 degrees or more to reduce the BHJ to about 10% or less and most preferably about 60 degrees or more to reduce the BHJ to about 5% or less.

In the fourth embodiment, the lower antiferromagnetic layer 92 and the upper antiferromagnetic layer 108 are composed of an antiferromagnetic material which is subjected to annealing to generate an exchange coupling magnetic field (exchange anisotropic magnetic field) at the interface with the first lower pinned magnetic sublayer 93 and the first upper pinned magnetic sublayer 107, respectively, as described in the first embodiment.

However, diffusion of metallic elements readily occurs at the interface between the lower antiferromagnetic layer 92 and the first lower pinned magnetic sublayer 93, which are provided below the free magnetic layers, so that the formation of a thermal diffusion layer and an initial growing layer having small saturation magnetization is facilitated. As a result, the magnetic thickness of the first lower pinned magnetic sublayer 93 is smaller than the designed thickness $tP_1$ thereof.

Thus, it is preferable that the thickness $tP_1$ of the first lower pinned magnetic sublayer 93 below the free magnetic layers be larger than the thickness $tP_1$ of the first upper pinned magnetic sublayer 107 above the free magnetic layers in order that the exchange coupling magnetic field occurring in the layers above the free magnetic layers is substantially equal to the exchange coupling magnetic field occurring in the layers below the free magnetic layers. This relationship suppresses deterioration of these exchange coupling magnetic fields and improves reliability of the resulting magnetic head.

In this dual spin-valve thin-film magnetic element, as shown in FIGS. 13 and 14, the magnetization of the second lower pinned magnetic sublayer 95 below the free magnetic layers and the magnetization of the second upper pinned magnetic sublayer 105 above the free magnetic layers must be opposite each other, because the magnetization of the first free magnetic sublayer 101 and the magnetization of the second free magnetic sublayer 97 are antiparallel to each other.

When the first free magnetic sublayer 101 is magnetized in a direction opposite to the X1 direction as shown in FIGS. 13 and 14, the magnetization of the second free magnetic sublayer 97 is magnetized in the X1 direction by the exchange coupling magnetic field with the first free magnetic sublayer 101 (RKKY interaction). The magnetization of the first free magnetic sublayer 101 and the magnetization of the second free magnetic sublayer 97 rotate in response to an external magnetic field while maintaining a ferrimagnetic state.

In this dual spin-valve thin-film magnetic element, both the magnetization of the first free magnetic sublayer 101 and the magnetization of the second free magnetic sublayer 97 contribute to the rate of change in resistance ($\Delta R/R$). The electrical resistance of the element varies with the relationships between the variable magnetizations of the first and second free magnetic sublayers 101 and 97, respectively, and the pinned magnetizations of the second lower and upper pinned magnetic sublayers 95 and 105, respectively. In order to achieve a large rate of change in resistance ($\Delta R/R$,), the magnetization vector of the second lower pinned magnetic sublayer 95 and the magnetization vector of the second upper pinned magnetic sublayer 105 must be controlled so that the change in resistance generated by the first free magnetic sublayer 101 and the second upper pinned magnetic sublayer 105 is the same as the change in resistance generated by the second free magnetic sublayer 97 and the second lower pinned magnetic sublayer 95. That is, when the change in resistance by the first free magnetic sublayer 101 and the second upper pinned magnetic sublayer 105 is maximized, the change in resistance by the second free magnetic sublayer 97 and the second lower pinned magnetic sublayer 95 is also maximized. When the change in resistance by the first free magnetic sublayer 101 and the second upper pinned magnetic sublayer 105 is minimized, the change in resistance by the second free magnetic sublayer 97 and the second lower pinned magnetic sublayer 95 is also minimized.

In this dual spin-valve thin-film magnetic element, the magnetization of the first free magnetic sublayer 101 and the magnetization of the second free magnetic sublayer 97 are antiparallel to each other. Thus, the magnetization of the second upper pinned magnetic sublayer 105 and the magnetization of the second lower pinned magnetic sublayer 95 must also be antiparallel to each other. Such an antiparallel arrangement of the magnetizations of the second lower pinned magnetic sublayer 95 and the second upper pinned magnetic sublayer 105 achieves a high rate of change in resistance ($\Delta R/R$,).

Since the ends 110C of the hard bias layers 110 are in direct contact with two sides of the first free magnetic sublayer 101, the first free magnetic sublayer 101 and the adjoining hard bias layers 110 are magnetically coupled by exchange coupling (exchange interaction). Thus, a strong bias magnetic field from the hard bias layers 110 may be effectively applied to the first free magnetic sublayer 101 without forming a demagnetizing field at the two sides of the first free magnetic sublayer 101 and the second free magnetic sublayer 97, preventing disorder of the magnetization vector at the two sides of the free magnetic layers (buckling phenomenon). Since the magnetic domains in the first free magnetic sublayer 101 and the second free magnetic sublayer 97 are highly controlled, the stability of the output waveform at two ends of the track width Tw is improved.

Since no demagnetizing field occurs at the two sides of the first free magnetic sublayer 101 and the second free magnetic sublayer 97, no buckling phenomenon occurs even in a read head with a narrower track width. Thus, the output waveform at the two ends of the track width Tw of the read head is stable.

Even when the product of the residual magnetization and the thickness in the hard bias layers 110 is reduced to some extent, the above exchange interaction prevents the formation of demagnetizing field at the two sides of the first free magnetic sublayer 101 and the second free magnetic sublayer 97. Thus, the bias magnetic field from each hard bias layer 110 can be effectively applied to the first free magnetic sublayer 101 to secure the stability of the output waveform at the two ends of the track width Tw. For example, the thickness of the hard bias layers 110 is reduced to weaken the exchange bias magnetic field so that insensitive regions for read output in the vicinity of the sides of the composite a6 are narrowed while a sensitive region for read output in the center is spread to enhance the read output.

In this spin-valve thin-film magnetic element, no bias underlayer is provided between the free magnetic layers 101 and 97 and the hard bias layers 110. That is, the ends 110C of the hard bias layers 110 are in direct contact with the sides of the first free magnetic sublayer 101 and the second free magnetic sublayer 97. Alternatively, at least part of the end 110C of each hard bias layer 110 may be in contact with the sides of the first free magnetic sublayer 101 and the second free magnetic sublayer 97. Thus, bias underlayers 116 may have extensions 116e represented by dashed lines extending to interfaces between the second free magnetic sublayer 97 and the hard bias layers 110.

Since at least part of each hard bias layer 110 is in contact with the first free magnetic sublayer 101, the hard bias layers 110 and the first free magnetic sublayer 101 are magnetically coupled with each other by an exchange interaction, regardless of the extensions 116e of the bias underlayers 116. Since the magnetic charge accumulated at two sides of the first free magnetic sublayer 101 and generating a demagnetizing field is effectively removed due to the exchange interaction, no demagnetizing field occurs at the two sides of the first free magnetic sublayer 101. Moreover, a strong bias magnetic field is applied to the first free magnetic sublayer 101 from each hard bias layer 110. Thus, disordered magnetization due to the demagnetizing field is prevented at the two sides of the free magnetic layers, improving magnetic domain control in the first free magnetic sublayer 101 and stability of the output waveform at two ends of the track width Tw.

In such a spin-valve thin-film magnetic element, the extensions 116e of the bias underlayers 116 have a thickness of preferably about 1 nm or less and more preferably about 0.5 nm or less.

In the spin-valve thin-film magnetic element according to the fourth embodiment, no bias underlayer is provided between the first free magnetic sublayer 101 and the hard bias layers 110 or between the second free magnetic sublayer 97 and the hard bias layers 110. That is, the ends 110C at the composite a6 side of the hard bias layers 110 are in direct contact with the ends of the first and second free magnetic sublayers 101 and 97, respectively. Alternatively, the bias underlayers may has extensions 116f extending to the interface between the first free magnetic sublayer 101 and the hard bias layers 110 and between the second free magnetic sublayer 97 and the hard bias layers 110, as shown by dashed lines in FIG. 14. The thickness of each bias underlayer 116 is smaller at extensions 116f between the first free magnetic sublayer 101 and the hard bias layers 110 and between the second free magnetic sublayer 97 and the hard bias layers 110 than at a portion 116g under the hard bias layers 110, in which the thickness at the extensions 116f indicates that in the track width direction of the MR head and the thickness at the portion 116g indicates that in the height direction of the composite a6.

Such a thickness relationship forms pinholes in the extensions 116f of the bias underlayers 116 provided between the first free magnetic sublayer 101 and the hard bias layers 110 and between the second free magnetic sublayer 97 and the hard bias layers 110. Thus, the first free magnetic sublayer 101 and the hard bias layers 110 are magnetically coupled with each other via the pinholes in the extensions 116f by an exchange interaction. Since the magnetic charges accumulated in two sides of the free magnetic layer are effectively removed by the exchange interaction, no demagnetizing field occurs at the two sides of the first and second free magnetic sublayers 101 and 97, respectively. Thus, disordered magnetization due to the demagnetizing field is prevented at the two sides of the free magnetic layers, improving magnetic domain control in first and second free magnetic sublayers 101 and 97, respectively, and stability of the output waveform at two ends of the track width Tw.

The extensions 116f of the bias underlayers 116 ensure high coercive force and a high remanence ratio of the hard bias layers 110.

The extensions 116f of the bias underlayers 116 between the first free magnetic sublayer 101 and the hard bias layers 110 and between the second free magnetic sublayer 97 and the hard bias layers 110 has a thickness of preferably about 1 nm or less and more preferably about 0.5 nm or less.

A method for making the spin-valve thin-film magnetic element according to the fourth embodiment is now described.

The underlayer 91, the lower antiferromagnetic layer 92, the first lower pinned magnetic sublayer 93, the lower nonmagnetic interlayer 94, the second lower pinned magnetic sublayer 95, the nonmagnetic conductive layer 96, the second free magnetic sublayer 97, the nonmagnetic interlayer 100, the first free magnetic sublayer 101, the nonmagnetic conductive layer 104, the second upper pinned magnetic sublayer 105, the upper nonmagnetic interlayer 106, the first upper pinned magnetic sublayer 107, the upper antiferromagnetic layer 108, and the protective layer 109 are deposited in that order onto a substrate. After a lift-off resist is applied onto the composite as in the first embodiment, a portion not covered with the liftoff resist is removed by ion milling and the side faces b6 are formed to complete the trapezoidal composite a6.

The bias underlayers 116 are formed on the lower antiferromagnetic layer 92 extending to two sides of the composite a6 so that the upper surfaces of the bias underlayers 116 are lower than the lower surface of the second free magnetic sublayer 97.

Next, the hard bias layers 110 are formed on the bias underlayers 116 at the two sides of the composite a6 so that the level thereof is the same as those of the first and second free magnetic sublayers 101 and 97 and so that the upper surfaces 110A of the hard bias layers 110 comes into contact with the side faces b6 of the composite a6 at a position below the top ends of the side faces b6.

It is preferable that the thickness of the hard bias layers 110 be larger than the total thickness of the first free magnetic sublayer 101 and the second free magnetic sublayer 97 in the thickness direction of the composite a6. The upper surfaces 110A of the hard bias layers 110 lie above the upper surfaces of the first and second free magnetic sublayers 101 and 97, respectively, and the lower surfaces of the hard bias layers 110 lie below the lower surfaces of the first and second free magnetic sublayers 101 and 97, respectively. The ends 110C of the hard bias layers 110 are in direct contact with the side faces b6 of the first and second free magnetic sublayers 101 and 97, respectively.

Preferably, contact points c6 of upper surfaces 110A of the hard bias layers 110 with the side faces b6 of the composite a6 lie below the top ends d6 of the side faces b6 of the composite a6 and below the highest position of the hard bias layers 110.

Next, conductive layers 111 are formed on the hard bias layers 110 so as to come into contact with the side faces b6 of the composite a6.

The rift-off resist is removed to complete the spin-valve thin-film magnetic element shown in FIGS. 13 and 14.

When a spin-valve thin-film magnetic element having extensions 116e of the bias underlayers 116 is produced, the angle defined by a first target to the substrate is controlled (increased) in the step of forming the bias underlayers 116 so that each extension 116e is formed at least on part of each side of the second free magnetic sublayer 97. Other steps are the same as above.

In the production of the spin-valve thin-film magnetic element with the bias underlayers 116 having the extensions 116f between the first free magnetic sublayer 101 and the hard bias layers 110 and between the second free magnetic sublayer 97 and the hard bias layers 110, the angle between the first target and the substrate is increased in the step of production of the bias underlayers 116 so that the thickness of the extensions 116f are smaller than that of the portion 116g under the hard bias layers 110.

As described above, in the spin-valve thin-film magnetic elements shown in FIGS. 11 to 14, the free magnetic layer, as well as the pinned magnetic layer, is divided into a first free magnetic sublayer and a second free magnetic sublayer separated by a nonmagnetic interlayer. The magnetizations of these two free magnetic layers are in an antiparallel state (a ferri-magnetic state) by an exchange coupling magnetic field occurring therebetween (RKKY interaction) so that these magnetizations can sensitively rotate in response to an external magnetic field.

In the present invention, a strong exchange coupling magnetic field is obtainable by optimizing the ratio of the thickness of the first free magnetic sublayer to the thickness of the second free magnetic sublayer, the thickness of the nonmagnetic interlayer between the first free magnetic sublayer and the second free magnetic sublayer, the ratio of the thickness of the first pinned magnetic sublayer to the thickness of the second pinned magnetic sublayer, the thickness of the nonmagnetic interlayer between the first pinned magnetic sublayer and the second pinned magnetic sublayer, and the thickness of the antiferromagnetic layer. Such a combination of the pinned magnetization state of the first and second pinned magnetic sublayers and the variable magnetization state of the first and second free magnetic sublayers ensures a thermally stable ferri-magnetic state, which is advantageous for a large rate of change in resistance ($\Delta R/R_s$).

Moreover, controlling the direction of a sense current improves thermal stability of the antiparallel (ferrimagnetic) state of the magnetization of the first pinned magnetic sublayer and the magnetization of the second pinned magnetic sublayer.

In a spin-valve thin-film magnetic element, conductive layers are formed on two sides of a composite including an antiferromagnetic layer, a pinned magnetic layer, a nonmagnetic conductive layer, and a free magnetic layer, and a sense current is supplied from the conductive layers. The sense current primarily flows in portions having relatively low resistance, that is, the nonmagnetic conductive layer, the interface between the nonmagnetic conductive layer and the pinned magnetic layer, and the interface between the nonmagnetic conductive layer and the free magnetic layer. Since the pinned magnetic layer is divided into the first pinned magnetic sublayer and the second pinned magnetic sublayer, the sense current primarily flows in the interface between the second pinned magnetic sublayer and the nonmagnetic conductive layer.

The sense current generates a sense current magnetic field by a corkscrew rule. In the present invention, the direction of the sense current is controlled so that the sense current magnetic field is equal to the combined magnetic moment, which is the sum of the magnetic moment of the first pinned magnetic sublayer and the magnetic moment of the second pinned magnetic sublayer.

Fifth Embodiment

Figure 15:
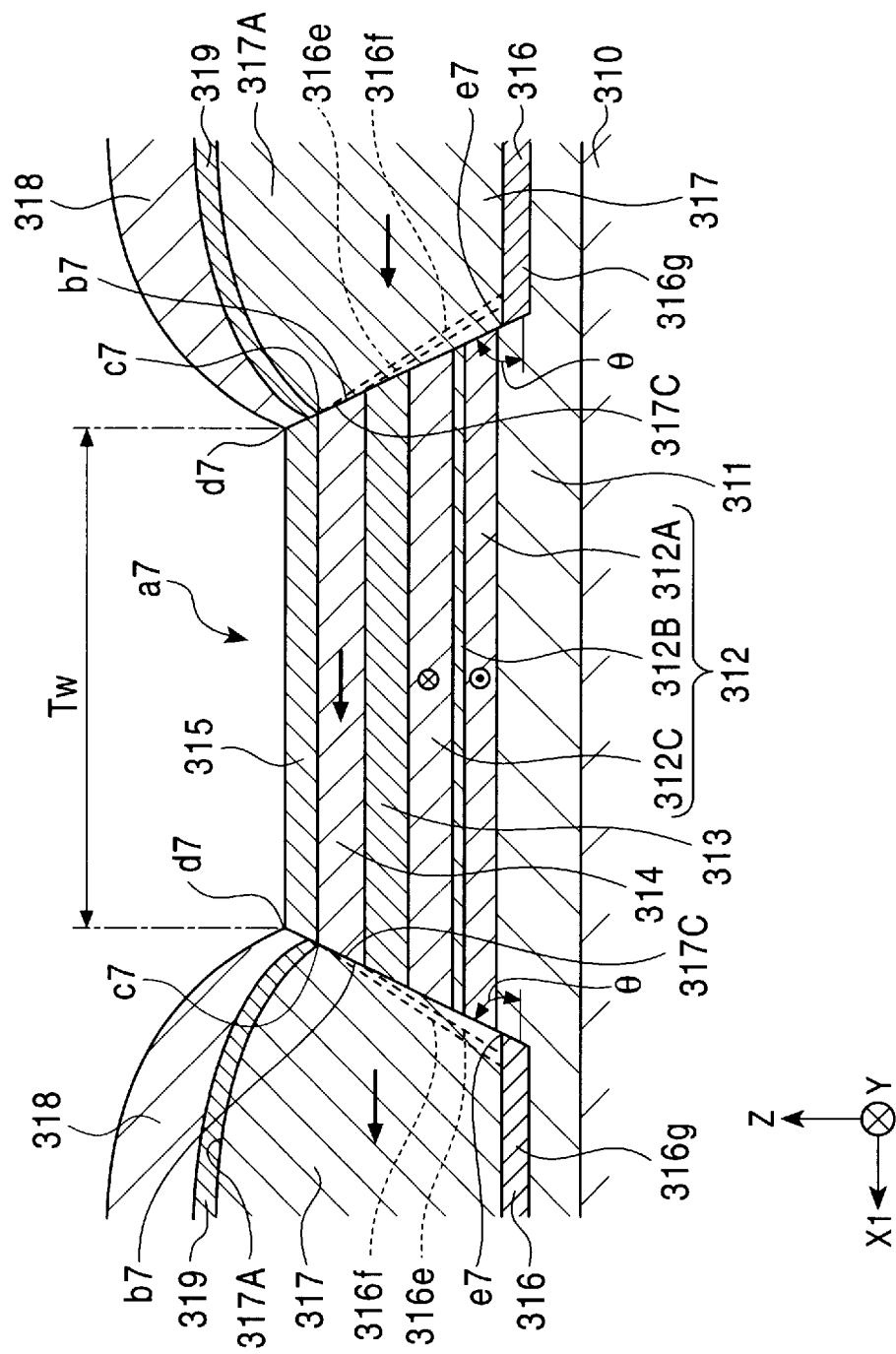
FIG. 15 represents a cross-sectional view of a spin-valve thin-film magnetic element according to a fifth embodiment viewed from the face opposing a recording medium.

FIG. 15 represents a cross-sectional view illustrating a structure of a spin-valve thin-film magnetic element in accordance with a fifth embodiment when viewed from a face opposing a recording medium.

This spin-valve thin-film magnetic element is of a synthetic ferri-pinned single bottom type having an antiferromagnetic layer, two pinned magnetic layers, a nonmagnetic conductive layer, and a free magnetic layer. That is, a first pinned magnetic sublayer and a second pinned magnetic sublayer are separated by a nonmagnetic interlayer, and the magnetization vector of the first pinned magnetic sublayer and the magnetization vector of the second pinned magnetic sublayer are antiparallel to each other.

In FIG. 15, an antiferromagnetic layer 311 is formed on an underlying layer 310 composed of a nonmagnetic material such as Ta and provided on a substrate not shown in the drawing. A pinned magnetic layer 312 is formed on the antiferromagnetic layer 311. The pinned magnetic layer 312 is composed of a first pinned magnetic sublayer 312A, a nonmagnetic interlayer 312B, and a second pinned magnetic sublayer 312C, from the bottom.

A nonmagnetic conductive layer 313 composed of Cu or the like is formed on the second pinned magnetic sublayer 312C, and a free magnetic layer 314 is formed on the nonmagnetic conductive layer 313. A protective layer 315 composed of Ta or the like is formed on the free magnetic layer 314. A back layer (not shown in the drawing) composed of Cu, Ag, or Au may be provided between the free magnetic layer 314 and the protective layer 315.

As shown in FIG. 15, the layers from part of the antiferromagnetic layer 311 to the protective layer 315 constitute a composite a7 having a substantially trapezoidal cross-section. The lower portion of the antiferromagnetic layer 311 and the underlying layer 310 further extend from the bottom of the composite a7 outward.

Hard bias layers 317 are formed on the antiferromagnetic layer 311 at the peripheries of the composite a7. Conductive layers 318 composed of Ta or Cr are formed on the hard bias layers 317, while bias underlayers 316 are formed under the hard bias layers 317 to control the crystal orientation in the hard bias layers 317. The bias underlayers 316 are composed of a nonmagnetic metal having a body centered cubic structure, which is the same as the material for the bias underlayers 6 in the first embodiment. The bias underlayers 316 also function as buffer layers. The hard bias layers 317 are composed of, for example, a Co—Pt alloy, a Co—Cr—Pt alloy, or a Co—Cr—Ta alloy. The bias underlayers 316 and interlayers 319 function as diffusion barriers in a hardening step of an insulating resist performed at a high temperature in a subsequent production step of an inductive write head, preventing thermal diffusion between the hard bias layers 317 and the adjacent layers and thus deterioration of magnetic characteristics of the hard bias layers 317.

Each conductive layer 318 has a single or multiple layer configuration and is composed of, for example, at least one element selected from Cr, Au, Ta, and W.

An advantage of a bottom type having an antiferromagnetic layer provided at the bottom region compared to a top type having an antiferromagnetic layer provided at the top region is that the width of the free magnetic layer defining the magnetic track width can be easily controlled in response to the width of the lift-off resist. That is, the bottom type is suitable for a head having a narrower track width.

In more detail, it is preferable that the antiferromagnetic layer 311 in the firth embodiment of the present invention be composed of a PtMn alloy, as in the antiferromagnetic layer 2 in the first embodiment, and have a thickness in the range of about 8 through about 11 nm (about 80 through about 110 angstroms) in the central portion of the composite a7.

The PtMn alloy may be replaced with an X—Mn or X'—Pt—Mn alloy wherein X is one element selected from the group consisting of Pd, Ru, Ir, Rh, and Os, and X' is at least one element selected from the group consisting of Pd, Ru, Ir, Rh, Os, Au, Ag, Ne, Ar, Xe, and Kr.

Preferably, the first pinned magnetic sublayer 312A and the second pinned magnetic sublayer 312C are composed of a ferromagnetic material, e.g., elemental cobalt, a NiFe alloy, a CoNiFe alloy, a CoFe alloy, or a CoNi alloy, and have a total thickness of about 4 nm (about 40 angstroms). For example, the first pinned magnetic sublayer 312A is composed of elemental cobalt and has a thickness in the range of about 1.3 through about 1.5 nm (about 13 through about 15 angstroms), while the second pinned magnetic sublayer 312C is composed of elemental cobalt and has a thickness in the range of about 2 through about 2.5 nm (about 20 through about 25 angstroms).

Preferably, the nonmagnetic interlayer 312B is composed of at least one metallic element selected from the group consisting of Ru, Rh, Ir, Cr, Re, and Cu, and has a thickness of about 0.8 nm (about 8 angstroms).

The first pinned magnetic sublayer 312A is in contact with the antiferromagnetic layer 311 to generate an exchange coupling magnetic field (exchange anisotropic magnetic field) at the interface between the first pinned magnetic sublayer 312A and the antiferromagnetic layer 311 during annealing in a magnetic field. As a result, for example, as shown in FIG. 15, when the magnetization of the first pinned magnetic sublayer 312A is pinned in the direction opposite to the Y direction in the drawing, the magnetization of the second pinned magnetic sublayer 312C is pinned in the Y direction in the drawing. That is, the magnetization of the first pinned magnetic sublayer 312A and the magnetization of the nonmagnetic interlayer 312B are antiparallel to each other.

A more intense exchange coupling magnetic field ensures a stable antiparallel arrangement between the magnetization of the first pinned magnetic sublayer 312A and the magnetization of the second pinned magnetic sublayer 312C. An antiferromagnetic layer 311 composed of an PtMn alloy having a high blocking temperature and generating a strong exchange coupling magnetic field (exchange anisotropic magnetic field) at the interface with the first pinned magnetic sublayer 312A ensures a thermally stable magnetic state between the first pinned magnetic sublayer 312A and the second pinned magnetic sublayer 312C.

In this embodiment, the ratio of the thickness of the first pinned magnetic sublayer 312A to that of the second pinned magnetic sublayer 312C is optimized to obtain a strong exchange coupling magnetic field (Hex) and to ensure a thermally stable antiparallel state (ferri-magnetic state) between the magnetization of the first pinned magnetic sublayer 312A and the magnetization of the second pinned magnetic sublayer 312C and a large rate of change in resistance ($\Delta R/R$,). Moreover, optimization of the magnitude and the vector of the magnetic field during annealing can easily orient the magnetization vector of the first pinned magnetic sublayer 312A and the magnetization vector of the second pinned magnetic sublayer 312C in required directions.

The nonmagnetic conductive layer 313 is composed of copper or the like and has a thickness in the range of about 2 through about 2.5 nm (about 20 through about 25 angstroms).

The free magnetic layer 314 generally has a thickness in the range of 20 through about 50 angstroms and is preferably composed of the same material as that the first pinned magnetic sublayer 312A and the second pinned magnetic sublayer 312C.

Since the hard bias layers 317 are magnetized in the X1 direction, the free magnetic layer 314 is also magnetized in the X1 direction. Thus, the variable magnetization of the free magnetic layer 314 is perpendicular to the pinned magnetization of the second pinned magnetic sublayer 312C.

Preferably, the hard bias layers 317 and the free magnetic layer 314 lie in the same level, and the thickness of the hard bias layers 317 is larger than that of the free magnetic layer 314. The bottom faces of the hard bias layers 317 lie below the bottom face of the free magnetic layer 314, as shown in FIG. 15. The ends 317C of the hard bias layers 317 are direct contact with the side faces b7 of the free magnetic layer 314.

Preferably, contact points c7 of upper surfaces 317A of the hard bias layers 317 with the side faces of the composite a7 lie below the top ends d7 of the side faces b7 of the composite a7 and below the highest position of the hard bias layers 317, in order to facilitate flux control in a magnetic field from the hard bias layers 317 acting on the free magnetic layer 314. That is, a leakage magnetic field from the hard bias layers 317 is absorbed in an upper shield layer lying above the composite a7 to prevent an effective magnetic field applied to the free magnetic layer 314 from decreasing. As a result, the free magnetic layer 314 is readily aligned into a single domain state.

Conductive layers 318 having a single or multiple layer configuration exhibit low resistance. In this embodiment, the conductive layers 318 are composed of chromium (Cr) and are deposited on interlayers 319 composed of tantalum (Ta) to reduce electrical resistance.

As described above, the conductive layers 318 are preferably formed on the interlayers 319 on the hard bias layers 317 so as to connect to the side faces b7 of the composite a7.

The slope angle θ of the side faces of the composite a7 is preferably about 30 degrees or more to increase the thickness of the ends 317C of the hard bias layers 317 at the composite a7 side. As the thickness of the ends 317C of the hard bias layers 317 increases, portions not provided with the bias underlayers 316 decreases at the ends 317C. Since disordered portions of crystal orientation decreases at the ends 317C of the hard bias layers 317, the volume fraction of regions with low coercive force decreases at the ends 317C, resulting in a Barkhausen jump (BHJ) of about 15% or less. The slope angle θ is more preferably about 45 degrees or more in order to suppress the BHJ to about 10% or less and most preferably about 60 degrees or more in order to suppress the BHJ to about 5% or less.

In FIG. 15, a sense current is supplied from the conductive layers 318 to the composite a7. In response to a magnetic field in the Y direction in the drawing from a magnetic recording medium, the magnetization of the free magnetic layer 314 varies from the X1 direction to the Y direction in the drawing. At the interface between the nonmagnetic conductive layer 313 and the free magnetic layer 314 and the interface between the nonmagnetic conductive layer 313 and the second pinned magnetic sublayer 312C, spin-dependent scattering of conduction electrons occurs by the GMR effect to change the electrical resistance of the spin-valve thin-film magnetic element. A leakage magnetic field from the recording medium is detected in such a manner.

Since the ends 317C of the hard bias layers 317 are in direct contact with the two sides of the free magnetic layer 314 in the spin-valve thin-film magnetic element of the fifth embodiment, the free magnetic layer 314 and the hard bias layers 317 are magnetically coupled with each other by exchange coupling (exchange interaction) so as to effectively apply a strong bias magnetic field from the hard bias layers 317 to the free magnetic layer 314 without generating a demagnetizing field at the two sides of the free magnetic layer 314. Since disordering of the magnetization vector of the free magnetic layer at two sides (a buckling phenomenon) is avoided, the magnetic domains in the free magnetic layer 314 may be satisfactorily controlled, and the stability of the output waveform at the two ends in the track width Tw may be improved.

Since the free magnetic layer 314 not having the demagnetizing field at the two sides does not cause a buckling phenomenon in a read head with a narrower track width including this spin-valve thin-film magnetic element, no abnormal waveform is output at the two ends of the track width Tw, and the output waveforms exhibit high stability.

The above-mentioned external magnetic field prevents the formation of a demagnetizing field at two sides of the free magnetic layer 314 even if the product of the remanence magnetization and the thickness of the hard bias layers 317 is decreased to some extent. Thus, the bias magnetic field from each hard bias layer 317 may be effectively applied to the free magnetic layer 314. Thus, the output may be enhanced as follows. For example, the thickness of the hard bias layers 317 is decreased to weaken the exchange bias magnetic field. The side regions of the composite a7 exhibiting low read output are narrowed while the central region exhibiting high read output is spread.

In the spin-valve thin-film magnetic element of the fifth embodiment, no bias underlayer is provided between the free magnetic layer 314 and the hard bias layers 317. That is, the ends 317C of the hard bias layers 317 are in direct contact with the two sides of the free magnetic layer 314. Alternatively, the bias underlayers 316 may have extensions 316, as shown by dashed lines in FIG. 15, extending to the interfaces between the free magnetic layer 314 and the hard bias layers 317, as long as parts of the ends 317C of the hard bias layers 317 are in direct contact with the ends of the free magnetic layer 314.

In such a configuration, the free magnetic layer 314 is magnetically coupled with the hard bias layers 317 by exchange interaction so that magnetic charges accumulated at the two sides of the free magnetic layer 314 are effectively removed by the exchange interaction. As a result, no demagnetization field is generated at the two sides of the free magnetic layer 314. Moreover, a strong bias magnetic field can be applied from the hard bias layers 317 to the free magnetic layer 314, although the efficiency of the bias magnetic field is decreased compared with a configuration not having the extensions 316e. Thus, disordering of magnetization of the free magnetic layer at the two sides due to a demagnetizing field is prevented, the magnetic domains in the free magnetic layer 314 may be satisfactorily controlled, and the stability of the output waveform at the two ends in the track width Tw may be improved.

When the extensions 316e of the bias underlayers 316 are provided, the thickness thereof is preferably about 1 nm or less and more preferably about 0.5 nm or less.

In the spin-valve thin-film magnetic element of the fifth embodiment, no bias underlayer is provided between the free magnetic layer 314 and the hard bias layers 317, that is, the hard bias layers 317 are in direct contact with the two sides of the free magnetic layer 314. Alternatively, extensions 316f of the bias underlayers 316 may also be formed at the interfaces between the free magnetic layer 314 and the hard bias layers 317, as shown by dashed lines in FIG. 15. In this case, the thickness in the track width direction of the extensions 316f of the bias underlayers 316 is smaller than the thickness in the height direction of the portions 316g under the hard bias layers 317.

In such a configuration, pinholes are formed in the bias underlayers 316 lying between the free magnetic layer 314 and the hard bias layers 317. Thus, the free magnetic layer 314 and the hard bias layers 317 are magnetically coupled with each other by exchange interaction via these pinholes. The exchange interaction effectively removes magnetic charges accumulated in the two sides of the free magnetic layer 314, and no magnetic field is generated thereat. Thus, disordering of magnetization of the free magnetic layer at the two sides due to a demagnetizing field is prevented, the magnetic domains in the free magnetic layer 314 may be satisfactorily controlled, and the stability of the output waveform at the two ends in the track width Tw may be improved.

Moreover, a high coercive force and a high remanence ratio of the hard bias layers 317 may be maintained at the portions provided with the bias underlayers 316.

The extensions 316f of the bias underlayers 316 is preferably about 1 nm or less or more preferably about 0.5 nm or less between the free magnetic layer 314 and the hard bias layers 317.

A method for making the spin-valve thin-film magnetic element of the fifth embodiment is now described.

A lift-off resist layer is formed on a composite, which includes the underlying layer 310, the antiferromagnetic layer 311, the first pinned magnetic sublayer 312A, the nonmagnetic interlayer 312B, the second pinned magnetic sublayer 312C, the nonmagnetic conductive layer 313, the free magnetic layer 314, and the protective layer 315 provided in that order on a substrate, as in the first embodiment. The portion not covered by the lift-off resist is removed by ion milling to form the composite a7 of an isosceles trapezoid having sloping side faces b7.

The bias underlayers 316 are formed on the antiferromagnetic layer 311 extending to the two sides of the composite a7 so that the upper surfaces of the bias underlayers 316 are lower than the lower surface of the free magnetic layer 314.

The hard bias layers 317 are formed on the bias underlayers 316 at the two sides of the composite a7 and at a level which is the same as that of the free magnetic layer 314 so that the upper surfaces 317A of the hard bias layers 317 are put into contact with the side faces b7 of the composite a7 at a position below top ends d7 of the side faces b7 of the composite a7.

Preferably, the thickness of the hard bias layers 317 is larger than the thickness of the free magnetic layer 314. The upper surfaces 317A of the hard bias layers 317 lie above the upper surface of the free magnetic layer 314 and the lower surfaces of the hard bias layers 317 lie below the lower surface of the free magnetic layer 314. The hard bias layers 317 of the hard bias layers 317 are in direct contact with the side faces b7 of the free magnetic layer 314.

Preferably, the contact points c7 of the upper surfaces 317A of the hard bias layers 317 with the side faces of the composite a7 lie below the top ends d7 of the side faces b7 of the composite a7 and below the highest position of the hard bias layers 317.

Next, the interlayers 319 are formed on the hard bias layers 317 at the two sides of the composite a7. The conductive layers 318 are formed on the interlayers 319 so as to be connected to the side faces b7 of the composite a7.

The lift-off resist is removed to complete the spin-valve thin-film magnetic element shown in FIG. 15.

When the spin-valve thin-film magnetic element has the extensions 316e of the bias underlayers 316, the angle between the first target and the substrate is increased in the step of forming the bias underlayers 316e. Other steps are the same as above.

When the spin-valve thin-film magnetic element has the extensions 316f of the bias underlayers 316 and when the thickness of the extensions 316f is smaller than the portions 316g under the hard bias layers 317, the angle between the first target and the substrate is further increased in the step of forming the bias underlayers 316e. Other steps are the same as above.

Sixth Embodiment

Figure 16:
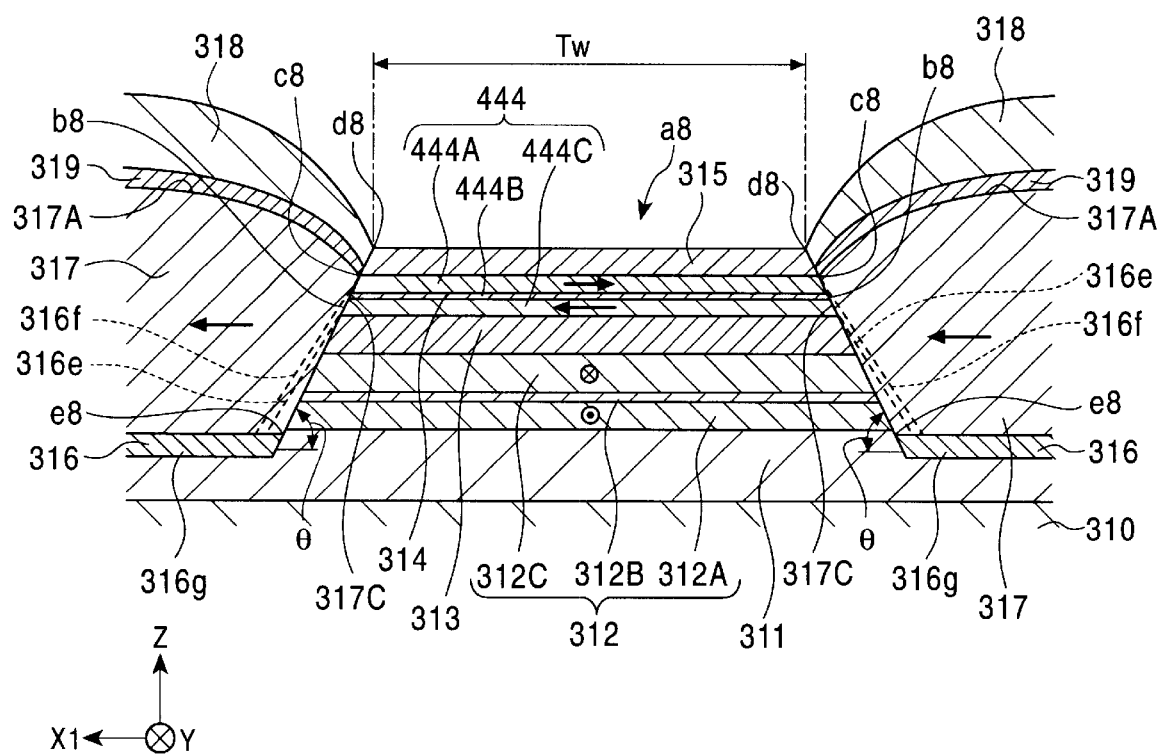
FIG. 16 represents a cross-sectional view of a spin-valve thin-film magnetic element according to a sixth embodiment viewed from the face opposing a recording medium.
Figure 17:
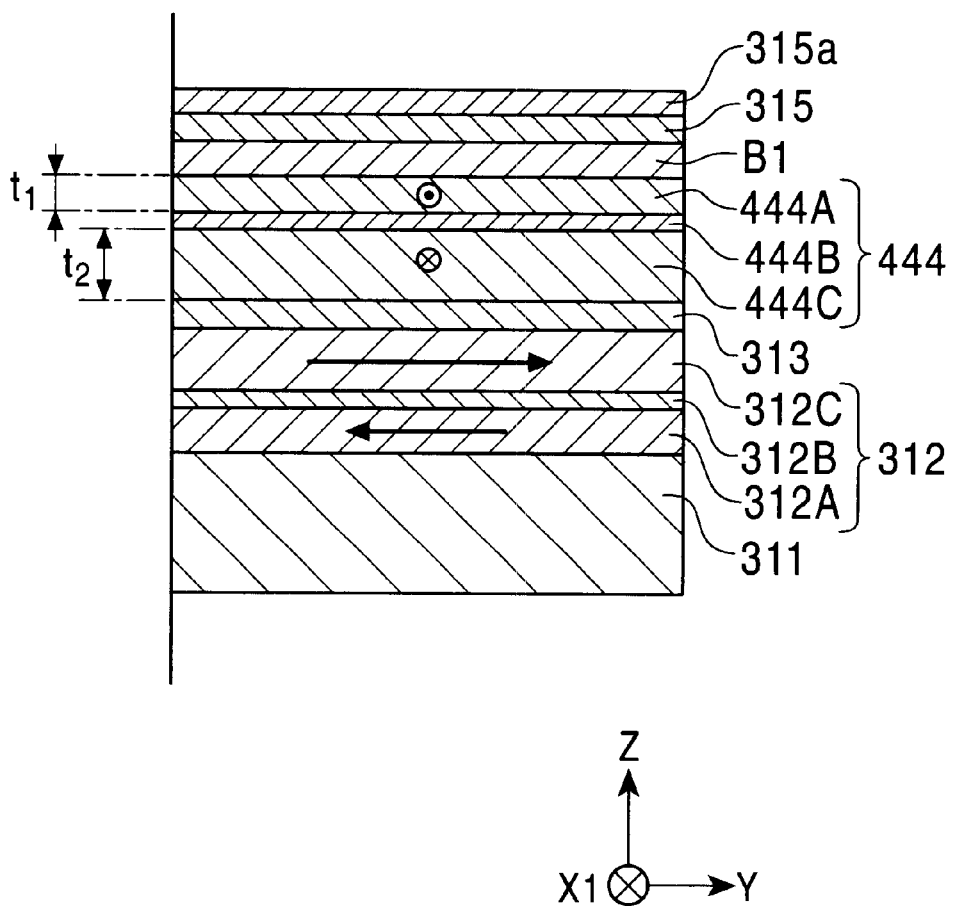
FIG. 17 represents a cross-sectional view of the spin-valve thin-film magnetic element shown in FIG. 16 viewed from the track width direction.

FIG. 16 represents a cross-sectional view of a structure of a spin-valve thin-film magnetic element according to a sixth embodiment viewed from the face opposing a recording medium. FIG. 17 represents a cross sectional view of the spin-valve thin-film magnetic element viewed from the track width direction.

The spin-valve thin-film magnetic element of this embodiment is also a bottom-type synthetic-ferri-pinned spin-valve thin magnetic element. The spin-valve thin-film magnetic element of this embodiment may be distinguished from that of the fifth embodiment in that the free magnetic layer is of a synthetic-ferri-free type.

In FIG. 16, an antiferromagnetic layer 311 is formed on an underlayer 310 composed of a nonmagnetic material such as tantalum (Ta) formed on a substrate (not shown). A pinned magnetic layer 312 is formed on the antiferromagnetic layer 311.

The pinned magnetic layer 312 comprises a first pinned magnetic sublayer 312A, a nonmagnetic interlayer 312B, and a second pinned magnetic sublayer 312C magnetized in antiparallel to the magnetization vector of the first pinned magnetic sublayer 312A. The nonmagnetic interlayer 312B is provided between the first pinned magnetic sublayer 312A and the second pinned magnetic sublayer 312C.

A nonmagnetic conductive layer 313 composed of copper (Cu) or the like is formed on the second pinned magnetic sublayer 312C. A free magnetic layer 444 of a synthetic-ferri-free-type is formed on the nonmagnetic conductive layer 313.

The free magnetic layer 444 comprises a first free magnetic sublayer 444A, a second free magnetic sublayer 444C, and a nonmagnetic interlayer 444B provided between the first free magnetic sublayer 444A and the second free magnetic sublayer 444C. The magnetization vectors of the first free magnetic sublayer 444A and the second free magnetic sublayer 444C are in a ferri-magnetic state, i.e., are antiparallel to each other. The first free magnetic sublayer 444A is provided to contact a protective layer 315 and the second free magnetic sublayer 444C is provided to contact the nonmagnetic conductive layer 313.

The first free magnetic sublayer 444A and the second free magnetic sublayer 444C are composed of the same material as the free magnetic layer 314 of the fifth embodiment. Preferably, the nonmagnetic interlayer 444B is composed of at least one element selected from the group consisting of Ru, Rh, Ir, Cr, Re, and Cu.

The first free magnetic sublayer 444A and the second free magnetic sublayer 444C may be composed of a NiFe alloy, a CoFe alloy, a CoNiFe alloy, or the like. The thickness of the first free magnetic sublayer 444A and the thickness of the second free magnetic sublayer 444C are different from each other.

Alternatively, each the first free magnetic sublayer 444A and the second free magnetic sublayer 444C may comprise two sublayers.

Preferably, a Co layer is provided at the interface between the second free magnetic sublayer 444C and the nonmagnetic conductive layer 313 and at the interface between the second pinned magnetic sublayer 312C and the nonmagnetic conductive layer 313.

The protective layer 315 composed of tantalum (Ta) or the like is formed on the free magnetic layer 444.

As shown in FIG. 16, a composite a8 having a substantially trapezoidal cross-section is provided. The composite a8 is constituted of layers including part of the antiferromagnetic layer 311 to the protective layer 315. The lower portion of the antiferromagnetic layer 311 and the underlayer 310 under the antiferromagnetic layer 311 extend outward beyond the pinned magnetic layer 312, the nonmagnetic conductive layer 313, and the free magnetic layer 444.

Hard bias layers 317 are formed on the underlayer 310 at the two sides of the composite a8. Conductive layers 318 are formed on the hard bias layers 317 separated by interlayers 319 composed of Ta or Cr. Bias underlayers 316 for controlling the crystal orientation of the hard bias layers are formed under the hard bias layers 317. The bias underlayers 316 are composed of the same nonmagnetic metal having a body-centered cubic structure as the bias underlayers 6 of the first embodiment. The bias underlayers 316 also function as the buffer layers.

Upper surfaces 317A of the hard bias layers 317 directly contact side surfaces b8 of the composite a8 at the position between the upper surface and lower surface of the second free magnetic sublayer 444C, i.e., the upper surfaces 317A are in direct contact with the two end portions of the second free magnetic sublayer 444C. In this manner, the leakage magnetic field from the hard bias layers 317 can be applied to the second free magnetic sublayer 444C only.

Preferably, the upper surfaces 317A of the hard bias layers 317 contact the side surfaces b8 of the composite a8 at the position between the upper surface of the second free magnetic sublayer 444C and the middle of the thickness of the second free magnetic sublayer 444C. In this manner, a strong bias magnetic field may be applied from the hard bias layers 317 to the second free magnetic sublayer 444C. The hard bias layers 317 are magnetized in the X1 direction in the drawings and orient the magnetization vector of the second free magnetic sublayer 444C in the X1 direction.

The first free magnetic sublayer 444A is magnetically coupled with the second free magnetic sublayer 444C by an exchange coupling field (RKKY interaction) and is thereby magnetized in the direction opposite to the X1 direction in the drawings. When the external magnetic field is applied, the magnetization vectors of the first free magnetic sublayer 444A and the second free magnetic sublayer 444C rotate while maintaining the ferri-magnetic state. In other words, when the magnetization vector of the second free magnetic sublayer 444C is oriented in the X1 direction in the drawings by the hard bias layers 317, the magnetization vector of the first free magnetic sublayer 444A is oriented in the direction opposite to the X1 direction in the drawings.

The thickness $t_2$ of the second free magnetic sublayer 444C is larger than the thickness $t_1$ of the first free magnetic sublayer 444A.

When the saturation magnetization of the first free magnetic sublayer 444A is represented by $M_1$ and the saturation magnetization of the second free magnetic sublayer 444C is represented by $M_2$, the magnetic thickness of the first free magnetic sublayer 444A is $M_1 \cdot t_1$, and the magnetic thickness of the second free magnetic sublayer 444C is $M_2 \cdot t_2$.

The first free magnetic sublayer 444A and the second free magnetic sublayer 444C of the free magnetic layer 444 comply with the relationship $M_2 \cdot t_2 > M_1 \cdot t_1$. In this manner, the magnetization of the second free magnetic sublayer 444C remains so as to orient the magnetization vector of the entire free magnetic layer 444 in the X1 direction in the drawings. The effective layer thickness of the free magnetic layer 444 at this time is $(M_2 \cdot t_2 - M_1 \cdot t_1)$.

Since the first free magnetic sublayer 444A and the second free magnetic sublayer 444C are antiferromagnetically coupled in antiparallel to each other and the magnetic thickness thereof comply with the relationship $M_2 \cdot t_2 > M_1 \cdot t_1$, a ferri-magnetic state is synthesized.

Moreover, the magnetization vector of the free magnetic layer 444 and the magnetization vector of the pinned magnetic layer 312 are substantially orthogonal to each other.

In the spin-valve thin-film magnetic element of the sixth embodiment, because the magnetic thickness of the second free magnetic sublayer 444C is larger than the magnetic thickness of the first free magnetic sublayer 444A, the effective magnetic thickness of the free magnetic layer 444 is defined as the difference between the magnetic thicknesses of the first and second free magnetic layers 444A and 444C. Thus, by properly controlling the thicknesses of the first and second free magnetic layers 444A and 444C so as to reduce the effective layer thickness of the free magnetic layer 444, the magnetization vector of the free magnetic layer 444 changes in response to a weak external magnetic field, improving the sensitivity of the spin-valve thin-film magnetic element. Furthermore, because the thickness of the free magnetic layer 444 as a whole can be increased to a certain extent, an adequate rate of change in resistance can be obtained and sensitivity of the spin-valve thin-film magnetic element can be improved.

Slope angles θ of the side portions of the composite a8 sandwiched by the hard bias layers 317 are preferably about 30 degrees or more. In this manner, the thickness of end portions 317C of the hard bias layers 317 facing the composite a8 is increased. As the thickness of the end portions 317C increases, the end portions 317C not provided with the bias underlayer 316 are minimized. In other words, the end portions 317C having disordered crystal orientations become smaller. As a consequence, the volume of the end portions 317C having a reduced coercive force is decreased, thereby reducing Barkhausen jump (BHJ) to about 15% or less. Preferably the slope angle θ is about 45 degrees or more to reduce the BHJ to about 10% or less and, and more preferably, the slope angle θ is about 60 degrees or more to reduce the BHJ to about 5% or less.

In the spin-valve thin-film magnetic element of the sixth embodiment, the end portions 317C of the hard bias layers 317 are in direct contact with the two sides of the second free magnetic sublayer 444C. Thus, the second free magnetic sublayer 444C and the hard bias layers 317 provided at the sides thereof are magnetically coupled by an exchange interaction. As a consequence, generation of a demagnetizing field at the end portions of the second free magnetic sublayer 444C is prevented, and a strong bias magnetic field may be effectively applied to the second free magnetic sublayer 444C from the hard bias layers 317. It also becomes possible to prevent the disorder of the magnetization vectors in the two side portions of the free magnetic layer due to the demagnetizing field which would otherwise occur (prevention of the buckling phenomenon). Moreover, the magnetic domains in the free magnetic layer 444 can be suitably controlled, thereby improving the stability of the output waveform at the two ends of the track width Tw.

Moreover, since there is no demagnetizing field in the two side portions of the second free magnetic sublayer 444C, the buckling phenomenon is inhibited, thereby preventing the output waveform at the two end portions of the track width Tw from becoming erroneous. Thus, the stability the output waveform can be improved for the read head as a whole.

Even when the product of the remanence and the layer thickness of the hard bias layers 317 is reduced to a certain extent, the exchange interaction prevents the generation of the demagnetizing field at the two side portions of the second free magnetic sublayer. The bias magnetic field may then be effectively applied to the second free magnetic sublayer 444C from the hard bias layers 317, and the stability of the output waveform at the two ends of the track width can be improved. The thickness of the hard bias layers 317 may be reduced so as to reduce the exchange bias field, and the region, in the vicinity of the composite a8, having low output can be reduced so as to enlarge the region at the center with high output, thereby increasing the output.

It should be noted that in the spin-valve thin-film magnetic element of the sixth embodiment, the bias underlayers are not provided between the second free magnetic sublayer 444C and the hard bias layers 317 at the sides thereof. In other words, the hard bias layers 317 of the hard bias layers 317 are in direct contact with the two end portions of the second free magnetic sublayer 444C. However, the end portions 317C of the hard bias layers 317 and the two side portions of the second free magnetic sublayer 444C are only required to contact each other partially. Thus, each of the bias underlayers hard bias layers 317 may comprise an extension 316e extending to the interface between the second free magnetic sublayer 444C and the hard bias layer 317.

In this type of spin-valve thin-film magnetic element, because the hard bias layers 317 and the free magnetic layer 444 are partially in contact with each other, the second free magnetic sublayer 444C and the hard bias layers 317 at the sides thereof are magnetically coupled due to the exchange interaction even when the bias underlayers 316 extend to the interfaces between the second free magnetic sublayer 444C and the hard bias layers 317. Consequently, the magnetic charges accumulated in the two side portions of the second free magnetic sublayer 444C, which will be a cause of the demagnetizing field, are effectively removed by the above-described exchange interaction and generation of the demagnetizing field at the two side portions of the second free magnetic sublayer 444C can be effectively inhibited. Although the efficiency of the bias magnetic field applied from the hard bias layers 317 to the second free magnetic sublayer 444C is decreased compared to the spin-valve thin-film magnetic element comprising without portions extending to the interfaces between the second free magnetic sublayer 444C and the hard bias layers 317, a strong bias magnetic field may still be suitably applied from the hard bias layers 317 to the second free magnetic sublayer 444C. Thus, the magnetization vectors in the two side portions of the free magnetic layer are prevented from being disordered due to the demagnetizing field which would otherwise occur in the two side portions of the free magnetic layer. The magnetic domains of the free magnetic layer 444 may be suitably controlled and the stability of the read waveform at the two ends of the track width Tw may be improved.

Preferably, the thickness of the extensions 316e of the bias underlayers 316 of the spin-valve thin-film magnetic element is about 1 nm or less, more preferably, about 0.5 nm or less.

In the spin-valve thin-film magnetic element of the sixth embodiment, the bias underlayer is not provided at the interfaces between the second free magnetic sublayer 444C and the hard bias layers 317 at the sides thereof. In other words, the end portions 317C of the hard bias layers 317 facing the composite a8 are in direct contact with the two end portions of the second free magnetic sublayer 444C. Alternatively, the hard bias layers 317 may be formed to extend to the interfaces between the second free magnetic sublayer 444C and the hard bias layers 317 as indicated by dotted lines in FIG. 16. In this case, the thickness in the track width direction of the MR head of extensions 316f, which is the portions of the bias underlayers 316 provided between the second free magnetic sublayer 444C and the hard bias layers 317, are set to be smaller than the thickness in the height direction of the composite a8 of bottom portions 316g at the bottom of the hard bias layers 317.

In this spin-valve thin-film magnetic element, the extensions 316f are thinner than the bottom portions 316g of the bias underlayers 316. In this manner, pinholes are formed in the extensions 316f of the bias underlayers 316, and the second free magnetic sublayer 444C and the hard bias layers 317 provided at the two sides thereof are magnetically coupled through these pinholes in the extensions 316f by the exchange interaction. The magnetic charges accumulated in the two end portions of the second free magnetic sublayer 444C are effectively removed by the exchange interaction, inhibiting the generation of the demagnetizing field. Thus, a strong bias magnetic field can be suitably applied from the hard bias layers 317 to the second free magnetic sublayer 444C, and the magnetization vectors at the two side portions of the free magnetic layers are inhibited from being disordered due to the demagnetizing field which would otherwise occur. The magnetic domains in the upper antiferromagnetic layer 44 may be suitably controlled and the stability of the output waveform at the two ends of the track width Tw may be improved.

The hard bias layers 317 obtain an increased coercive force and remanence ratio when the bias underlayers 316 are provided at the interfaces between the free magnetic layer and the hard bias layers.

In this spin-valve thin-film magnetic element, the thickness of the extensions 316f of the bias underlayers 316 at the interfaces between the 444c and the hard bias layers 317 is preferably about 1 nm or less, and more preferably, about 0.5 nm or less.

Moreover, in the spin-valve thin-film magnetic element of the sixth embodiment, because the element is of synthetic-ferri-free type, sensitivity thereof is improved compared to the spin-valve thin-film magnetic element of the fifth embodiment.

Next, a method for making the spin-valve thin-film magnetic element of the sixth embodiment will be described.

First, an composite layer comprising the underlayer 310, the antiferromagnetic layer 311, the first pinned magnetic sublayer 312A, the nonmagnetic interlayer 312B, the second pinned magnetic sublayer 312C, the nonmagnetic conductive layer 313, the second free magnetic sublayer 444C, the nonmagnetic interlayer 444B, the first free magnetic sublayer 444A, and the protective layer 315, deposited in that order, is formed on a substrate. The same lift-off resist layer as in the first embodiment is then formed on the composite layer. The portion not covered by the lift-off resist layer is removed by means of ion milling so as to form the composite a8 having the side surfaces b8. The cross-section of the composite a8 has the shape of an isosceles trapezoid.

Next, the bias underlayers 316 are deposited on the antiferromagnetic layer 311 at the two sides of the composite a8. The upper surfaces of the bias underlayers 316 are positioned at a level lower than the lower surface of the free magnetic layer 444.

Next, the hard bias layers 317 are formed on the bias underlayers 316 at the two sides of the composite a8 so that at least part of the each hard bias layer 317 is positioned at the same level as the free magnetic layer 444 and that the upper surfaces 317A of the hard bias layers 317 come into contact with the side surfaces b8 of the composite a8 at a position lower than top ends d8 of the side surfaces b8 of the composite a8.

Preferably, the thickness of the hard bias layers 317 is larger than the thickness of the free magnetic layer 444. The upper surfaces 317A of the hard bias layers 317 are positioned at a level higher than the upper surface of the free magnetic layer 444 and the lower surfaces of the hard bias layers 317 are positioned at a level lower than the lower surface of the free magnetic layer 444. The end portion 317C of the hard bias layers 317 facing the composite a8 are in direct contact with the side surfaces b8 of the composite a8 (the two sides of the second free magnetic sublayer 444C).

Preferably, contact points c8 where the upper surfaces 317A meet the side surfaces b8 of the composite a8 are positioned at a level lower than the top ends d8 of the side surfaces b8 of the composite a8 and lower than the highest level of the hard bias layers 317.

Next, the interlayers 319 are formed on the hard bias layers 317 at the two sides of the composite a8.

The conductive layers 318 are then formed on the interlayers 319 so as to contact the side surfaces b8 of the composite a8.

Finally, the lift-off resist layer is removed to complete the spin-valve thin-film magnetic element shown in FIG. 16.

It should be noted that when making the spin-valve thin-film magnetic element comprising the extensions 316e at the interfaces between the free magnetic layer 444 and the hard bias layers 317, the angle defined by a first target and the substrate is adjusted (typically increased) during the step of forming the bias underlayers so as to form the bias underlayers 316 on parts of the side surfaces b8 of the composite a8 (parts of the two end portions of the second free magnetic sublayer 444C) and on the antiferromagnetic layer 311 at the two sides of the composite a8. The rest of the process is the same as in the first embodiment.

When making the spin-valve thin-film magnetic element including the bias underlayers 316 comprising the extensions 316f at the interfaces between the second free magnetic sublayer 444C and the hard bias layers 317 and the bottom portions 316g at the bottom of the hard bias layers 317, the thickness of the extensions 316f being smaller than the thickness of the bottom portions 316g, the angle defined by the first target and the substrate is adjusted (typically further increased) during the step of forming the bias underlayers so as to form the bias underlayer 316 on the antiferromagnetic layer 311 at the two sides of the composite a8 and on the side surfaces of the composite a8 (at the two sides of the free magnetic layer). The rest of the process is the same as in the first embodiment.

In the each of the spin-valve thin-film magnetic elements of the first to sixth embodiments, the nonmagnetic interlayer is provided to divide the pinned magnetic layer into two sublayers. Alternatively, the pinned magnetic layer may be of a type without the nonmagnetic interlayer, such as that comprising at least one antiferromagnetic layer.

Next, the thin-film magnetic head in accordance with the present invention is described.

Figure 26:
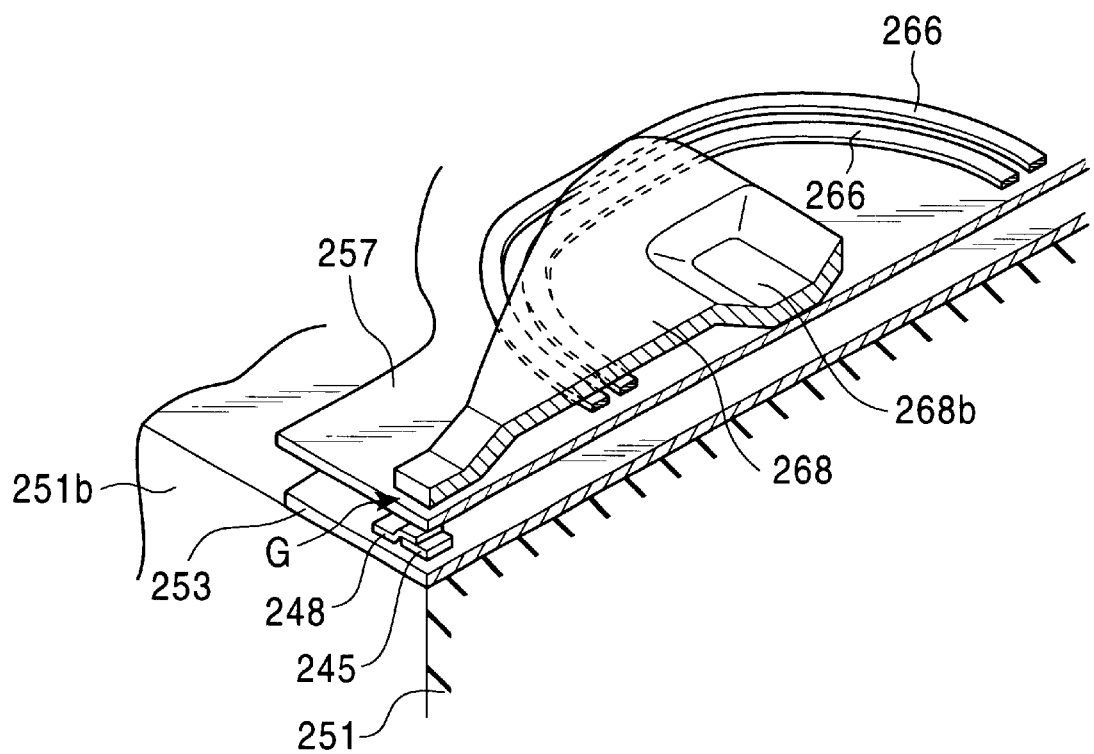
FIG. 26 is a perspective view illustrating the thin-film magnetic head shown in FIG. 25.
Figure 27:
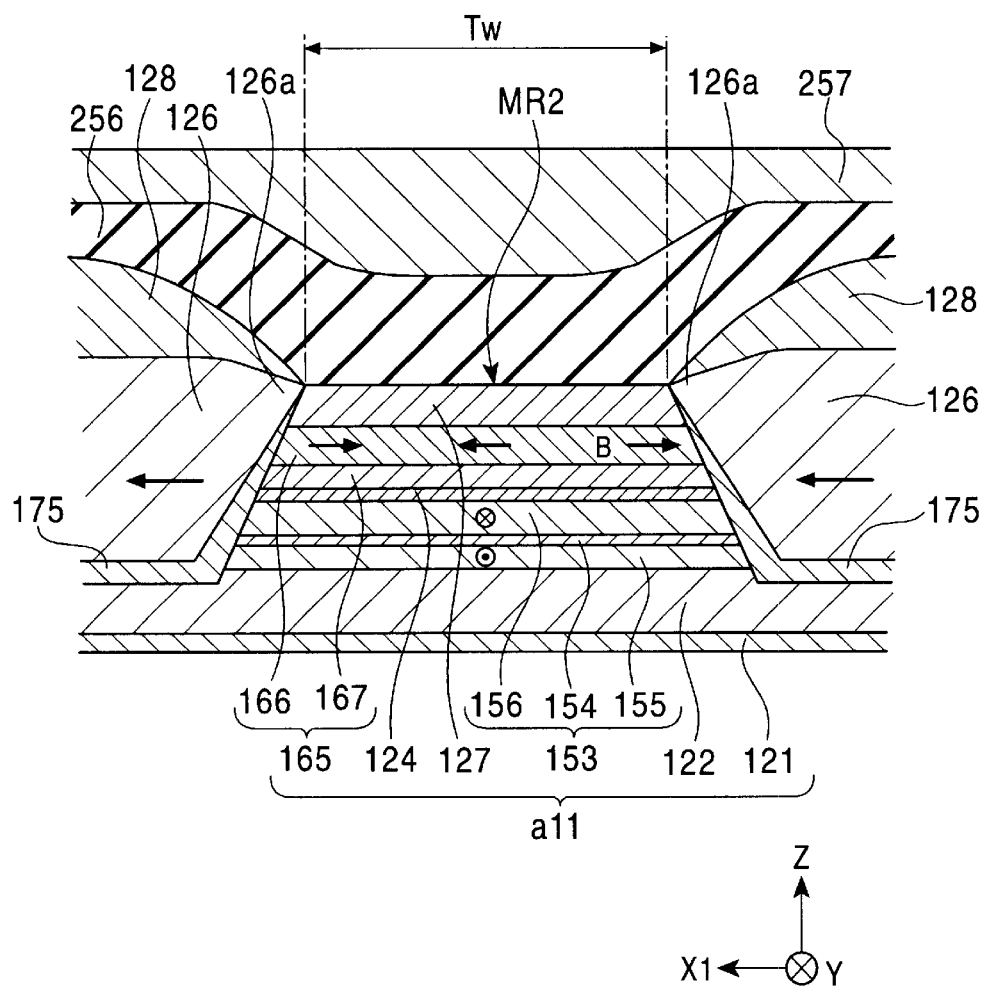
FIG. 27 is a cross-sectional view showing a principal portion of a conventional thin-film magnetic head equipped with a conventional spin-valve thin-film magnetic element viewed from the face opposing a recording medium.

FIG. 26 illustrates an exemplary thin-film magnetic head. The thin-film magnetic head is distinguished from a conventional thin-film magnetic head in that one of the first to sixth embodiments of the spin-valve thin-film magnetic elements is provided therein.

The spin-valve thin-film magnetic element is an important part of the thin-film magnetic head (read head).

Figure 25:
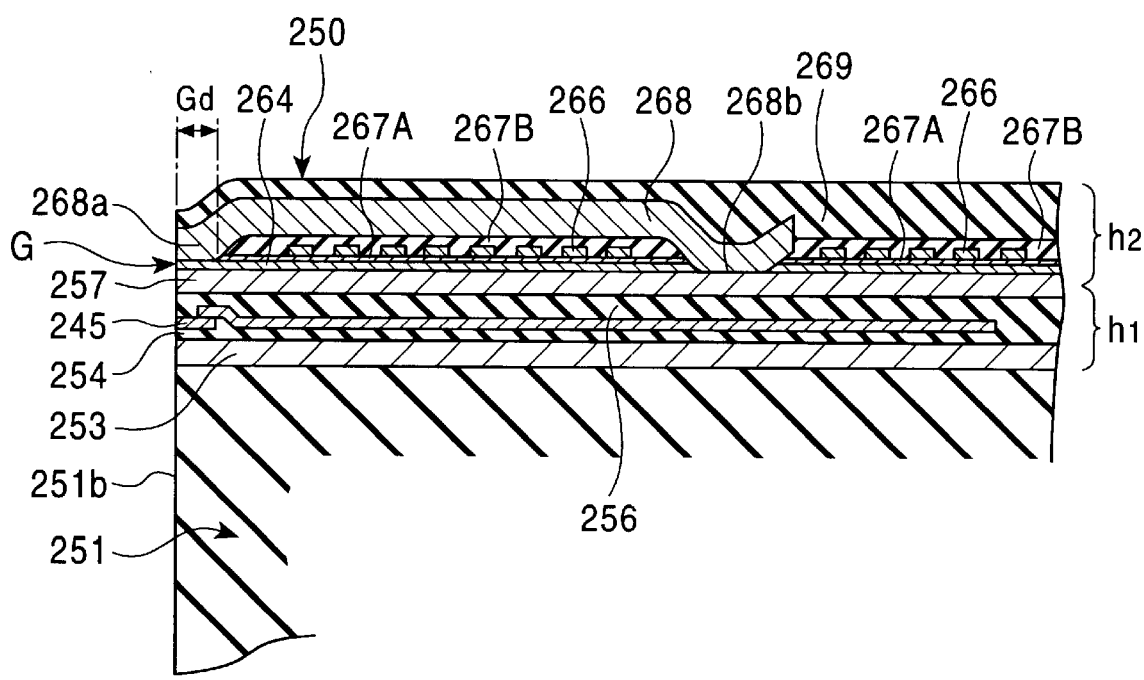
FIG. 25 is a cross-sectional view showing a magnetic core unit of the thin-film magnetic head shown in FIG. 24.

In order to make the thin-film magnetic head of the present invention, a lower gap layer 254 is first formed on a lower shield layer 253 composed of a nonmagnetic material, as shown in FIGS. 25 and 26, and then one of the first to sixth embodiments of the spin-valve thin-film magnetic elements is deposited so as to form a magnetoresistive thin-film element layer 245. An upper shield layer 257 is then formed on the resulting spin-valve thin-film magnetic element with an upper gap layer 256 therebetween so as to complete an MR head (read head) h1.

Next, a gap layer 264 is formed on a lower core layer 257 which also functions as the upper shield layer of the MR head h1. A spiral coil layer 266 is formed on the gap layer 264, surrounded with a first insulating layer 267A and a second insulating layer 267B. An upper core layer 268 is formed on the second insulating layer 267B, and a protective layer 269 is formed on the upper core layer 268 to complete the thin-film magnetic head.

Because the thin-film magnetic head is equipped with one of the above-described first to sixth embodiments of the spin-valve thin-film magnetic elements, the magnetic domains of the free magnetic layer may be suitably controlled, generation of Barkhausen noise may be prevented, and the stability of the waveform at the two sides of the track width may be improved.

It should be noted that the configuration of the slider and inductive head of the thin-film magnetic head is not limited to that shown in FIGS. 15 to 17. Various other structures concerning the slider and the inductive head also may be employed.

EXAMPLES

First Example

Figure 19:
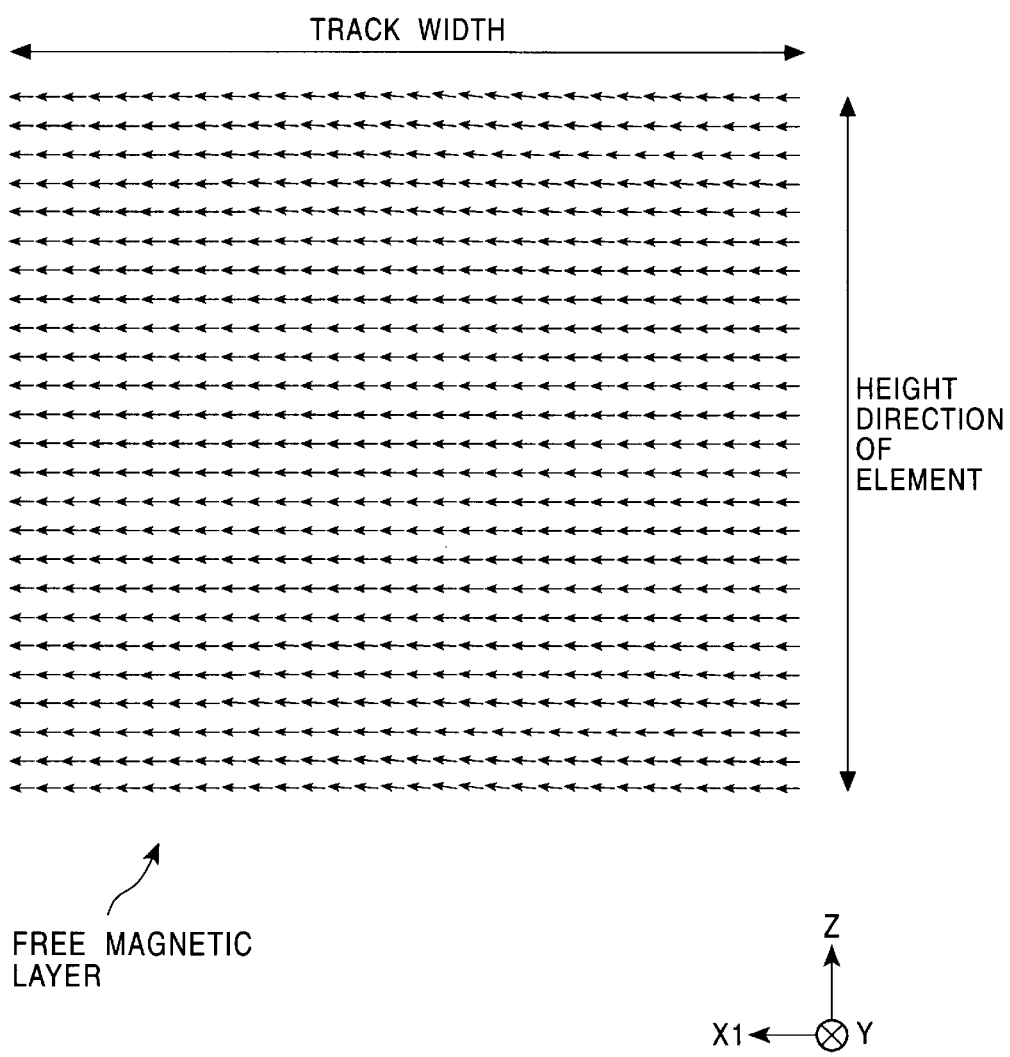
FIG. 19 illustrates distribution of magnetic vectors in a free magnetic layer of a spin-valve thin-film magnetic element of a first example.

Using a bottom-type synthetic-ferri-pinned spin-valve thin-film magnetic element in which bias underlayers were provided only at the bottom of hard bias layers and the hard bias layers were in direct contact with a free magnetic layer, the relationship between an alignment state of the magnetization vectors at the two side portions of the free magnetic layer and an exchange coupling (exchange interaction) between the free magnetic layer and the hard bias layers arranged at the two sides thereof was examined by micromagnetic simulation and by measuring a quasi-static transfer (QST) curve of the resulting head. The spin-valve thin-film magnetic element used in the experiment was the same type as that of the fifth embodiment shown in FIG. 15 (hereinafter referred to as the spin-valve thin-film magnetic element of the first example). The results are shown in FIG. 19. FIG. 19 illustrates the distribution of the magnetic vectors in the free magnetic layer of the spin-valve thin-film magnetic element of the first example.

In the spin-valve thin-film magnetic element of the first example, the track width was about 0.3 μm, and the height of the element was about 0.25 μm.

The spin-valve thin-film magnetic element of the first example included an underlayer 310 composed of Ta having a thickness of about 3.0 μm, an antiferromagnetic layer composed of PtMn having a thickness of about 15.0 nm, a first pinned magnetic sublayer 312A composed of Co having a thickness of about 2.0 nm, a nonmagnetic interlayer 312B composed of Ru having a thickness of about 0.8 nm, a second pinned magnetic sublayer 312C composed of Co having a thickness of about 2.5 nm, a nonmagnetic conductive layer 313 composed of Cu having a thickness of about 2.7 nm, a free magnetic layer 314 composed of a sublayer composed of Co having a thickness of about 0.5 nm and a sublayer composed of NiFe having a thickness of about 4.0 nm, and a protective layer 315 composed of Ta having a thickness of about 2.0 nm. The magnetic thickness of the free magnetic layer was about 4.52 (T·nm). The slope angles θ at the side portions of the composite were about 60 degrees.

The thickness of hard bias layers composed of CoPt arranged at the two sides of the composite was about 10 nm (about 100 angstroms) and the thickness of conductive layers composed of Cr provided on the hard bias layers was 100 nm (1000 angstroms). The thickness of bias underlayers composed of Cr provided at the bottom of the hard bias layers was about 3 nm (about 30 angstroms). The magnetic thickness of the hard bias layers was about 9.4 (T·nm). Contact points where the upper surfaces of the hard bias layers and the side surfaces of the composite meet were positioned at the level lower than top ends of the side surfaces of the composite and lower than the highest point of the hard bias layers distant from the composite, so that the end portions of the hard bias layers were in direct contact with the free magnetic layer. The thickness of bias underlayers provided between the hard bias layers and the antiferromagnetic layer was about 3 nm (about 30 angstroms). The direction of a hard bias magnetic field was the X1 direction, as in FIG. 15.

Figure 21:
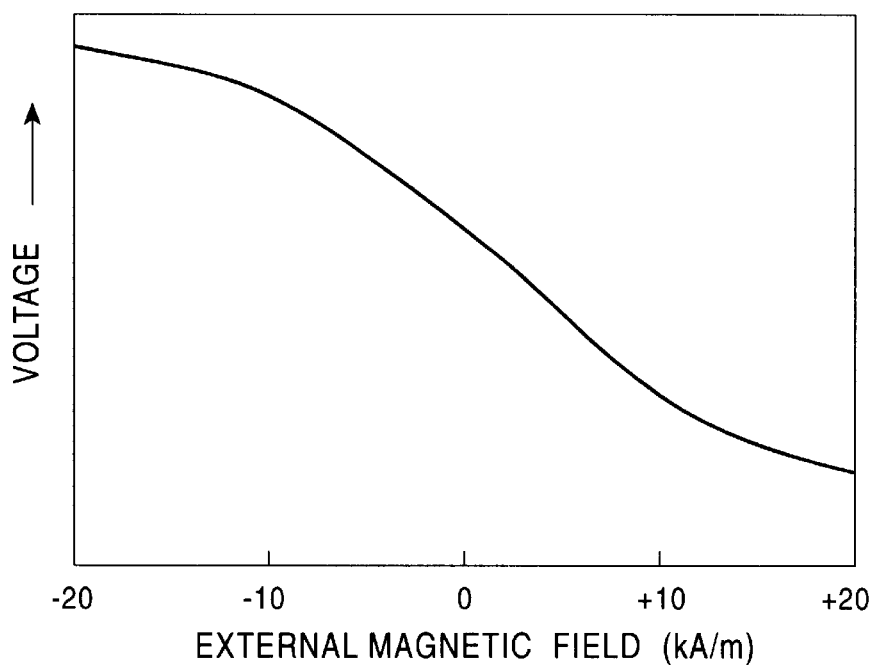
FIG. 21 is a graph showing the QCT curve of the spin-valve thin-film magnetic element of the first example.

In the first example, as shown in FIG. 19, the magnetic vectors were uniformly aligned in the X1 direction even in the two side portions of the free magnetic layer. FIG. 21 is a graph showing the QST curve obtained by applying an alternating magnetic field of about ±20 kA/m (about 250 Oe) in the direction perpendicular to the air bearing surface of the magnetic head. As shown in FIG. 21, the QST curve was smooth, without Barkhausen jump or hysteresis.

Figure 20:
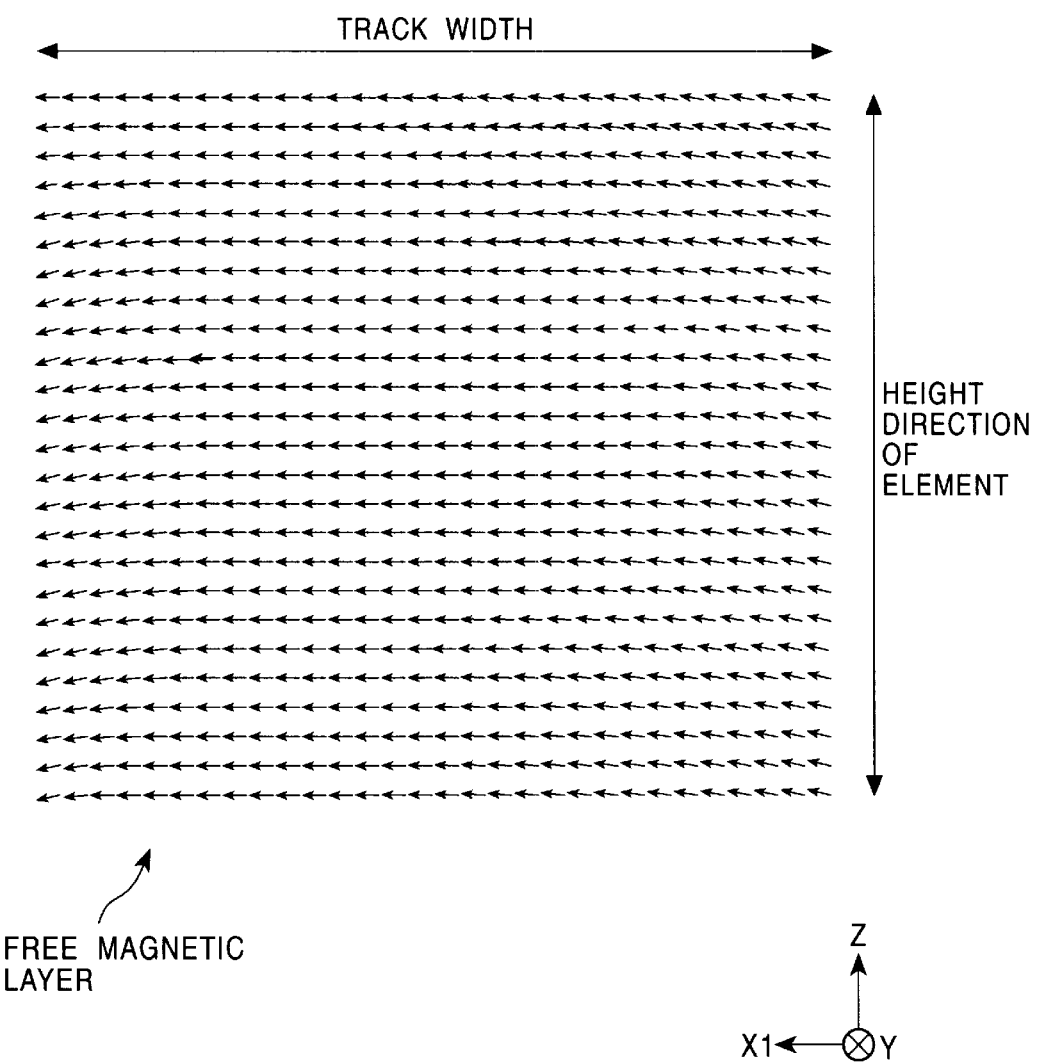
FIG. 20 illustrates distribution of magnetization vectors of a free magnetic layer in a spin-valve thin-film magnetic element of a comparative example.
Figure 22:
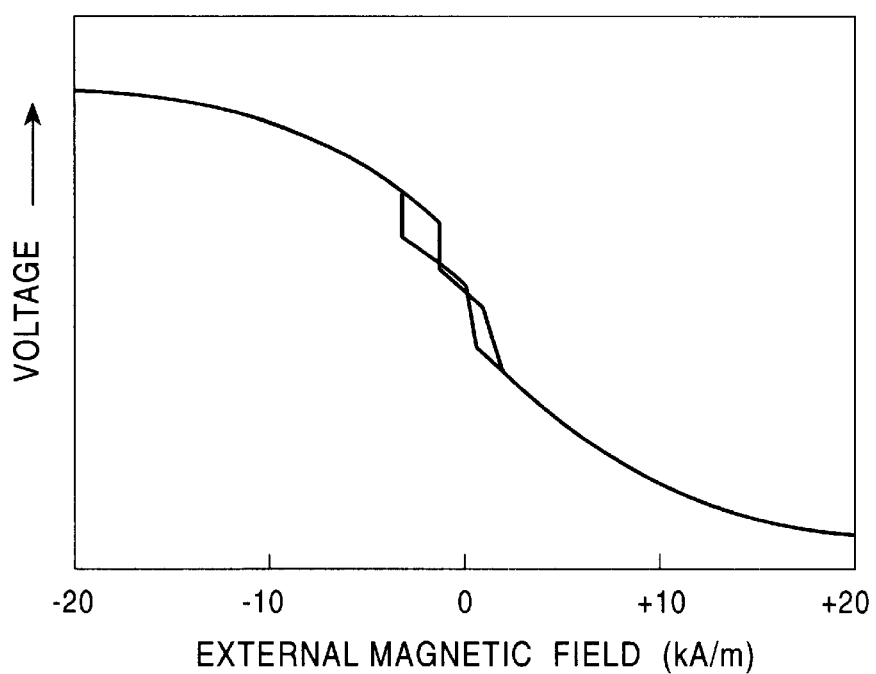
FIG. 22 is a graph showing the QCT curve of the spin-valve thin-film magnetic element of the comparative example.

In contrast, a spin-valve thin-film magnetic element of a comparative example having the identical structure except that bias underlayers of about 5 nm in thickness were provided under hard bias layers and at the interfaces between the free magnetic layer and the hard bias layers (the hard bias layers and the free magnetic layers were not in direct contact with each other) underwent the same micromagnetic simulation and the examination of the QCT curve to observe the magnetization vectors at the two sides of the free magnetic layer. The results are shown in FIG. 20. FIG. 20 illustrates the distribution of the magnetization vectors of the free magnetic layer in the spin-valve thin-film magnetic element of the comparative example. FIG. 22 is a graph showing the QST curve obtained by applying an alternating magnetic field of about ±20 kA/m (about 250 Oe) in the direction perpendicular to the air bearing surface of the magnetic head using the spin-valve thin-film magnetic element of the comparative example.

FIG. 20 shows that, in the spin-valve thin-film magnetic element of the comparative example provided with the bias underlayers of 5 nm in thickness under the hard bias layers and at the interfaces between the free magnetic layer and the hard bias layers, the magnetization vectors at the sides of the free magnetic layer were disordered, being non-uniformly aligned in the X1 direction. As a consequence, Barkhausen noise and hysteresis were observed in the QCT curve obtained from the spin-valve thin-film magnetic element of the comparative example, as shown in FIG. 22, and the output waveform was not stable. The Barkhausen jump in this curve was expected to be about 15.3%.

It was apparent from the results shown in FIGS. 19 and 21, that the spin-valve thin-film magnetic element of the first example having the bias underlayers only at the bottom of the hard bias layers so as to directly connect the hard bias layers and the free magnetic layer was superior to the conventional spin-valve thin-film magnetic element in that the magnetization vectors at the two sides of the magnetic vectors were more uniform. The stability of the output waveform at the two ends of the track width was improved in the spin-valve thin-film magnetic element of the first example.

Second Example

A spin-valve thin-film magnetic element having a structure identical to that of the first example, except for the slope angle θ at the side portion of the composite, was prepared. The slope angle θ was changed in the range of about 15 through about 60 degrees and the dependency of Barkhausen jump (BHJ) to the slope angle at the side portion of the composite was examined.

Figure 18:
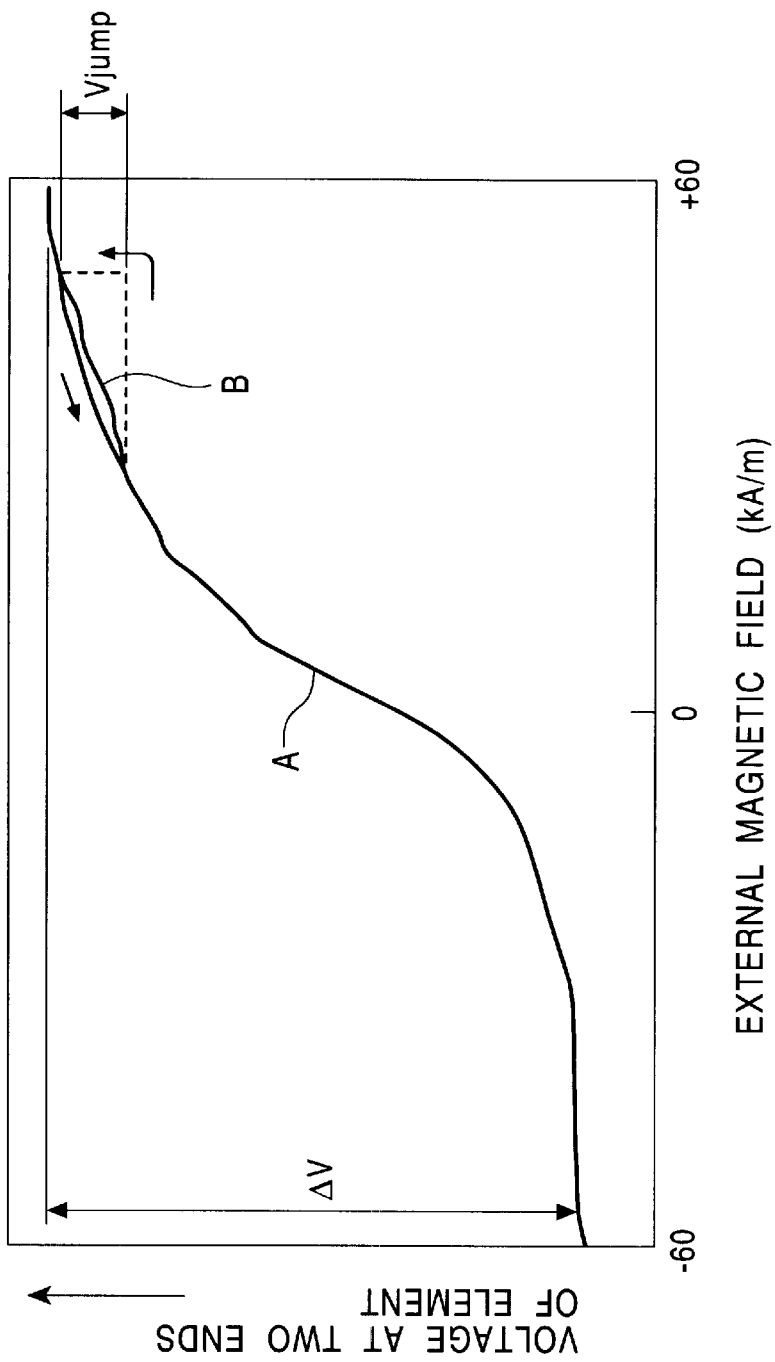
FIG. 18 is a graph showing a QCT curve obtained while applying a sense current and an alternating external magnetic field to a read head equipped with a magnetoresistive thin-film magnetic element.
Figure 23:
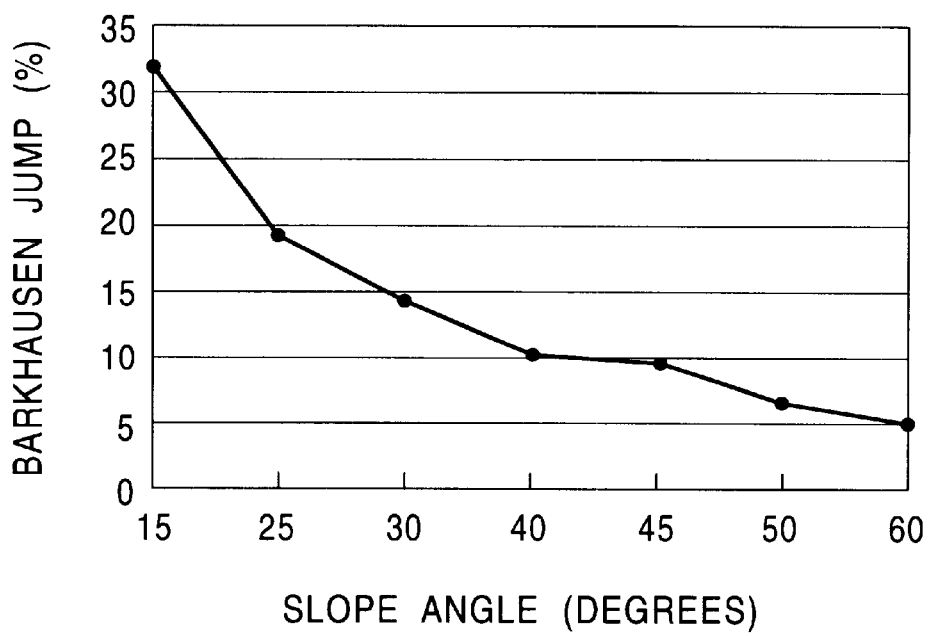
FIG. 23 is a graph showing the dependency of Barkhausen jump (BHJ) to slope angles at the side portions of a composite.
Figure 24:
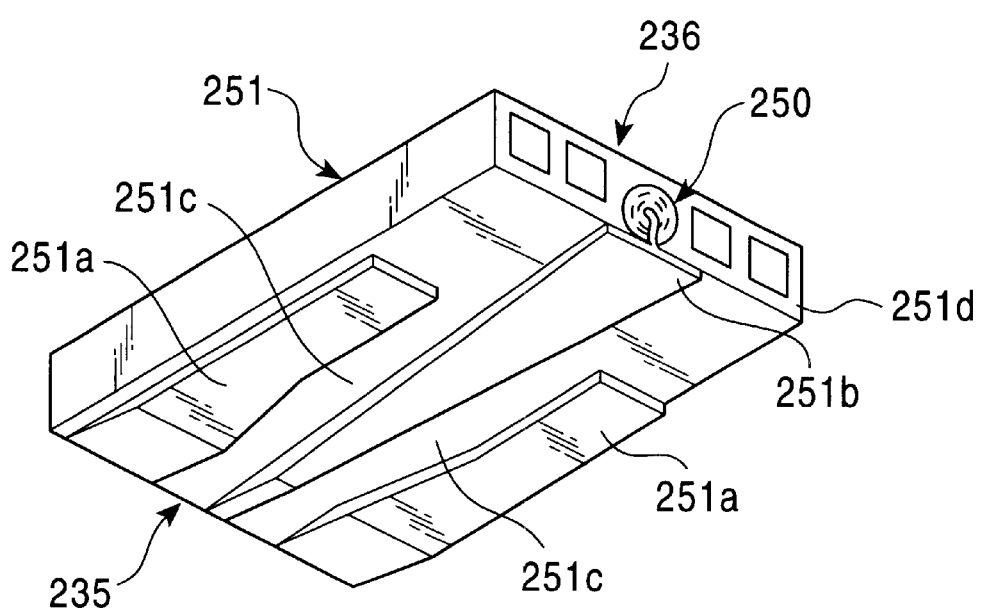
FIG. 24 is a perspective view illustrating an exemplary thin-film magnetic head.

The BHJ was determined as follows. A read head (MR head) equipped with the spin-valve thin-film magnetic element of the second example was prepared. A sense current of about 5 mA flowed and, simultaneously, an alternating external magnetic field of about ±60 kA/M (about ±750 Oe) was applied in the direction perpendicular to an air bearing surface (ABS) of the read head so as to obtain a QCT curve B in FIG. 18. The QCT curve B was compared with an ideal QCT curve A in FIG. 18 having no Barkhausen noise or hysteresis and capable of applying a sufficiently strong exchange bias to the free magnetic layer. When there was a jump deviating from the ideal QCT curve A, the voltage (Vjump) corresponding to the jump at the two ends of the thin-film magnetic element was measured. The difference between the voltages at both ends (when the applied alternating external magnetic field was at maximum and at minimum) of the ideal QCT curve was then measured (ΔV) and the ratio of ΔV to Vjump was determined and multiplied by 100 to obtain the BHJ (%). In other words, the BHJ may be obtained from the formula BHJ (%)=(Vjump/ΔV)×100. The results are shown in FIG. 23 and Table 1. It should be noted here that when (Vjump/ΔV) is significant, the BHJ is also significant. A bias magnetic field applied to the free magnetic layer will not be sufficient or stable in such a case and Barkhausen noise may readily occur.

TABLE 1

| Slope Angle θ | Barkhausen Jump (%) |
|---|---|
| 15 | 32 |
| 25 | 19 |
| 30 | 14.5 |
| 40 | 10.6 |
| 45 | 9.5 |
| 50 | 6.8 |
| 60 | 4.8 |

As shown in FIG. 23 and Table 1, the BHJ was about 19% when the slope angle θ at the side portion of the composite of the spin-valve thin-film magnetic element was about 25 degrees, and the BHJ was about 32% when the slope angle θ was about 15 degrees. The Barkhausen jump drastically increased as the slope angle θ became less than about 30 degrees. In contrast, the BHJ was about 14.5% when the slope angle θ was about 30 degrees. The BHJ decreased as the slope angle θ increased.

The coercive force of the planar portions of the hard bias layers (the portions excluding the end portions) was about 80 kA/m (about 1,000 Oe) or more. If the end portions of the free magnetic layer facing the composite had a sufficient coercive force, the exchange bias would not be affected by the alternating external magnetic field of about ±60 kA/m. However, the volume of the end portions having low coercive force due to the lack of the bias underlayers increased as the slope angle was decreased to less than about 30 degrees, resulting in the disorder of the bias magnetic field (exchange bias) and increasing Barkhausen noise and hysteresis in the QCT curve.

It should be noted that although the magnetic field from the magnetic recording medium is usually significantly less than about 60 kA/m, the magnetic field of an inductive head (write head) adjacent to the read head is strong during writing and the exchange bias of the magnetoresistive thin-film magnetic element in the read head may be affected. Thus, when the Barkhausen jump was small in a high magnetic field, the exchange bias is uniformly oriented and a sufficient bias magnetic field can be provided to the free magnetic layer, preventing the Barkhausen noise.

The Barkhausen jump was drastically decreased as the slope angle was increased to about 30 degrees or more. This was because the thickness of the end portions of the hard bias layers facing the composite was increased. As the thickness increased, the end portions at the hard bias layers facing the composite, i.e., the portions not provided with the bias underlayers at their bottom, were reduced. In other words, the end portions having disordered crystal orientations and a lower coercive force were reduced, thereby decreasing the BHJ.

It can be understood from the above that the slope angle θ at the side portion of the composite of the spin-valve thin-film magnetic element is preferably about 30 degrees or more to reduce the Barkhausen jump to about 15% or less. More preferably, the slope angle θ is about 45 degrees or more to reduce the Barkhausen jump to about 10% or less.

Most preferably, the slope angle θ is about 60 degrees or more to reduce the Barkhausen jump to about 5% or less.

As described above, in the magnetoresistive thin-film magnetic element in accordance with the present invention, the hard bias layers and the free magnetic layer are in contact with each other at least partly. Thus, the free magnetic layer and the hard bias layers at the two sides thereof are magnetically coupled by an exchange coupling (exchange interaction), inhibiting the generation of the demagnetizing field at the two side portions of the free magnetic layer. As a result, a strong bias magnetic field may be effectively applied from the hard bias layers to the free magnetic layer, the magnetization vectors at the two side portions of the free magnetic layer are prevented from becoming disordered by the demagnetizing field which would otherwise occur (prevention of the buckling phenomenon), and the magnetic domains of the free magnetic layers may be satisfactorily controlled. The stability of the output waveform may also be improved.

Moreover, because no demagnetizing field is generated at the two side portions of the free magnetic layer, the buckling phenomenon can be prevented even when the track width of the read head equipped with the magnetoresistive thin-film magnetic element is made narrower. The output waveform at the two ends of the track width may be prevented from becoming erroneous by the buckling phenomenon, and stability of the waveform for the read head as a whole may be improved.

Furthermore, even when the product of the remanence and layer thickness of the hard bias layers are reduced to a certain extent, the demagnetizing field is prevented at the two side portion of the free magnetic layer, a bias magnetic field may be effectively applied to the free magnetic layer from the hard bias layers, and the stability of the output waveform at the two ends of the track width can be ensured. In this respect, for example, the thickness of the hard bias layers may be decreased so as to weaken the exchange bias magnetic field, and the region at the sides of the composite with low output can be minimized so as to enlarge the central region having high output, thereby improving the read output.

In the magnetoresistive thin-film magnetic element, the thickness of the bias underlayers is smaller at the interfaces between the free magnetic layer and the hard bias layers than at the bottom of the hard bias layers. As a result, pinholes are formed in the portions of the bias underlayers provided between the free magnetic layers and the hard bias layers, and the free magnetic layer and the hard bias layers are magnetically coupled through these pinholes in the bias underlayers by the exchange interaction.

Consequently, in this magnetoresistive thin-film magnetic element, the magnetic charges accumulated at the two side portions of the free magnetic layers are effectively removed, thereby inhibiting the generation of the demagnetizing field at the two side portions. A strong bias magnetic field may be effectively applied to the free magnetic layer from the hard bias layers, the magnetization vectors at the two side portions of the free magnetic layer is prevented from becoming disordered by the demagnetizing field which would otherwise occur in the two side portions of the free magnetic field, and the magnetic domains of the free magnetic layer can be satisfactorily controlled, thereby improving the stability of the output waveform.

The present invention also provides a method suitable for making the magnetoresistive thin-film magnetic element in accordance with the present invention, comprising the bias underlayers provided at the bottom of the hard bias layers, and the magnetoresistive thin-film magnetic element in accordance with the present invention, comprising the bias underlayers provided at the bottom of the hard bias layers and extending to the interfaces between the free magnetic layer and the hard bias layers.

Various embodiments of the invention have been described and illustrated. However, the description and illustrations are by way of example only. Other embodiments and implementations are possible within the scope of this invention and will be apparent to those of ordinary skill in the art. Therefore, the invention is not limited to the specific details, representative embodiments, and illustrated examples in this description. Accordingly, the invention is not to be restricted except in light as necessitated by the accompanying claims and their equivalents.

What is claimed is:

1. A magnetoresistive thin-film magnetic element comprising:
   a composite comprising an antiferromagnetic layer, a pinned magnetic layer on the antiferromagnetic layer and having a first magnetization vector pinned by an exchange anisotropic magnetic field with the antiferromagnetic layer, a nonmagnetic conductive layer on the pinned magnetic layer and a free magnetic layer formed on the nonmagnetic conductive layer and having a second magnetization vector;
   hard bias layers formed on two sides of the free magnetic layer so that the side face of each hard bias layer is in direct contact with the corresponding side face of the free magnetic layer, wherein the hard bias layers orient the second magnetization vector of the free magnetic layer in a direction substantially orthogonal to the first magnetization vector of the pinned magnetic layer;
   a conductive layer to supply a sense current to the free magnetic layer, the nonmagnetic conductive layer, and the pinned magnetic layer; and
   bias underlayers each provided under each of the hard bias layers, wherein the bias underlayers extend at least below the hard bias layers toward the top face of the pinned magnetic layer, wherein the bias underlayers comprise a nonmagnetic metal having a body-centered cubic structure.

2. A magnetoresistive thin-film magnetic element according to claim 1, wherein the magnetoresistive thin-film magnetic element is of a dual type in which the nonmagnetic conductive layer, the pinned magnetic layer, and the antiferromagnetic layer are provided on each of opposite sides in the thickness direction of the free magnetic layer.

3. A magnetoresistive thin-film magnetic element according to claim 1, the composite further comprising at least one nonmagnetic interlayer which separates at least one of the pinned magnetic layer and the free magnetic layer into two sublayers, wherein the two sublayers are in a ferri-magnetic state in which magnetization vectors of the two sublayers are antiparallel to each other.

4. A magnetoresistive thin-film magnetic element according to claim 2, the composite further comprising at least one nonmagnetic interlayer which separates at least one of the pinned magnetic layer and the free magnetic layer into two sublayers, wherein the two sublayers are in a ferri-magnetic state in which magnetization vectors of the two sublayers are antiparallel to each other.

5. A magnetoresistive thin-film magnetic element according to claim 1, wherein the thickness of the extension of each of the bias underlayers is less than or equal to about 1 nm.

6. A magnetoresistive thin-film magnetic element according to claim 5, wherein the thickness of the extension of each of the bias underlayers is less than or equal to about 1 nm.

7. A magnetoresistive thin-film magnetic element according to claim 1, wherein the bias underlayers comprise chromium.

8. A magnetoresistive thin-film magnetic element according to claim 1, wherein the hard bias layers form slope angles along two side portions of the composite, wherein the slope angles are greater than or equal to about 30 degrees.

9. A magnetoresistive thin-film magnetic element according to claim 2, wherein the hard bias layers form slope angles along two side portions of the composite, wherein the slope angles are greater than or equal to about 30 degrees.

10. A magnetoresistive thin-film magnetic element comprising:
    a composite comprising an antiferromagnetic layer, a pinned magnetic layer on the antiferromagnetic layer and having a first magnetization vector pinned by an exchange anisotropic magnetic field with the antiferromagnetic layer, a nonmagnetic conductive layer on the pinned magnetic layer, and a free magnetic layer formed on the nonmagnetic conductive layer and having a second magnetization vector;
    hard bias layers formed at two sides of the composite, wherein the hard bias layers orient the second magnetization vector of the free magnetic layer in a direction substantially orthogonal to the first magnetization vector of the pinned magnetic layer, wherein the side face of each hard bias layer is in direct contact with the corresponding side face of the free magnetic layer via a pinhole provided in the corresponding underlayer;
    a conductive layer to supply a sense current to the free magnetic layer, the nonmagnetic conductive layer, and the pinned magnetic layer; and
    bias underlayers each provided under each of the hard bias layers, wherein the bias underlayers extend at the interfaces between the free magnetic layer and the hard bias layers, wherein the portion controls the crystal orientation of the hard bias layers, wherein the bias underlayers comprise a nonmagnetic metal having a body-centered cubic structure,
    wherein the thickness of each of the hard bias underlayers is smaller at the interface between the free magnetic layer and each of the hard bias layers than under the hard bias layers.

11. A magnetoresistive thin-film magnetic element according to claim 10, wherein the magnetoresistive thin-film magnetic element is of a dual type in which the nonmagnetic conductive layer, the pinned magnetic layer, and the antiferromagnetic layer are provided on each of opposite sides in the thickness direction of the free magnetic layer.

12. A magnetoresistive thin-film magnetic element according to claim 10, the composite further comprising at least one nonmagnetic interlayer which separates at least one of the pinned magnetic layer and the free magnetic layer into two sublayers, wherein the two sublayers are in a ferri-magnetic state in which magnetization vectors of the two sublayers are antiparallel to each other.

13. A magnetoresistive thin-film magnetic element according to claim 11, the composite further comprising at least one nonmagnetic interlayer which separates at least one of the pinned magnetic layer and the free magnetic layer into two sublayers, wherein the two sublayers are in a ferri-magnetic state in which magnetization vectors of the two sublayers are antiparallel to each other.

14. A magnetoresistive thin-film magnetic element according to claim 10, wherein the thickness of the portion of each of the bias underlayers extending to the interface between the free magnetic layer and each of the hard bias layers is less than or equal to about 1 nm.

15. A magnetoresistive thin-film magnetic element according to claim 11, wherein the thickness of each of the bias underlayers is less than or equal to about 1 nm at the interface between the free magnetic layer and each of the hard bias layers.

16. A magnetoresistive thin-film magnetic element according to claim 10, wherein the bias underlayers comprise chromium.

17. A magnetoresistive thin-film magnetic element according to claim 10, wherein the hard bias layers form slope angles along two side portions of the composite, wherein the slope angles are greater than or equal to about 30 degrees.

18. A magnetoresistive thin-film magnetic element according to claim 11, wherein the hard bias layers form slope angles along two side portions of the composite, wherein the slope angles are greater than or equal to 30 degrees.

* * * * *

UNITED STATES PATENT AND TRADEMARK OFFICE
CERTIFICATE OF CORRECTION

PATENT NO. : 6,656,604 B2
DATED : December 2, 2003
INVENTOR(S) : Naoya Hasegawa

It is certified that error appears in the above-identified patent and that said Letters Patent is hereby corrected as shown below:

<u>Title page,</u>
Item [12], delete "Hasewaga" and substitute -- Hasegawa -- in its place.
Item [75], Inventor, delete "Hasewaga" and substitute -- Hasegawa -- in its place.

Signed and Sealed this

Ninth Day of March, 2004

JON W. DUDAS
*Acting Director of the United States Patent and Trademark Office*